US006428641B1

(12) United States Patent
Yoon et al.

(10) Patent No.: US 6,428,641 B1
(45) Date of Patent: Aug. 6, 2002

(54) METHOD FOR LAMINATING CIRCUIT PATTERN TAPE ON SEMICONDUCTOR WAFER

(75) Inventors: Ju-Hoon Yoon, Seoul; Woo-Hyun Kong, Kyunggi-Do; Chang-Bok Lee, Kyunngi-Do; Sung-Jin Yang, Seoul, all of (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/385,695

(22) Filed: Aug. 30, 1999

(30) Foreign Application Priority Data

Aug. 31, 1998 (KR) .......................................... 98-35608
Aug. 31, 1998 (KR) .......................................... 98-35617
Aug. 31, 1998 (KR) .......................................... 98-35618

(51) Int. Cl.[7] ........................... B32B 31/00; H01L 21/44
(52) U.S. Cl. ........................ 156/64; 156/249; 156/253; 156/351; 156/378; 438/118
(58) Field of Search ................... 156/64, 378, 351, 156/344, 584, 249, 253; 438/464, 118

(56) References Cited

U.S. PATENT DOCUMENTS

| 3,810,301 | A | * | 5/1974 | Cook ........................... 29/593 |
| 4,985,988 | A | * | 1/1991 | Littlebury .................... 29/827 |
| 5,049,434 | A | * | 9/1991 | Wasulko ...................... 428/202 |
| 5,092,954 | A | * | 3/1992 | Braun et al. ................. 156/540 |
| 5,148,265 | A | | 9/1992 | Khandros et al. ............. 357/80 |
| 5,151,388 | A | * | 9/1992 | Bakhit et al. ................ 437/209 |
| 5,258,330 | A | | 11/1993 | Khandros et al. ............ 437/209 |
| 5,384,689 | A | | 1/1995 | Shen ........................... 361/761 |
| 5,470,411 | A | * | 11/1995 | Gloton et al. ................. 156/64 |
| 5,477,611 | A | | 12/1995 | Sweis et al. .................... 29/840 |
| 5,519,936 | A | | 5/1996 | Andros et al. ................. 29/840 |
| 5,536,909 | A | | 7/1996 | DiStefano et al. ........... 174/261 |
| 5,625,232 | A | * | 4/1997 | Numata et al. .............. 257/758 |
| 5,633,785 | A | | 5/1997 | Parker et al. ................ 361/766 |
| 5,684,330 | A | | 11/1997 | Lee .............................. 257/692 |
| 5,753,974 | A | | 5/1998 | Masukawa ................... 257/737 |
| 5,759,873 | A | * | 6/1998 | Kata et al. ................... 438/118 |
| 5,838,951 | A | * | 11/1998 | Song ........................... 395/500 |

(List continued on next page.)

OTHER PUBLICATIONS

Yoon et al., U.S. application No. 09/385,694, filed Aug. 30, 1999 entitled "Wafer–Scale Production of Chip–Scale Semiconductor Packages Using Wafer Mapping Techniques".*
Yoon et al., U.S. application No. 09/387,377, filed Aug. 30, 1999 entitled "Circuit Pattern Tape for Wafer–Scale Production of Chip Size Semiconductor Packages".*
Braun, Alexander E., "Defect Dectection Overcomes Limitations," *Semiconductor International*, Newton, Feb. 1999, pp. 1–9.*
Ohzone, et al., "A Study on Hot–Carrier–Induced Photoemission in n–MOSTEF's under Dynamic Operation," Department of Electrical Engineering, Toyama National College of Technology.*

*Primary Examiner*—Curtis Mayes
*Assistant Examiner*—Kevin P. Shortsle

(57) ABSTRACT

A method for laminating a circuit pattern tape over a wafer, involving the steps of preparing a circuit pattern tape formed with an adhesive layer, along with a wafer, detecting at least one reference position of the prepared circuit pattern tape and at least one reference position of the prepared wafer using visual detecting means, outputting results obtained at the detecting step in the form of visual images capable of allowing a comparison of the detection results, carrying out a reference position correction involving movements of the wafer in an X-axis and/or a Y-axis direction and/or by a desired angle, thereby allowing the reference position of the circuit pattern tape and the reference position of the wafer to correspond to each other, and laminating the circuit pattern tape over the wafer when the reference positions correspond to each other.

40 Claims, 39 Drawing Sheets

U.S. PATENT DOCUMENTS

| | | | |
|---|---|---|---|
| 5,858,815 A | 1/1999 | Heo et al. | 438/112 |
| 5,864,470 A | 1/1999 | Shim et al. | 361/777 |
| 5,866,949 A | 2/1999 | Schueller | 257/778 |
| 5,897,334 A * | 4/1999 | Ha et al. | 438/107 |
| 5,950,070 A | 9/1999 | Razon et al. | 438/113 |
| 5,989,982 A | 11/1999 | Yoshikazu | 438/462 |
| 5,990,545 A | 11/1999 | Schueller et al. | 257/697 |
| 6,000,124 A * | 12/1999 | Saito et al. | 156/64 |
| 6,028,354 A | 2/2000 | Hoffman | 257/706 |
| 6,043,109 A | 3/2000 | Yang et al. | 438/113 |
| 6,118,665 A * | 9/2000 | Kishida et al. | 361/749 |
| 6,132,588 A | 10/2000 | Yoshizawa et al. | 205/125 |
| 6,132,910 A | 10/2000 | Kojima | 430/22 |
| 6,144,102 A | 11/2000 | Amagai | 257/781 |
| 6,207,477 B1 * | 3/2001 | Motooka et al. | 438/113 |
| 6,248,612 B1 | 6/2001 | Castro et al. | 438/106 |
| 6,252,298 B1 | 6/2001 | Lee et al. | 257/668 |

* cited by examiner

METHOD FOR LAMINATING CIRCUIT PATTERN TAPE ON SEMICONDUCTOR WAFER

BACKGROUND OF THE INVENTION

1. Field of the Invention

The present invention relates to a method for laminating a circuit pattern tape over a wafer, and more particularly to a method for efficiently laminating a circuit pattern tape over a wafer formed with a plurality of semiconductor chip units by means of an elastomeric adhesive tape while maintaining an accuracy in position and orientation.

2. Description of the Prior Art

In pace with the recent trend of electronic appliances, such as electronic products for domestic and official purposes, communication appliances, and computers, toward a compactness and high performance, semiconductor packages, which are used for such electronic appliances, have been required to have a compact, highly multi-pinned, light, simple structure while having a high performance.

Such a requirement for semiconductor packages has resulted in developments of semiconductor packages having a size identical or similar to the size of a semiconductor chip packaged therein. Such a semiconductor package is called a "chip size (or scale) semiconductor package" or a "chip-on-board" semiconductor package. Currently, the demand of semiconductor packages having such a structure is increased. Chip size semiconductor packages are fabricated by laminating a circuit pattern tape formed with a plurality of circuit pattern units over a wafer formed with a plurality of semiconductor chip units, carrying out a well-known packaging process involving a wire bonding process for electrically connecting the circuit patterns of the circuit pattern tape to the die pads of the semiconductor chips in the wafer, a resin molding process for encapsulating the wire bonding areas of the wafer with an encapsulate resin, and a process for attaching solder balls, as external input/output terminals, to the wafer, and finally conducting a singulation process for separating the resultant wafer into individual semiconductor chips, that is, individual independent semiconductor packages.

The most important process in the fabrication of semiconductor packages as mentioned above is a process for laminating a circuit pattern tape, which is formed with an adhesive layer, over a wafer while maintaining desired relative positional and directional relations between the circuit pattern tape and wafer. When the circuit pattern tape is bonded to the wafer by means of the adhesive layer while maintaining an accuracy in position and orientation, bond fingers formed on the circuit pattern tape and input/output pads formed on the semiconductor chips of the wafer are exposed through associated openings provided at the circuit pattern tape, so that they can be electrically connected together in accordance with a wire bonding process. However, where the circuit pattern tape is laminated over the wafer without maintaining an accuracy in position and orientation, a part of or all of the input/output pads on each semiconductor chip cannot be wire-bonded because of a possible shielding thereof by the circuit pattern tape or because of a possible deviation in the wire length required for the wire bonding between the associated bond finger and die pad due to an inaccurate lamination angle. In severe cases, portions of the circuit pattern tape, where circuit patterns are formed, or a part of the semiconductor chips may be cut in a singulation process which is conducted to individually separate packages from the wafer laminated with the circuit pattern tape. As a result, a degradation in the yield of semiconductor packages occurs.

FIG. 28A is a plan view illustrating a circuit pattern tape used in a conventional lamination method. In FIG. 28A, the circuit pattern tape is denoted by the reference numeral 10'. FIG. 28B is an enlarged view illustrating a portion D in FIG. 28A. FIG. 28C is a cross-sectional view taken along the line I—I of FIG. 28A. Now, the circuit pattern tape will be described in conjunction with FIGS. 28A to 28C.

A plurality of circuit pattern units 11' are formed at a portion of the circuit pattern tape corresponding to a wafer (denoted by the reference numeral 2 in FIG. 2A). Each circuit pattern unit 11' has an independent circuit pattern. A cover coat 19 is coated over the portion of the circuit pattern tape, where the circuit pattern units 4 are formed, corresponding to the wafer.

FIG. 28B, which is an enlarged view illustrating the portion D of FIG. 28A, shows four circuit pattern units 11' adjoining together. In FIG. 28B, the reference numeral 12 denotes conductive traces. Each conductive trace 12 is not coated with the cover coat 19 at its one end. The end of each conductive trace 12 not coated with the cover coat 19 is connected to a solder ball land 13 attached with a solder ball (not shown). Each conductive trace 12 is also connected at the other end thereof to an associated one of bond fingers formed at an associated one of bond finger formation regions 15. A plurality of such conductive traces 12 form the circuit pattern of each circuit pattern unit 11. Bond finger formation regions 15 are not coated with the cover coat 19, so that bond fingers 14 thereof are outwardly exposed, similarly to the solder ball lands 13. An opening formation region is defined within each bond finger formation region 15. Such opening formation regions are removed in accordance with a punching process prior to a lamination of the circuit pattern tape 10' over the wafer 2 formed with a plurality of semiconductor chip units (denoted by the reference numeral 3 in FIG. 2A), thereby forming openings 16. Die pads (denoted by the reference numeral 4 in FIG. 2B) on each semiconductor chip unit (denoted by the reference numeral 3 in FIG. 2B) are upwardly exposed through an associated one of the openings 16. The exposed die pads are coupled to bond fingers 14 by means of conductive wires (not shown), respectively. In FIG. 28B, the reference numeral 17 denotes bus lines. The bus lines 17 are needed to achieve a formation of a nickel (Ni)/platinum (Au) coating for an easy attachment of solder balls (not shown) to the solder ball lands 13 or to achieve an electrolytic or electroless plating allowing a formation of a platinum (Au) or silver (Ag) coating required to achieve an easy bonding of wires (not shown) to the bond fingers 14. The bus lines 17 should be removed in order to prevent the conductive traces 12 from being conducted together by those bus lines 17 after the wafer is separated into individual packaged semiconductor chip units as it is cut along singulation lines 20.

FIG. 28C illustrates a cross-sectional structure of the circuit pattern tape 10' for semiconductor packages which is used in the conventional lamination method. The lowermost layer of the structure shown in FIG. 28C is an insulating polymide layer 18. Conductive traces 12 and solder ball lands 13 are formed on the polyimide layer 18. Bond fingers 14 are also formed on the polyimide layer 18 around respective openings 16. The cover coat 19 is laminated over the conductive traces 12. The solder ball lands 13 and bond fingers 14 are not covered with the cover coat 19, so that they are upwardly exposed. At the peripheral region of each circuit pattern unit 11', a conductive metal thin film 12' is laminated over the polyimide layer 18. The cover coat 19 is also laminated over the conductive metal thin film 12'.

In a lamination process according to the conventional lamination method, the circuit pattern tape formed with the adhesive layer is pressed onto the wafer laid on a die, for its bonding to the wafer, while aligning a reference position of the circuit pattern tape with a reference position of the wafer. However, the alignment between the reference positions of the circuit pattern tape and wafer is manually conducted after the alignment state is identified by the naked eye of the operator. For this reason, there is a high possibility of an inaccurate lamination in terms of position and orientation. Moreover, a lot of time is taken for the lamination process. As a result, a degradation in productivity and yield occurs.

The circuit pattern tape 10', which is used in the conventional lamination method, involves a non-uniform distribution of the conductive metal forming the circuit pattern. For this reason, when the lamination process is carried out at a high temperature, there is a problem in that voids may easily be formed in the circuit pattern tape 10' due to a relatively high difference in regard to the coefficient of thermal expansion between the conductive metal and the resin material of the polyimide layer 18 or cover coat 19.

Moreover, a bowing phenomenon may easily occur at the wafer 2 when the wafer 2 laminated with the circuit pattern tape 10' in accordance with the lamination process conducted at a high temperature is maintained at room temperature. This results from the relatively great difference in regard to the coefficient of thermal expansion between the conductive metal and the resin material of the polyimide layer 18 or cover coat 19. Such a bowing phenomenon may become severe where the circuit pattern tape 10' having the above mentioned structure is used. This is because the circuit pattern tape 10' has the planar conductive metal thin film 12' which has a large area and is interposed between the polyimide layer 18 and cover coat 19. In the manufacture of semiconductor packages, such a bowing phenomenon serves to make it difficult to attach the circuit pattern tape 10' to the wafer in an accurate horizontal state. Furthermore, this bowing phenomenon makes it difficult to achieve smooth subsequent processes. As a result, degraded semiconductor packages may be produced.

SUMMARY OF THE INVENTION

Therefore, an object of the invention is to provide a method for efficiently laminating a circuit pattern tape over a wafer formed with a plurality of semiconductor chip units by means of an elastomeric adhesive tape while maintaining an accuracy in position and orientation.

Another object of the invention is to provide a lamination method capable of effectively preventing or inhibiting the formation of voids in a process for laminating a circuit pattern tape over a wafer.

Another object of the invention is to provide a lamination method capable of preventing a bowing phenomenon occurring in a lamination process carried out at a high temperature or in a subsequent process.

In accordance with one aspect, the present invention provides a method for laminating a circuit pattern tape over a wafer, comprising the steps of: preparing a circuit pattern tape formed with an adhesive layer, along with a wafer; detecting at least one reference position of the prepared circuit pattern tape and at least one reference position of the prepared wafer using visual detecting means; outputting results obtained at the detecting step in the form of visual images capable of allowing a comparison of the detection results; carrying out a reference position correction involving movements of the wafer in an X-axis and/or a Y-axis direction and/or by a desired angle, thereby allowing the reference position of the circuit pattern tape and the reference position of the wafer to correspond to each other; and laminating the circuit pattern tape over the wafer when the reference positions correspond to each other.

In accordance with another aspect, the present invention provides a method for laminating a circuit pattern tape over a wafer, comprising: an adhesive layer-carrying circuit pattern tape and wafer preparing step for feeding an adhesive layer-carrying circuit pattern tape in a sucked state by a vacuum sucking tool included in a circuit pattern tape sucking/feeding assembly while sucking and holding a wafer on a die arranged beneath the sucking tool by a wafer sucking/holding assembly; a reference position detecting step for detecting at least one reference position of the adhesive layer-carrying circuit pattern tape and at least one reference position of the wafer by visual detecting means included in a visual detecting assembly; a reference position correcting step for comparing the detection results outputted from the visual detecting assembly with each other, determining whether or not the compared reference positions correspond to each other, based on the comparison results, and, if the compared reference positions do not correspond to each other, then shifting the die holding the wafer in an X and/or a Y-axis direction or by a desired angle until the reference positions correspond to each other; and if the compared reference positions correspond to each other, then downwardly feeding the adhesive layer-carrying circuit pattern tape sucked onto the sucking tool to the wafer held on the die, thereby laminating the adhesive layer-carrying circuit pattern tape over the wafer.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Preferred embodiment of the present invention will now be described in detail, in conjunction with the annexed drawings. The description will be made in conjunction with a circuit pattern tape used in a lamination method according to the present invention, the fabrication of semiconductor packages using the circuit pattern tape, the lamination method of the present invention, and an apparatus used to carry out the lamination method of the present invention, in this order.

Figure 1A:
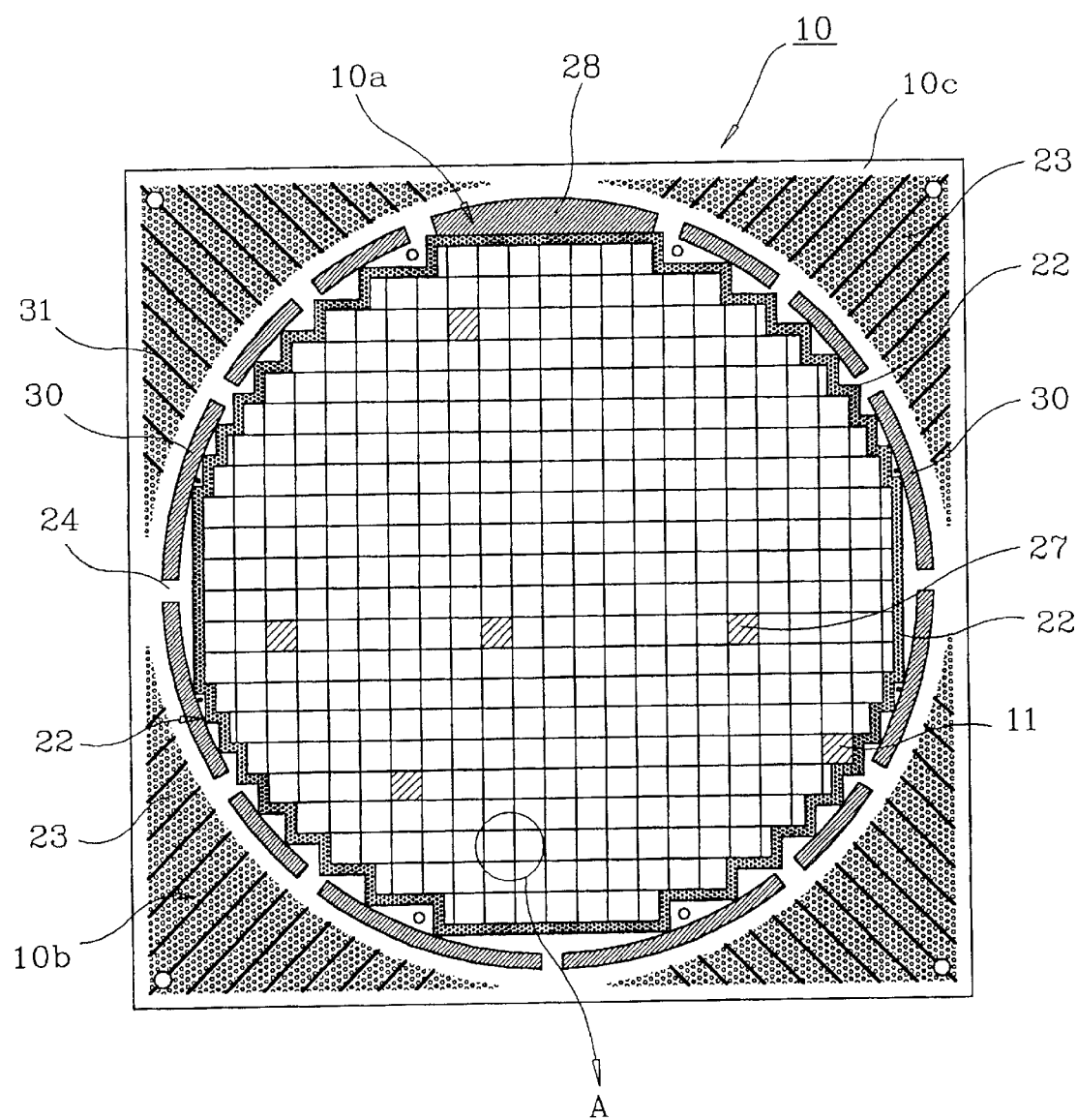
FIG. 1A is a plan view illustrating a circuit pattern tape for semiconductor packages adapted to be used in a lamination method according to the present invention.
Figure 1B:
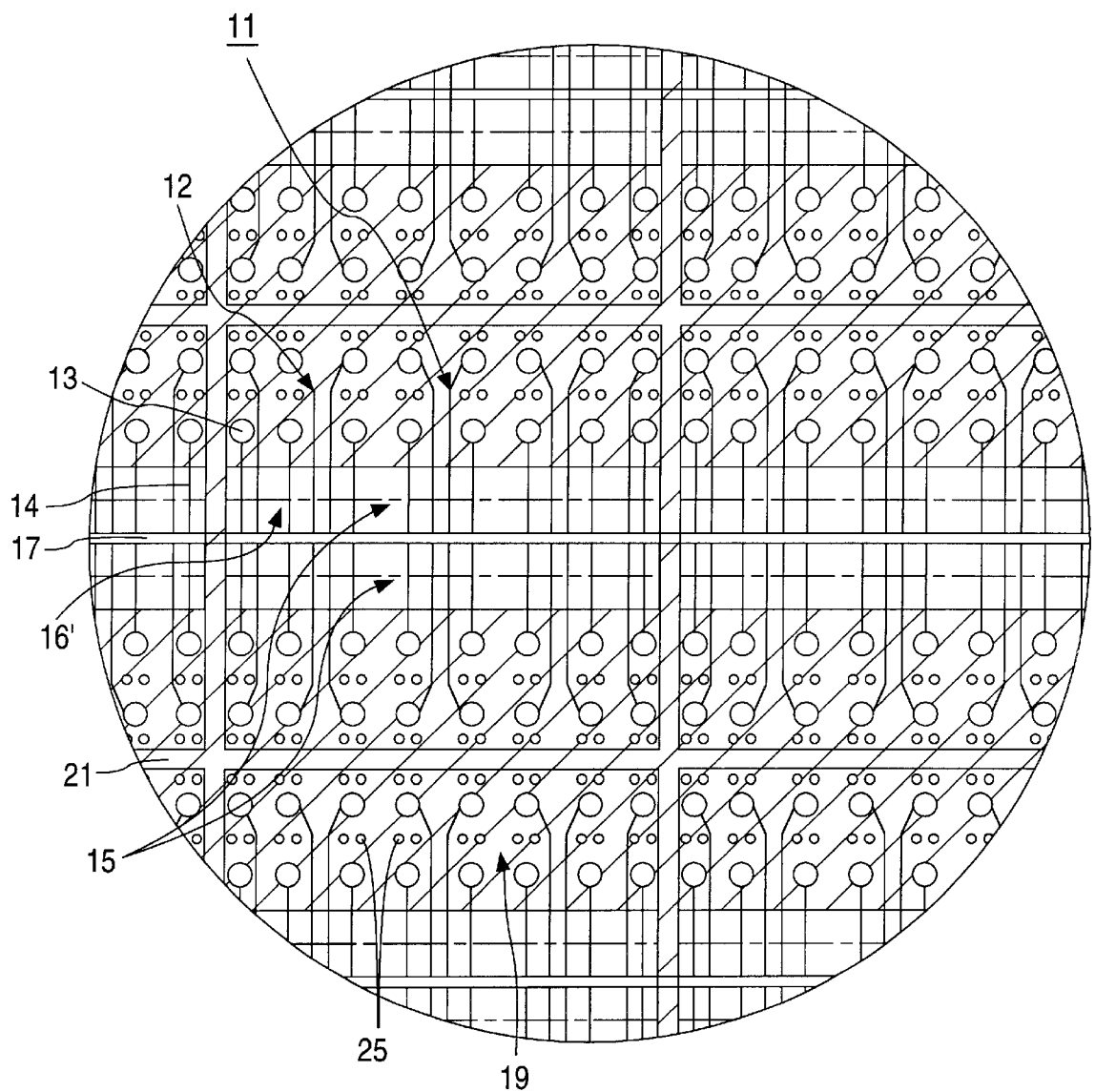
FIG. 1B is an enlarged view of a portion A in FIG. 1A, illustrating a center pad type structure.

FIG. 1A is a plan view illustrating a circuit pattern tape 10 for semiconductor packages adapted to be used in a lamination method according to the present invention. FIG. 1B is an enlarged view of a portion A in FIG. 1A. The circuit pattern tape 10 is adapted to accomplish the objects of the present invention.

Referring to FIG. 1A, the circuit pattern tape 10 has a circular portion 10a consisting of a plurality of circuit pattern units 11, and a peripheral portion lob arranged around the circuit portion 10a. The circuit portion 10a has the same shape as that of a wafer (denoted by the reference numeral 2 in FIG. 2A) consisting of a plurality of semiconductor chip units (denoted by the reference numeral 3 in FIG. 2A).

As shown in FIG. 1B, the circuit pattern tape 10, which is preferably used in the lamination method of the present invention, includes, for each circuit pattern unit 11, an independent circuit pattern. The circuit pattern of each circuit pattern unit 11 includes an opening formation region 16', bond finger formation regions 15 arranged at opposite sides of the opening formation region 16', respectively, in such a fashion that they face together, and a plurality of bond fingers 14 arranged in each bond finger formation region 15 and electrically connected to associated die pads (denoted by the reference numeral 4 in FIG. 2B) of an associated semiconductor chip (not shown). The circuit pattern also includes a plurality of solder ball lands 13 arranged outside each bond finger formation region 15 and attached with solder balls (not shown, but denoted by the reference numeral 7 in FIG. 3E) serving as external input/output terminals, and a plurality of conductive traces 12 each adapted to electrically connect one of the bond fingers 14 to an associated one of the solder ball lands 13. For each circuit pattern unit 11, the circuit pattern tape 10 also includes an insulating cover coat 19 coated over the entire region of the circuit pattern except for the solder ball lands 13, bond finger formation regions 15, and opening formation regions 16'. The circuit pattern tape 10 also includes singulation lines 21 not overlapping with the bond finger formation regions 15 and opening formation regions 16' of all circuit pattern units 11

Figure 1C:
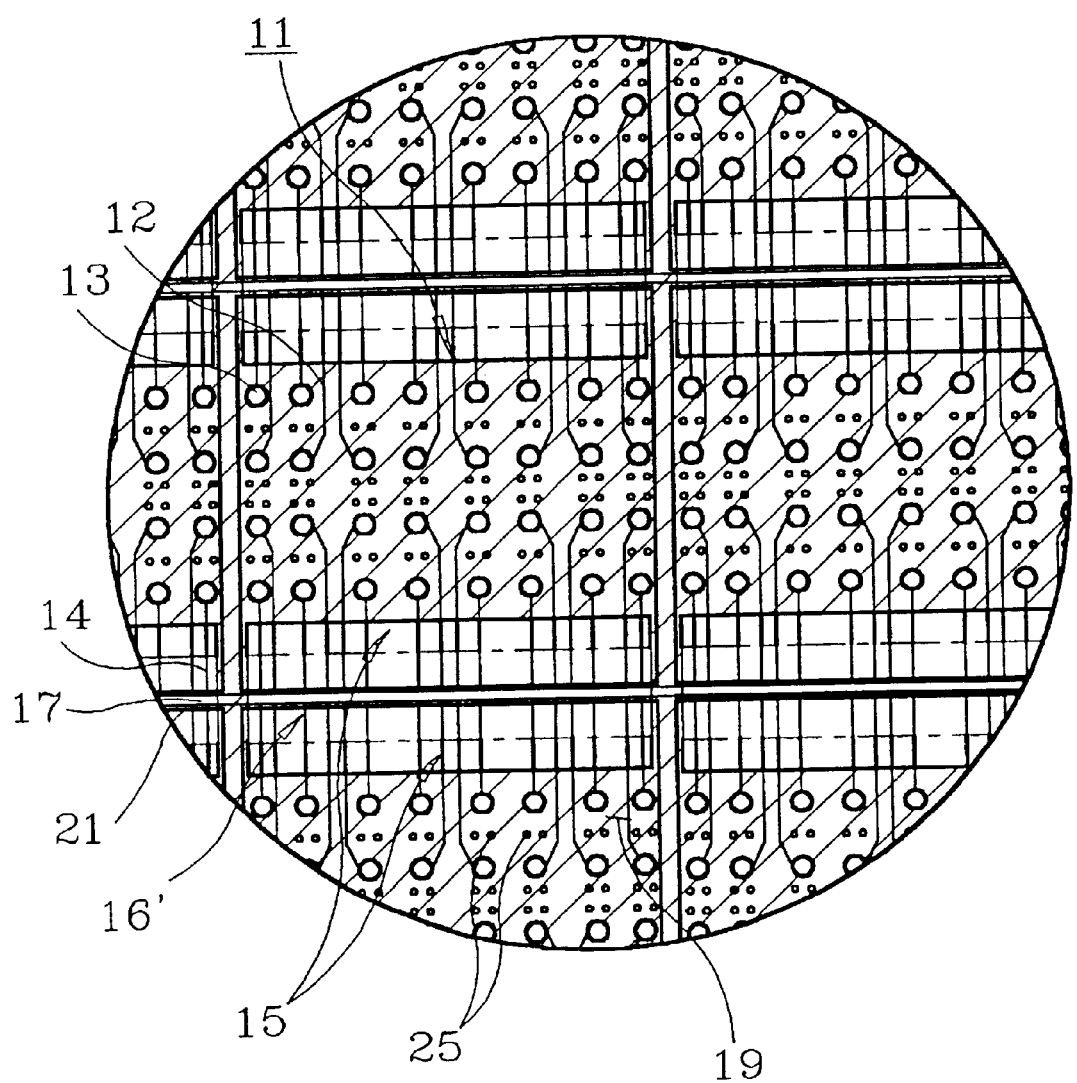
FIG. 1C is an enlarged view of the portion A in FIG. 1A, illustrating an edge pad type structure.

FIG. 1B illustrates a center pad type structure in which each opening formation region 16' is centrally arranged at an associated one of the circuit pattern units 11 so that when the circuit pattern tape is laminated over the wafer, the die pads formed on an associated one of the semiconductor chips in the wafer are exposed through an opening 16 formed by perforating the opening formation region 16'. On the other hand, FIG. 1C illustrates an edge pad type structure in which a pair of opening formation regions 16' are arranged at opposite edges of each circuit pattern unit 11, respectively, in such a fashion that each of the opening formation regions 16' is arranged between adjacent circuit pattern units 11, so that when the circuit pattern tape is laminated over the wafer, the die pads formed on the semiconductor chips in the wafer arranged between the adjacent circuit pattern units 11 while adjoining together are exposed together through an opening 16 formed by perforating each of the opening formation region 16'. The openings 16 may be formed at two or four facing edges of each circuit pattern unit 11, respectively. The structures of FIGS. 1B and 1C have the same basic configuration, except for the positions of the opening formation regions 16'. That is, the opening formation regions 16' are centrally formed at the circuit pattern units 11, respectively, in the structure of FIG. 1B, whereas they are formed between adjacent ones of the circuit pattern units, respectively, in the structure of FIG. 1C. No further description will be made for the above mentioned structures.

The circuit pattern tape 10, which is preferably used in the lamination method of the present invention, has a first dummy pattern for each circuit pattern unit 11 thereof. The first dummy patterns are adapted to provide a uniform distribution of a conductive metal for the formation of the solder ball lands 13, conductive traces 12, and bond fingers 14, thereby minimizing a difference in regard to the degree of thermal expansion between optional unit areas in each circuit pattern. Each of the first dummy patterns comprises a plurality of uniformly arranged metal thin layers 25 each having a disc shape.

The "dummy pattern" is a pattern having no electrical effect because it is not electrically connected to semiconductor chips (not shown) or solder ball lands 13 even though it is made of a conductive metal. In accordance with the present invention, such a dummy pattern may have a structure consisting of a plurality of uniformly arranged micro discs 25, a structure consisting of a plurality of linear traces (not shown) having the same shape as the conductive traces 12, or a combined structure thereof. The dummy pattern serves to reduce a maldistribution of the conductive metal (namely, the conductive traces 12, solder ball lands 13, and bond fingers 14) having a coefficient of thermal expansion higher than that of the cover coat 19, thereby considerably reducing the formation of voids caused by a relatively great difference in regard to the degree of thermal expansion exhibited between local regions in the circuit pattern tape 10 of the present invention when the circuit pattern tape 10 is laminated over a wafer (not shown) under a high temperature condition.

In FIG. 1B, the reference numeral 17 denotes bus lines which are conductive metal lines for the plating of the solder ball lands 13 and bond fingers 14. Each bond finger 14 is electrically connected at one end thereof to an associated one of the bus lines 17 by means of a conductive trace (denoted by no reference numeral).

Referring to FIG. 1A again, the circuit pattern tape 10 has the circular portion 10a consisting of a plurality of circuit pattern units 11, and the peripheral portion 10b arranged around the circular portion 10a. A second dummy pattern 22 may be selectively arranged around the circular portion 10a. The second dummy pattern 22 serves to minimize a difference in regard to the degree of thermal expansion exhibited in a radial direction. Similarly to the first dummy pattern, the second dummy pattern 22 may have a structure consisting of a plurality of uniformly arranged metal thin layers 25 having the form of micro discs, a structure consisting of a plurality of linear traces (not shown) having the same shape as the conductive traces 12, or a combined structure thereof. The second dummy pattern 22 is covered with the cover coat 19.

Although the circuit pattern tape 10, which is preferably used in the lamination method of the present invention, has been described in the above mentioned embodiment of the present invention as consisting of only the circuit patterns and the cover coat 19 laminated over the circuit patterns, the present invention is not limited thereto. In accordance with another embodiment of the present invention, a flexible insulating layer 18, preferably, a polyimide layer, may be formed beneath the circuit patterns. A core layer, for example, a metal thin layer or glass epoxy thin layer, may also be selectively formed beneath the flexible insulating layer 18. In place of the flexible insulating layer 18, a glass epoxy thin layer as a core layer may be formed directly beneath the circuit patterns.

The circuit pattern tape 10 of FIG. 1A, which is preferably used in the lamination method of the present invention, has a square or rectangular shape. The circuit pattern units 11 are centrally arranged on the circuit pattern tape 10 while forming the circular portion 10a having the same size and shape as a wafer to which the circuit pattern tape 10 is to be attached. No circuit pattern unit, such as the circuit pattern units 11, exists in the peripheral portion 10b arranged around the circular portion 10a. A planar metal thin layer (not shown) exists on the peripheral portion 10b. A frame portion 10c is arranged along the outer periphery of the peripheral portion 10b. At least one bowing prevention element 30 may be selectively formed at the peripheral portion 10b between the circular portion 10a and frame portion 10c. No metal thin layer exists on the bowing prevention element 30. Although the individual and entire shapes of bowing prevention elements 30 are not limitative, there are several bowing prevention elements 30 having an arc shape to totally form a circular shape in the case of FIG. 1A. A recognition mark attachment region 28 may be defined on a part of the bowing prevention elements 30. The recognition mark attachment region 28 also serves as a bowing prevention element. For the recognition mark, a bar code may be used. At least one bus bar 24 may also be provided. Where there are two or more bowing prevention elements 30, one or more bus bars 24 may be provided in such a fashion that each of the bus bars 24 is arranged between adjacent bowing prevention elements 30. On the other hand, where there is only one bowing prevention element 30, a single bus bar 24 may be provided in such a fashion that it is arranged between opposite ends of the bowing prevention element 30. Such bus bars 24 serve as an electrical connection for the planar metal thin layer in order to prevent an increase in the width and thickness of a plated film over the solder ball lands 13 and bond fingers 14 of each circuit pattern due to an increase in the current density of metal lines forming the circuit pattern.

A plurality of micro through-holes 23 are formed through the cover coat 19 at the peripheral portion 10b of the circuit pattern tape 10 between the bowing prevention elements 30 and the frame portion 10c. Through the micro through-holes 23, the planar metal thin layer is upwardly exposed. By virtue of the provision of the micro through-holes 23, it may be expected that the bowing phenomenon of the circuit pattern tape 10 caused by a relatively great difference in regard to the degree of thermal expansion between the planar metal thin layer and the flexible insulating layer, such as the cover coat 19 or polyimide layer, is prevented or reduced.

A plurality of bowing prevention radial grooves 31 may be formed at the peripheral portion 10b of the circuit pattern tape 10 in such a fashion that no metal thin layer exist thereon, as shown in FIG. 1A. By virtue of the provision of the bowing prevention radial grooves 31, it is possible to prevent or reduce a bowing phenomenon occurring in a direction orthogonal to the bowing prevention radial grooves 31, in addition to a bowing phenomenon occurring in a radial direction. In the case illustrated in FIG. 1A, accordingly, the metal thin layer has a planar comb-toothed shape connecting the outer periphery of the circular portion 10a to the frame portion 10c.

In FIG. 1A, the reference numeral 27 denotes test regions for testing the circuit pattern tape 10 in accordance with the present invention. To these test regions, processes involved in the fabrication of semiconductor packages are not applied. Even though the test regions are subjected to those processes, the resultant products are not intended to be used as semiconductor packages.

Figure 2A:
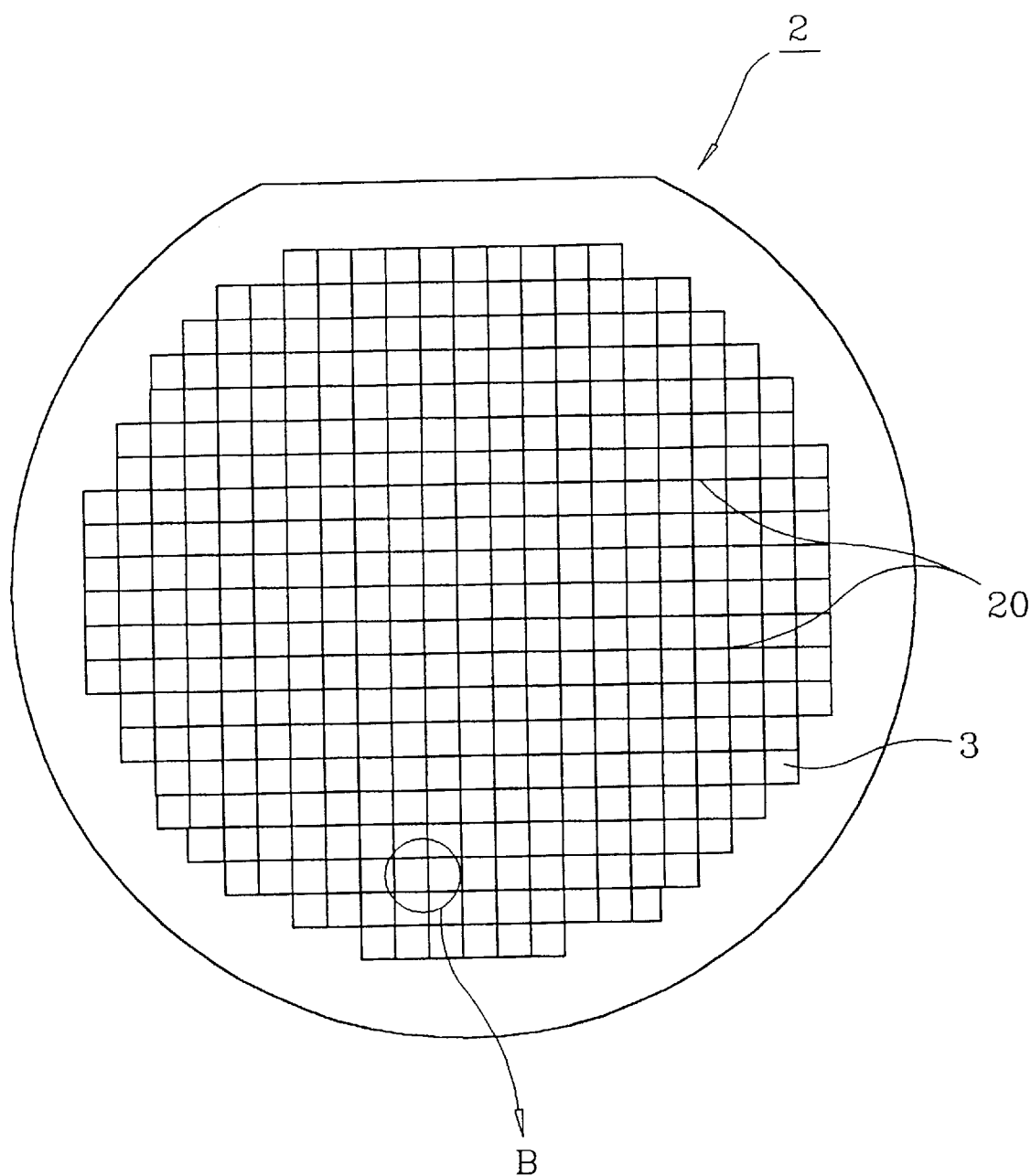
FIG. 2A is a plan view of a typical wafer.
Figure 2B:
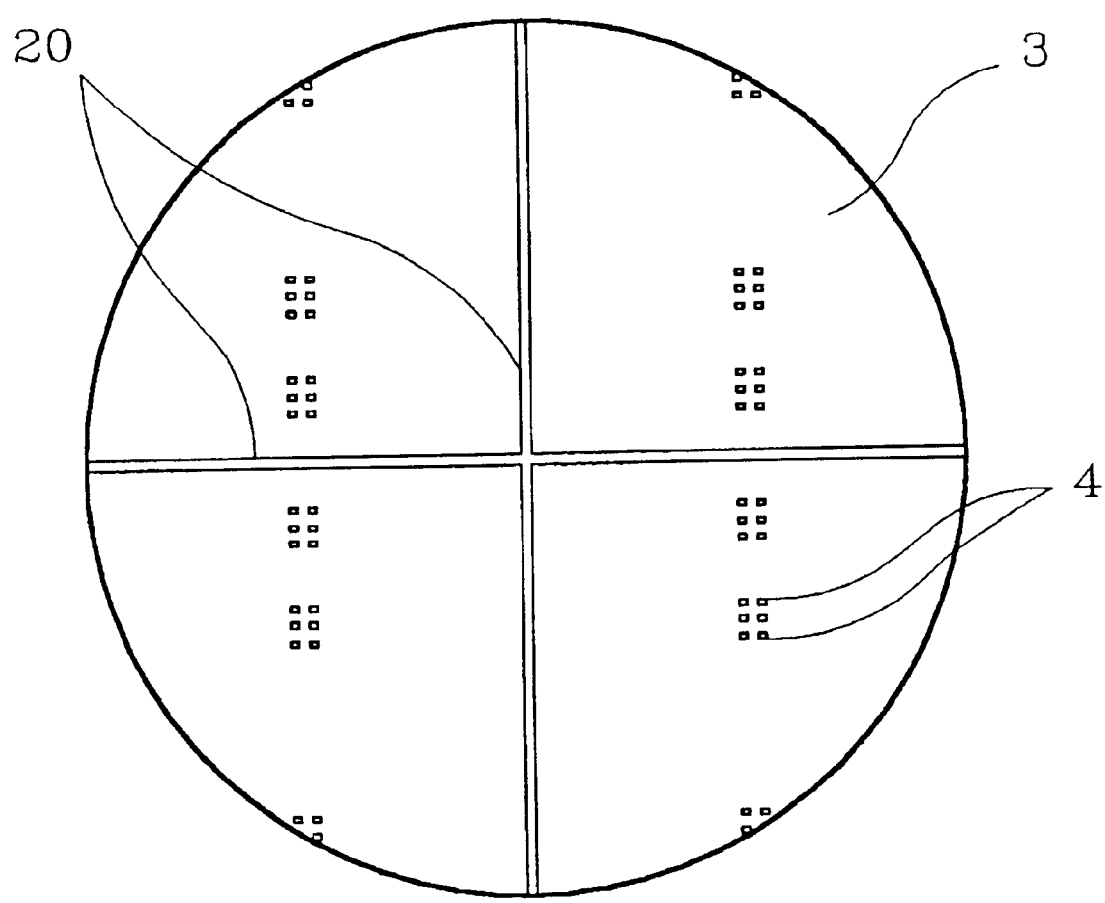
FIG. 2B is an enlarged view of a portion B in FIG. 2A.

FIG. 2A is a plan view of a typical wafer 2 partitioned into a plurality of semiconductor chip units 3 by singulation lines 20. FIG. 2B is an enlarged view of a portion B in FIG. 2A. FIGS. 2A and 2B illustrate wire bonding die pads 4 formed on each semiconductor chip unit 3. The shown arrangement for the die pads 4 is intended only for illustrative purposes, the die pads 4 may be arranged in one column or several columns. The die pads 4 may also be arranged at the central portion of each semiconductor chip unit 3 or at edges of each semiconductor chip unit 3.

Heretofore, the configurations of the circuit pattern tape 10 and wafer 2 have been described in conjunction with FIGS. 1A to 2B. For the understanding of the lamination method according to the present invention, the procedure for fabricating chip size semiconductor packages using the above mentioned circuit pattern tape will be described in brief in conjunction with FIGS. 3A to 3F.

Figure 3A:
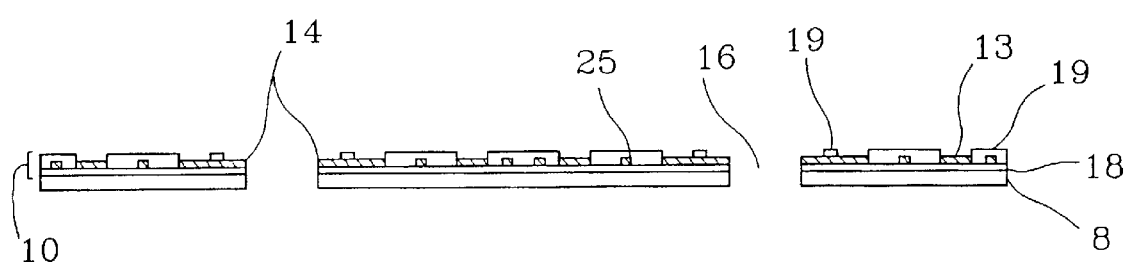
FIGS. 3A to 3F are cross-sectional views respectively illustrating sequential steps of a procedure for fabricating chip size semiconductor packages using the above mentioned circuit pattern tape as shown in FIG. 1B.
Figure 3B:
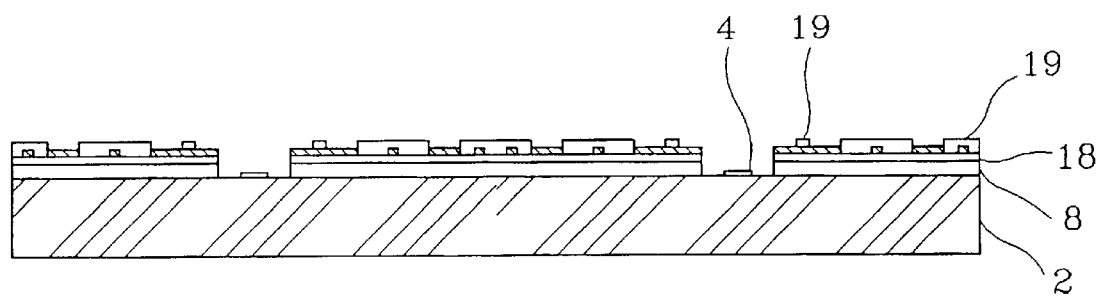
Figure 3C:
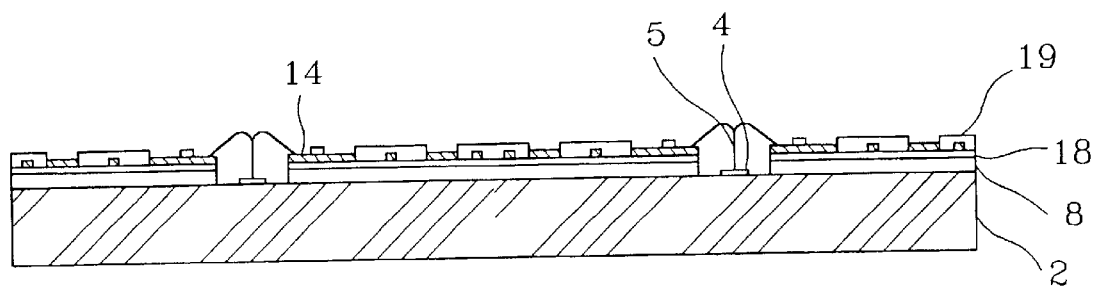
Figure 3D:
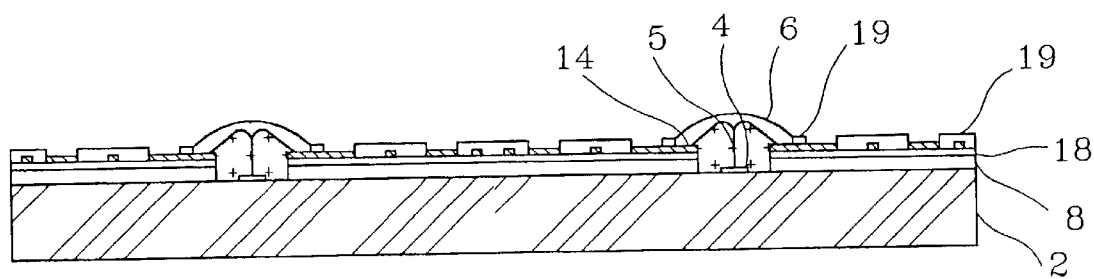
Figure 3E:
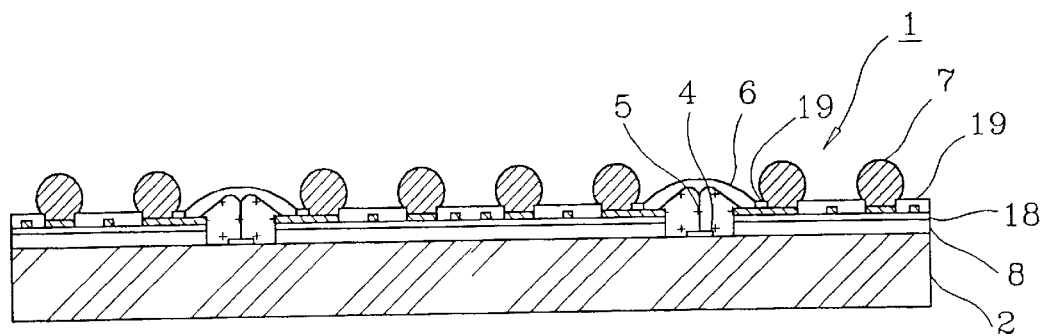
Figure 3F:
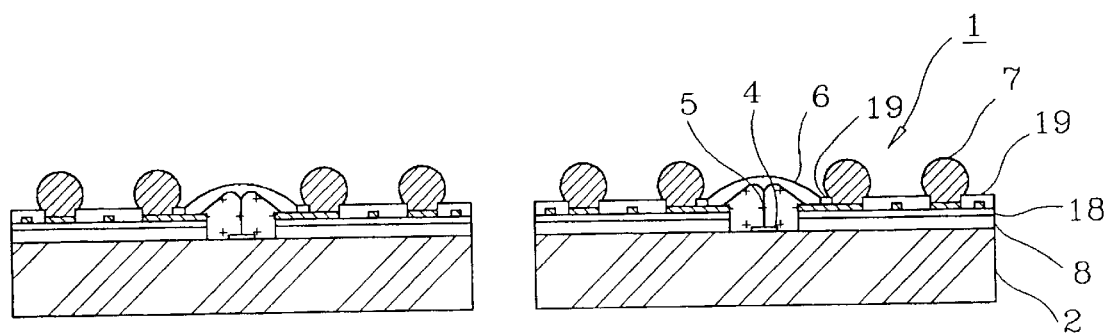

FIGS. 3A to 3F are cross-sectional views respectively illustrating sequential steps of the procedure for fabricating chip size semiconductor packages 1 using the above mentioned circuit pattern tape 10 which has a center pad type structure as shown in FIG. 1B. FIG. 3A is a cross-sectional view partially showing a structure obtained after forming an adhesive layer 8 on the lower surface of the circuit pattern tape 10, and then perforating openings 16 through the circuit pattern tape 10. FIG. 3B is a cross-sectional view partially showing a structure obtained after a lamination thereof over a wafer 2. FIG. 3C is a cross-sectional view partially showing a structure obtained after a wire bonding process using wires 5. FIG. 3D is a cross-sectional view partially showing a structure obtained after a formation of resin encapsulates 6. FIG. 3E is a cross-sectional view partially showing a structure obtained after a formation of solder balls 7 as external input/output terminals. FIG. 3F is a cross-sectional view partially showing a structure obtained after a singulation process for separating the structure of FIG. 3E into individual chip size semiconductor packages 1 in accordance with a cutting method.

An adhesive layer and opening formation step in the package fabrication procedure will be first described in conjunction with FIG. 3A. Referring to FIG. 3A, a flexible insulating layer 18 such as a polyimide layer is first prepared as a substrate of the circuit pattern tape 10. On the upper surface of the flexible insulating layer 18, circuit patterns are formed, each of which includes solder ball lands 13, bond fingers 14, and conductive traces 12 electrically connecting the associated solder ball lands 13 and bond fingers 14 together, respectively. A first dummy pattern consisting of a plurality of disc-shaped metal thin layers 25 may be selectively formed on the upper surface of the flexible insulating layer 18. An insulating cover coat 19 is then coated over the upper surface of the resulting structure, except for regions where the solder ball lands 13 and bond fingers 14 are arranged. That is, the insulating cover coat 19 covers the circuit patterns, except for the solder ball lands 13 and bond fingers 14, and the first dummy pattern.

However, the circuit pattern tape 10, which is used in the present invention, is not limited to the above mentioned structure. As mentioned above, the flexible insulating layer 18, which is preferably a polyimide layer, may be eliminated. A core layer, for example, a metal thin layer or glass epoxy thin layer, may also be formed beneath the flexible insulating layer 18. Alternatively, the glass epoxy thin layer, as the core layer, may be formed directly beneath the circuit patterns, in place of the flexible insulating layer 18.

An adhesive layer 8 such as a double-sided adhesive tape is then formed on the entire lower surface of the circuit pattern tape 10. Thereafter, the circuit pattern tape 10 is perforated at its opening formation regions, denoted by the reference numeral 16' in FIG. 1B, using a perforation means such as a laser or punch, thereby forming openings 16.

FIG. 3B is a cross-sectional view illustrating a lamination step for bonding the circuit pattern tape 10 of FIG. 2A, formed with the openings 16, to a wafer 2 by means of the adhesive layer 8. As shown in FIG. 3B, die pads 4 on each semiconductor chip unit (denoted by the reference numeral 3 in FIG. 2A) of the wafer 2, which serve as input/output terminals, are arranged in an associated one of the openings 16 in such a fashion that they are upwardly exposed.

FIG. 3C is a cross-sectional view illustrating a wire-bonding step for bonding the bond fingers 14 of the circuit pattern tape 10 laminated over the wafer 2 to the associated die pads 4 of the wafer 2 by means of wires 5 made of gold, aluminum, or an alloy thereof to exhibit a superior electrical conductivity, respectively.

FIG. 3D is, a cross-sectional view illustrating a resin encapsulate formation step for dispensing a liquid encapsulate material, for example, a liquid epoxy resin, to regions each defined by the side surfaces of an associated one of the openings 16, the upper surface portion of the wafer 2 carrying die pads 4 exposed through the opening 16, and the side walls of the cover coat 19 defining the bond fingers 14 arranged at opposite sides of the opening 16, and then curing the dispensed liquid epoxy resin, thereby forming resin encapsulates 6. The resin encapsulates 6 serve to protect the die pads 4, bond fingers 14, and bonding wires 5 from physically, chemically, electrically, and electronically hazardous environments.

FIG. 3E is a cross-sectional view illustrating an external terminal formation step for forming external input/output terminals, such as solder balls 7, following the formation of the resin encapsulates 6. After the completion of the external terminal formation step, a plurality of semiconductor packages 1 each having a complete structure are formed on the wafer 2.

FIG. 3F is a cross-sectional view illustrating a singulation step for separating the wafer 2 into individual chip size semiconductor packages 1 in accordance with a singulation process using a cutting method.

Figure 4:
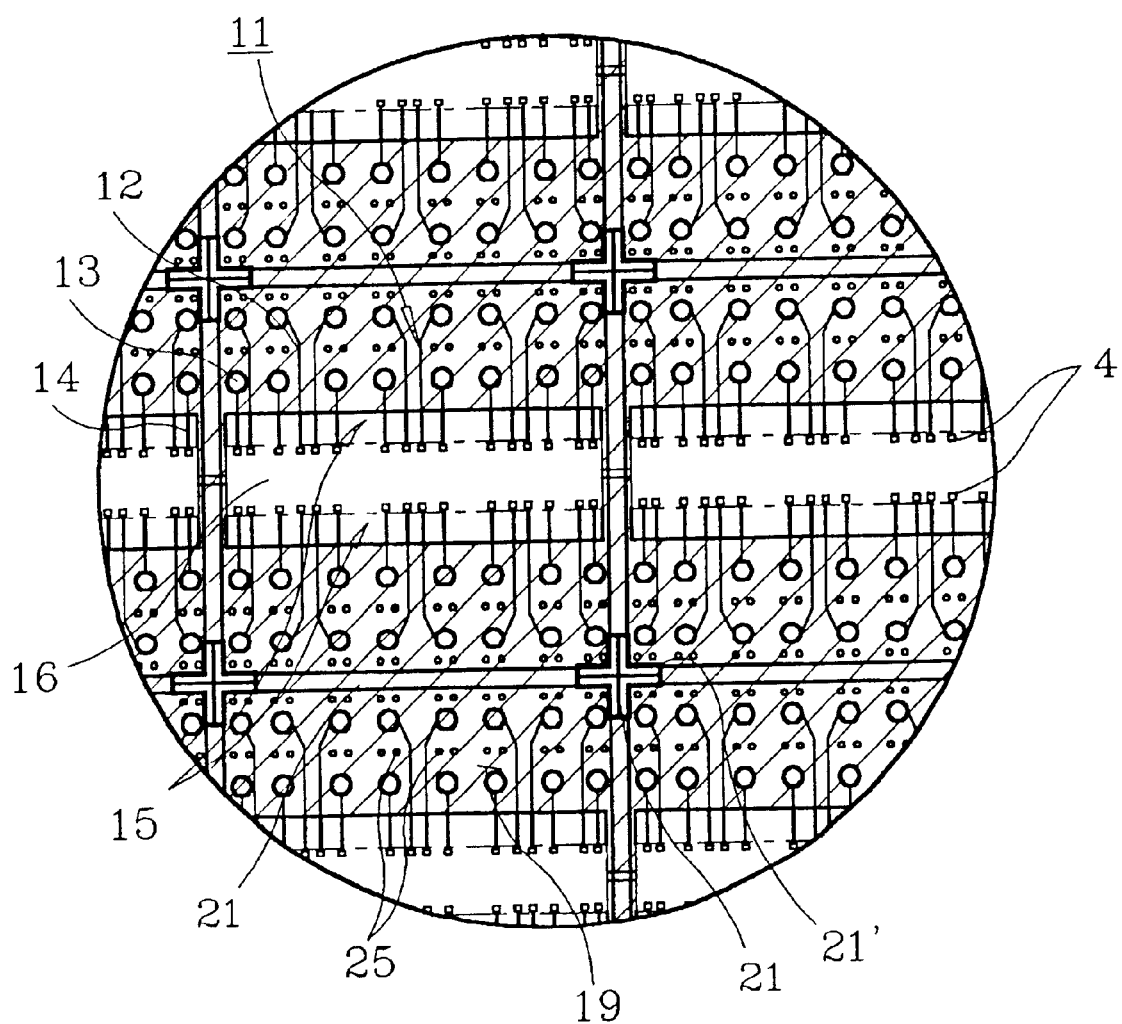
FIG. 4 is a plan view corresponding to FIG. 3C.

FIG. 4 is a plan view corresponding to FIG. 3C and showing a structure obtained after forming openings 16 at the circuit pattern tape 10 (by perforating the opening formation regions 16' of FIG. 1B), and then laminating the resultant circuit pattern tape 10 over the wafer 2. FIG. 4 is also an enlarged view of the portion A in FIG. 1A. When the circuit pattern tape 10 of FIG. 4 formed with the openings 16 is laminated over the wafer 2, the lamination is carried out in such a fashion that the die pads 4 on each semiconductor chip unit 3 of the wafer 2 are upwardly exposed through an associated one of the openings 16. Accordingly, the die pads 4 of each semiconductor chip unit 3 can be electrically connected with the bond fingers 14 of an associated one of the circuit pattern units 11 by means of bonding wires (not shown) at a subsequent processing step.

Referring to FIG. 4, a singulation line identification hole 21' is provided at the cross point of two crossing ones of singulation lines 21. At the cross point of two crossing singulation lines 21', four circuit pattern units 11 adjoin together. Two crossing singulation lines 21 are upwardly exposed through an associated one of the singulation line identification holes 21' so that they can be visually identified. Since it is possible to identify accurate singulation positions on the wafer 2 even after the lamination of the circuit pattern tape 10 over the wafer 2, a visual detecting unit adapted to be used in the singulation process can easily and accurately detect the singulation positions so as to carry out a cutting process along the accurately detected singulation positions. In the circuit pattern tape 10, which is adapted to be used in the lamination method of the present invention, the provision of the singulation line identification holes 21' is optional. Although there is no singulation line identification hole, the singulation lines on the wafer may be visually identified from the top where the cover coat 19, flexible insulating layer 18 and adhesive layer 8 disposed over the wafer 2 are semi-transparent.

Figure 5A:
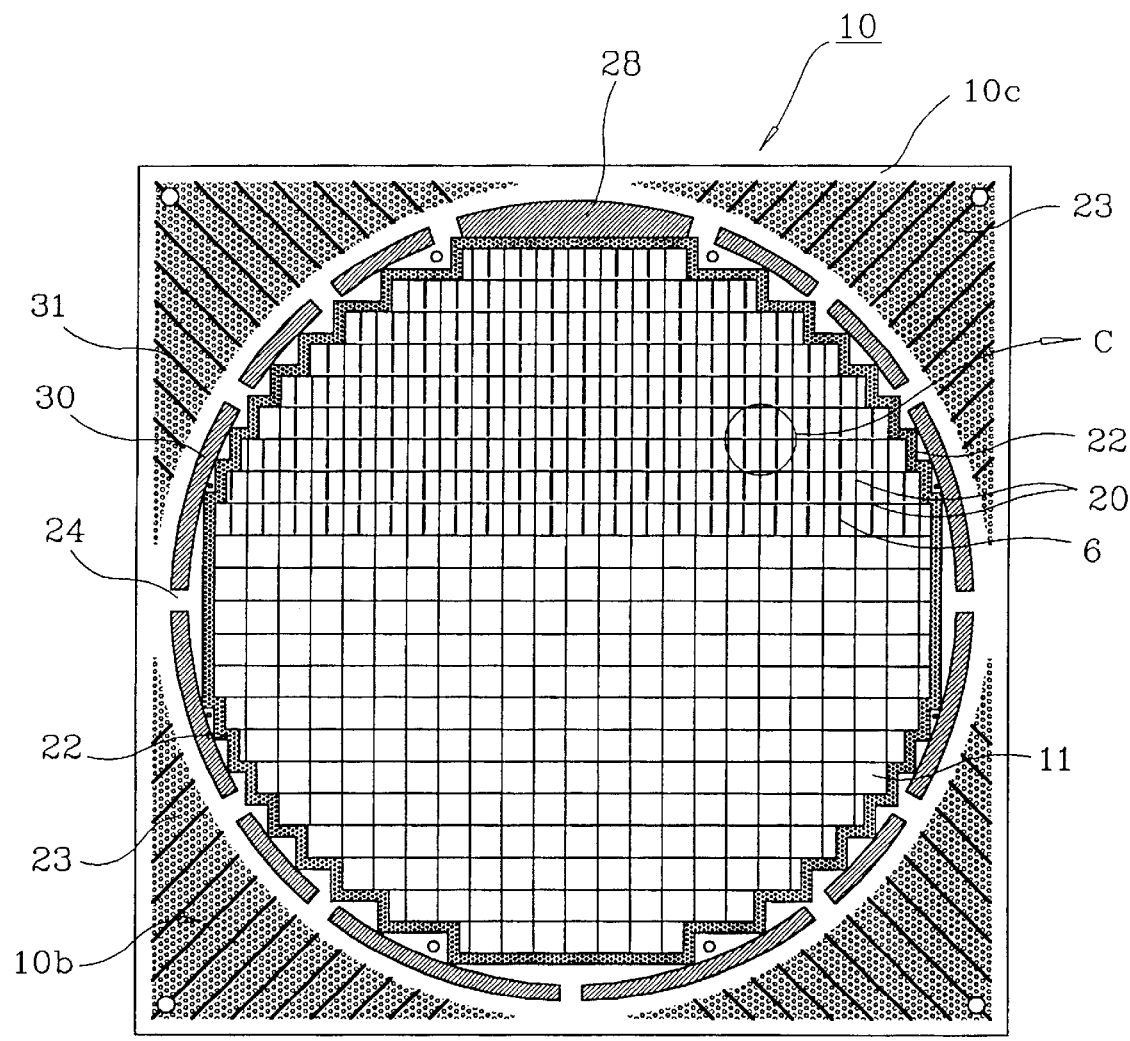
FIG. 5A is a plan view illustrating the wafer having a structure obtained after a packaging process conducted, following the lamination of the circuit pattern tape of FIGS. 1A and 1B over the wafer of FIG. 2A, to form a plurality of semiconductor packages, but before implementing a singulation process.
Figure 5B:
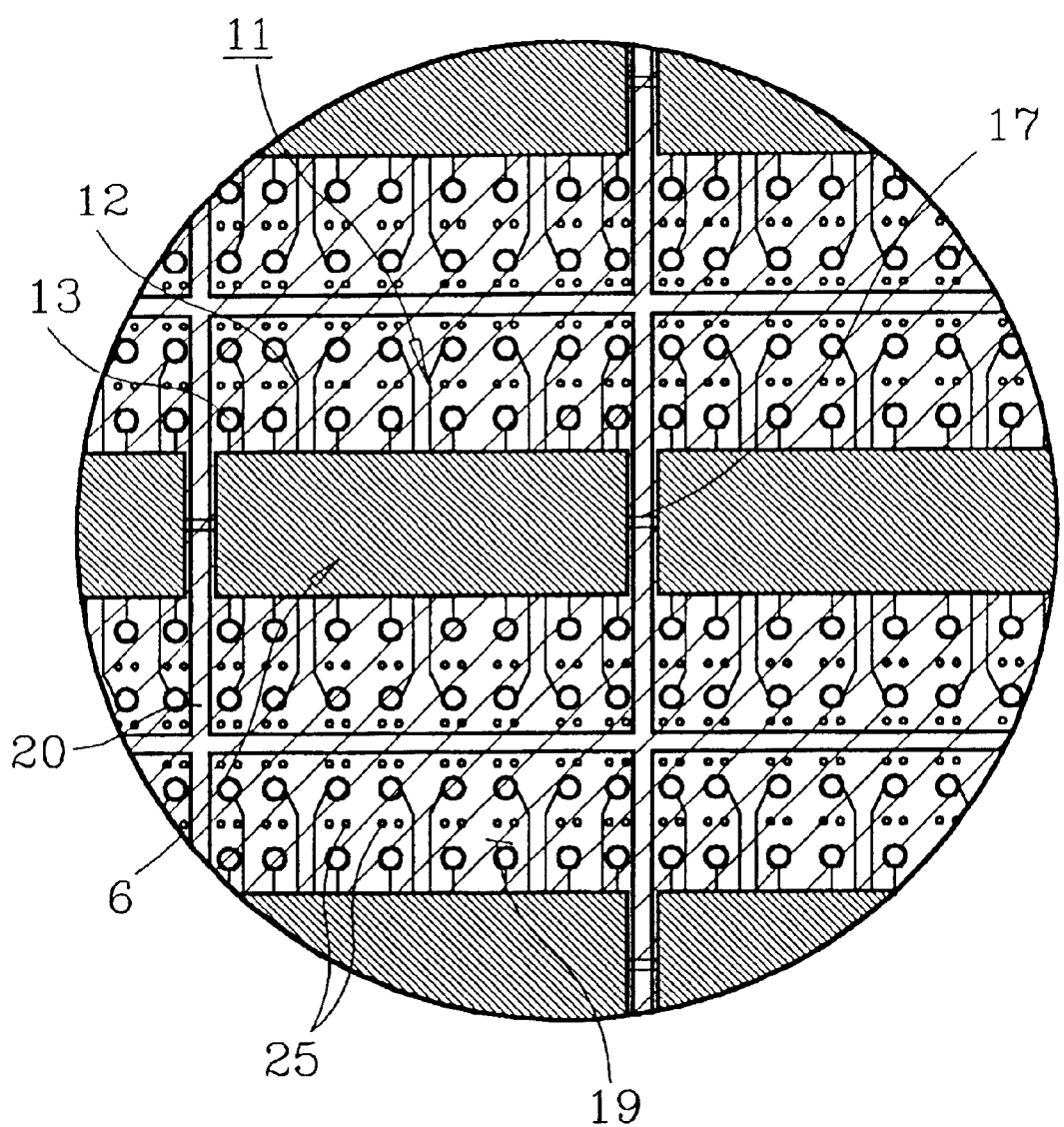
FIG. 5B is an enlarged view of a portion C in FIG. 5A.

FIG. 5A is a plan view illustrating the wafer 2 having a structure obtained after a packaging process conducted, following the lamination of the circuit pattern tape 10 of FIGS. 1A and 1B over the wafer 2 of FIG. 2A, to form a plurality of chip size semiconductor packages 1, but before a singulation process. Referring to FIG. 5A, it can be found that a resin encapsulate 6 is formed at a region where an associated one of the semiconductor chip units 3 and the opening 16 provided at the circuit pattern unit 11 disposed over the semiconductor chip unit are arranged. FIG. 5B is an enlarged view of the portion C in FIG. 5A. FIG. 5B shows a state in which the resin encapsulate 6 is formed at a region defined on the structure of FIG. 1B while including the die pad formation regions of the associated semiconductor chip 3 and the opening 16 and bond finger formation regions 15 of the associated circuit pattern unit 11.

Figure 6A:
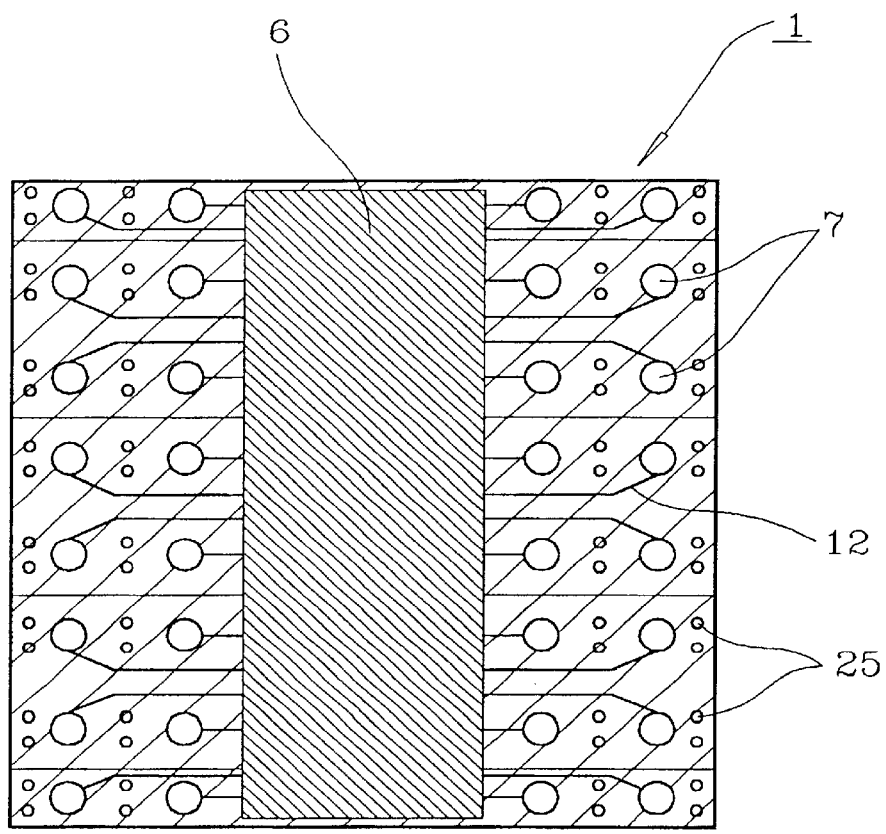
FIG. 6A is a plan view illustrating one of semiconductor packages fabricated in accordance with the fabrication procedure shown in FIGS. 3A to 3F.
Figure 6B:
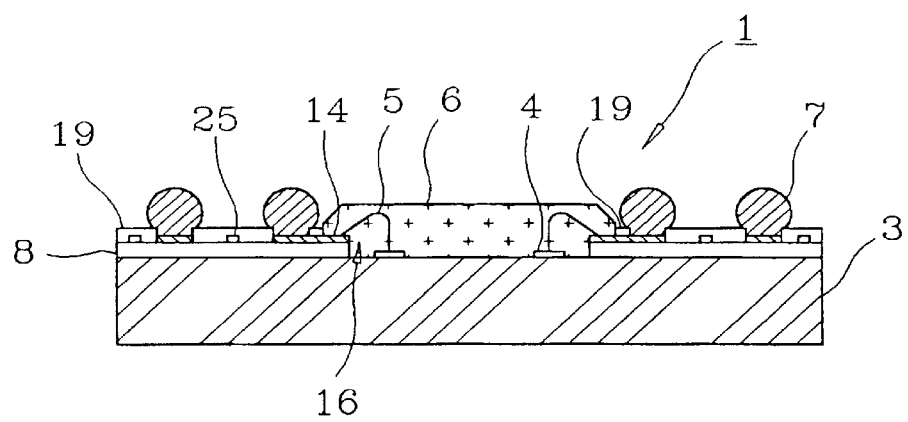
FIG. 6B is a cross-sectional view of the semiconductor package shown in FIG. 6A.

FIG. 6A is a plan view illustrating one of center pad type chip size semiconductor packages 1 fabricated in accordance with the fabrication procedure shown in FIGS. 3A to 3F. FIG. 6B is a cross-sectional view of FIG. 6A. Since the structure of FIG. 6B has the same configuration as that of FIG. 3F, no further description thereof will be made. Accordingly, a brief description will be made only in conjunction with FIG. 6A.

Referring to FIG. 6A, one of chip size semiconductor packages 1 fabricated using the circuit pattern units 11 of FIG. 1B adapted to be used in the lamination method of the present invention. The chip size semiconductor package 1 has a resin encapsulate 6 encapsulating therein die pads 4, bond fingers 14, and bonding wires electrically connecting those die pads 4 and bond fingers 14 together.

A plurality of disc-shaped metal thin layers 25, which form a first dummy pattern, are disposed at a region, where no metal exists, between adjacent solder ball lands made of a conductive metal while having a relatively large area. At the solder ball lands, solder balls 7 serving as external terminals are fused. By virtue of such a first dummy pattern, it is possible to reduce a difference in regard to the conductive metal layer area among unit area portions of the circuit pattern. The first dummy pattern serves to reduce or minimize a difference in regard to the degree of thermal expansion exhibited between local regions in the circuit pattern tape 10 of the present invention when the circuit pattern tape 10 is laminated over the wafer 2 under a high temperature condition, thereby effectively reducing the formation of voids.

Figure 7A:
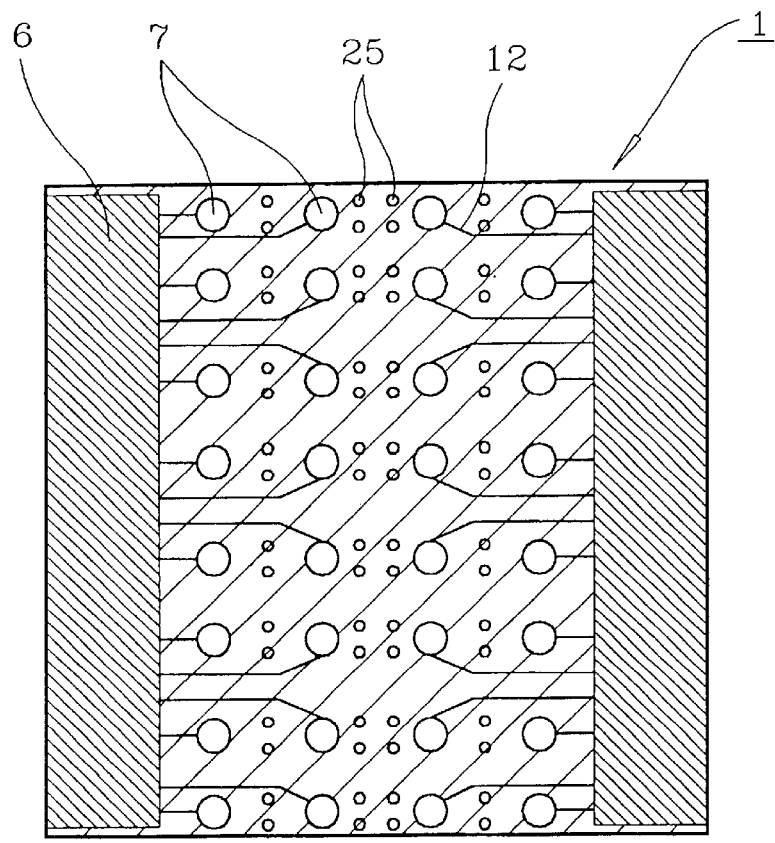
FIG. 7A is a plan view illustrating one of edge pad type semiconductor packages.
Figure 7B:
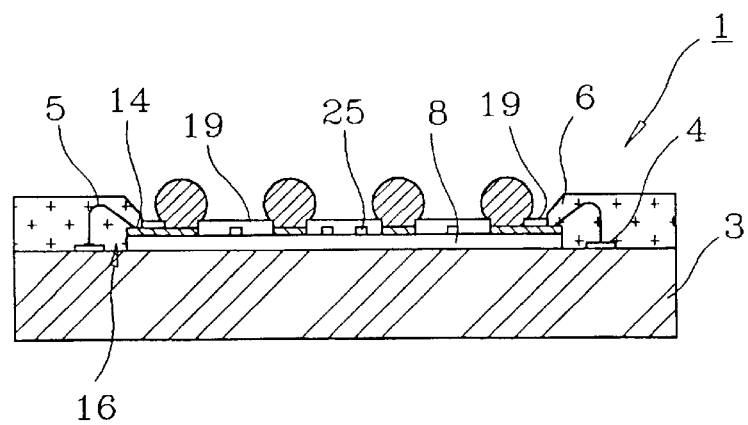
FIG. 7B is a cross-sectional view of the semiconductor package shown in FIG. 7A.

FIGS. 7A and 7B are a plan view and a cross-sectional view respectively illustrating one of edge pad type chip size semiconductor packages 1 fabricated in accordance with the fabrication procedure shown in FIGS. 3A to 3F. The structure of FIGS. 7A and 7B has the same configuration as that of FIGS. 6A and 6B, except that the semiconductor package 1 has one opening 16 and one resin encapsulate 6 at each of its opposite edges. Each opening 16 and each resin encapsulate 6 in the structure of FIGS. 7A and 7B have sizes corresponding to half those of the structure of FIGS. 6A and 6B, respectively. That is, the openings 16 and resin encapsulates 6 in the structure of FIGS. 7A and 7B are formed by longitudinally cutting one full-size opening 16 and one full-size resin encapsulate 6 formed between adjacent circuit patterns into two half-size opening portions and two half-size resin encapsulate portions along the aligned singulation lines 20 and 21. Since the structure of FIGS. 7A and 7B 6B have the same configuration as that of FIGS. 6A and 6B, no further description thereof will be made.

FIGS. 8A to 8F are cross-sectional views respectively illustrating sequential steps of the procedure for forming the adhesive layer 8 over the circuit pattern tape 10 using the elastomeric adhesive tape 35, and then laminating the circuit pattern tape 10 over the wafer 2 in accordance with the lamination method of the present invention.

Figure 8A:
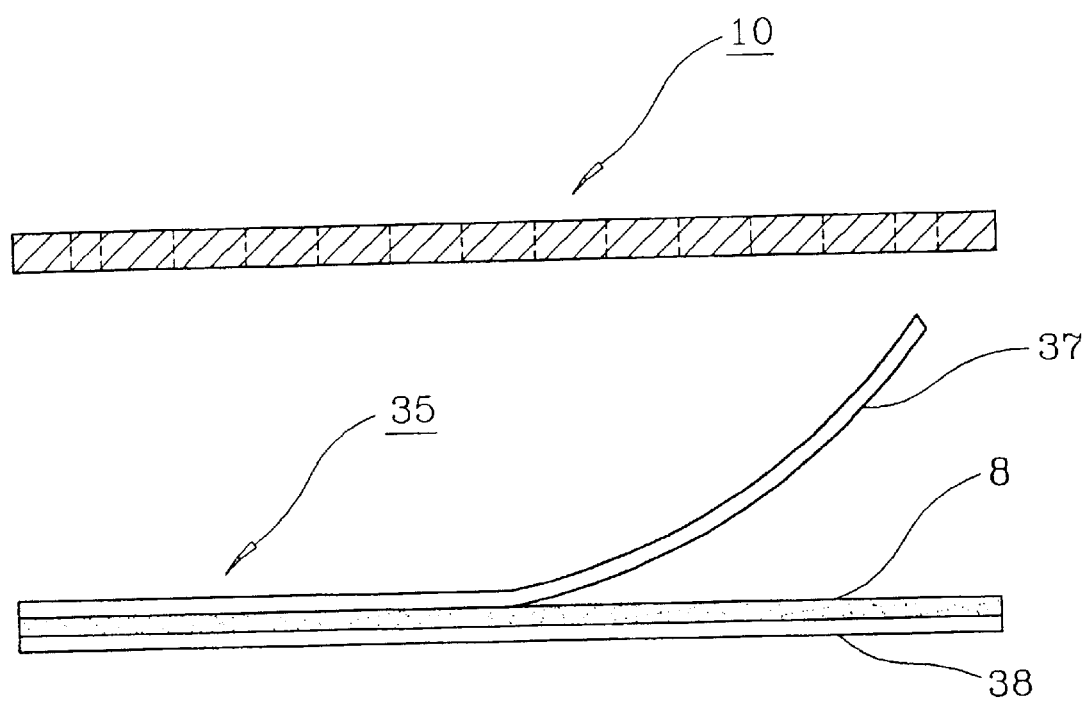
FIGS. 8A to 8F are cross-sectional views respectively illustrating sequential steps of the procedure for laminating the circuit pattern tape over the wafer using an elastomeric adhesive tape in accordance with the lamination method of the present invention.

FIG. 8A is a cross-sectional view illustrating a processing step for preparing the circuit pattern tape 10 along with the elastomeric adhesive tape 35. Since the laminated structure of the circuit pattern tape 10 has been described, only its schematic illustration is made in FIG. 8 without any further description thereof.

The elastomeric adhesive tape 35 has a laminated structure including an adhesive layer, which is the adhesive layer 8, and a pair of release films 37 and 38 respectively attached to the upper and lower surfaces of the adhesive layer 8. The release films 37 and 38 can be easily released from the adhesive layer 8.

After the preparation of the adhesive tape 35, a processing step for removing the upper release film 37 is conducted. At this processing step, the upper release film 37 is released from the adhesive tape 35, thereby upwardly exposing the adhesive layer 8.

Figure 8B:
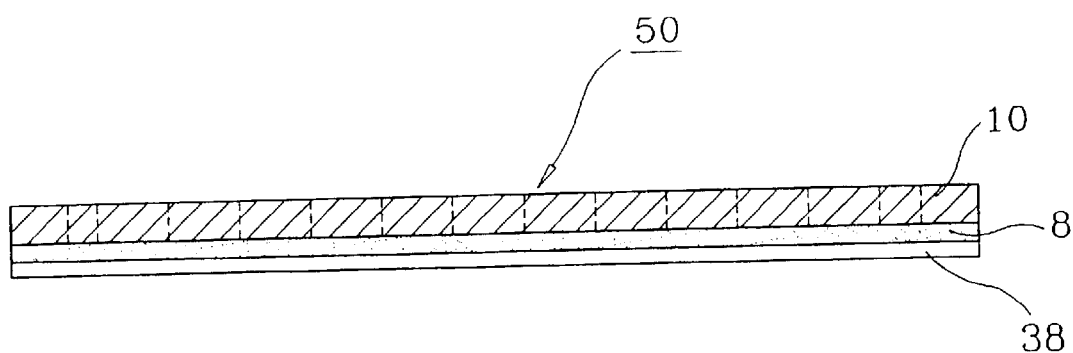

FIG. 8B illustrates an adhesive layer formation step. At this adhesive layer formation step, the elastomeric adhesive tape 35 is bonded to the lower surface of the prepared circuit pattern tape 10 by the adhesive layer 8 exposed at its upper surface by the release of the upper release film 37 therefrom. Thus, an adhesive layer-carrying circuit pattern tape 50 is prepared.

Figure 8C:
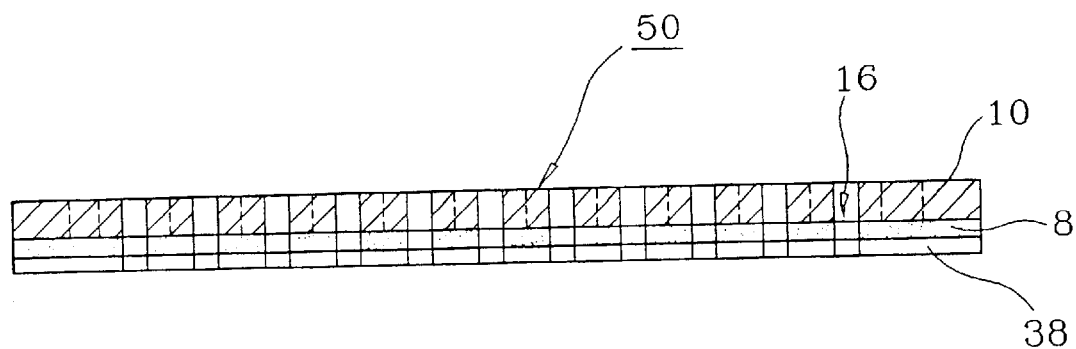

FIG. 8C illustrates an opening formation step in which the opening formation regions (denoted by the reference numerals 16' in FIGS. 1B and 1C) of the circuit pattern tape 50 are perforated, thereby forming openings 16. Each opening 16 extends throughout the circuit pattern tape 10, adhesive layer 8 and lower release film 38.

Figure 8D:
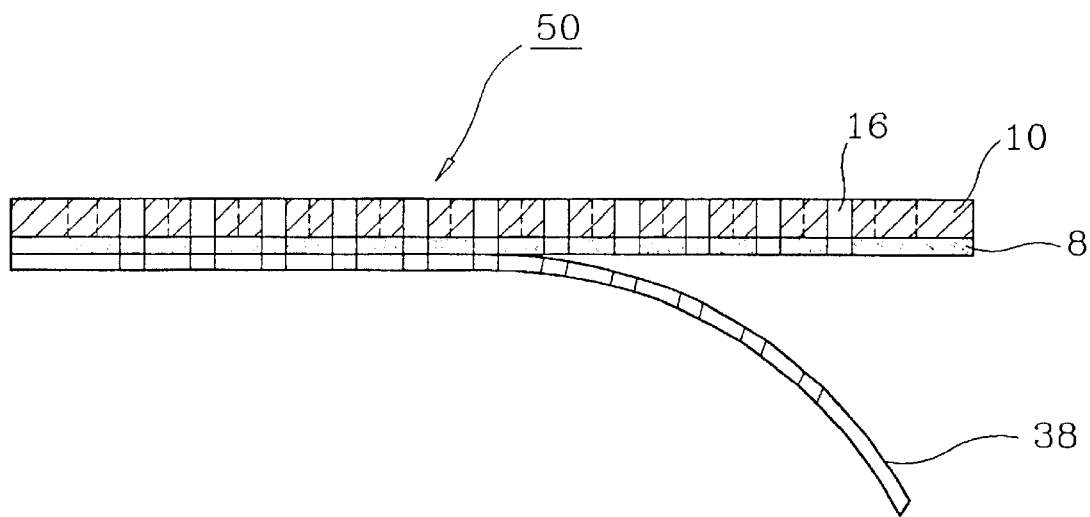

FIG. 8D illustrates a processing step for removing the lower release film 38 after the completion of the opening formation step. When the lower release film 38 is removed from the circuit pattern tape 50, the adhesive layer 8 is downwardly exposed at its lower surface.

Figure 8E:
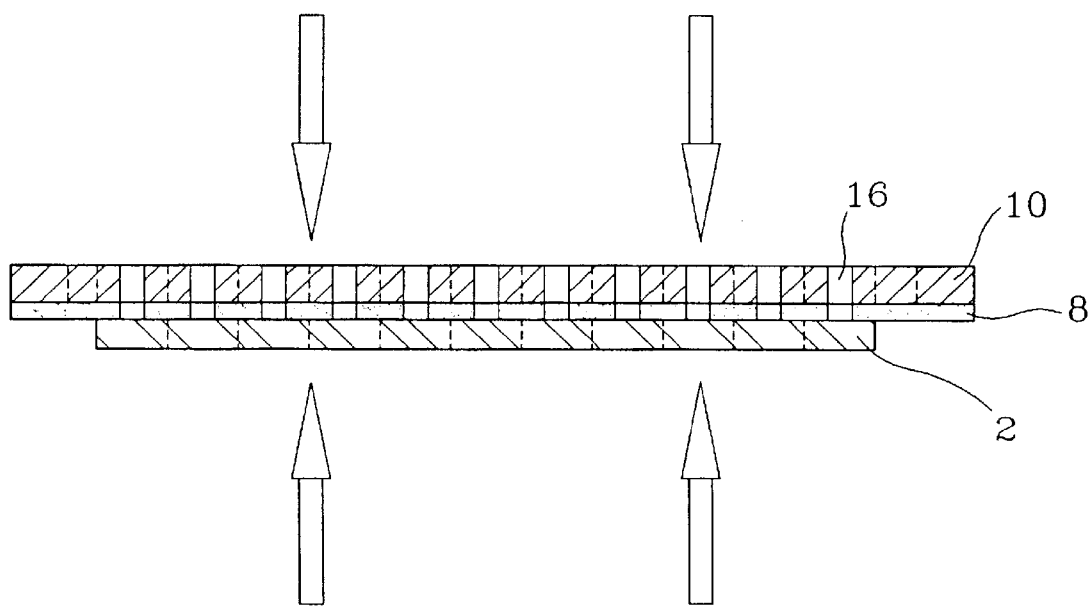

FIG. 8E illustrates a lamination step for bonding the circuit pattern tape 50 to the upper surface of a wafer 2 by the adhesive layer 8, exposed at its lower surface, while maintaining an accuracy in position and orientation. At this lamination step, all die pads of each semiconductor chip unit 3 in the wafer 2 should be arranged within the opening 16, provided at an associated one of the circuit pattern units 11 in the circuit pattern tape 10, in such a fashion that they are upwardly exposed through the opening 16. The bond fingers should also be uniformly arranged while spacing from the associated die pads by a uniform distance, respectively. The lamination step should also be conducted without forming voids between the lower surface of the circuit pattern tape 10 and between the adhesive layer 8 and the upper surface of the wafer 2. It is also important to avoid a bowing phenomenon from occurring during or after the lamination step conducted under pressure at a high temperature.

Figure 8F:
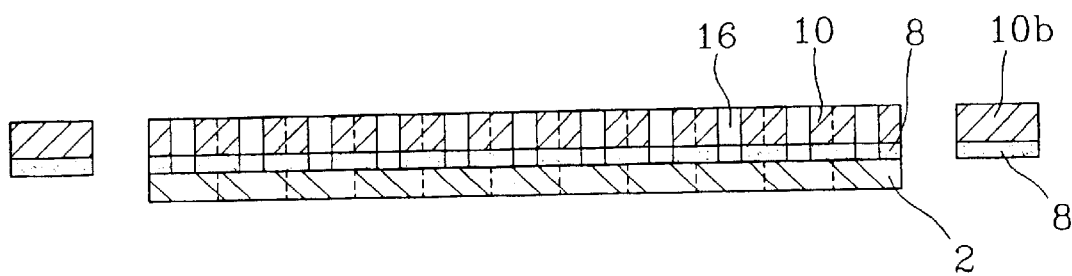

FIG. 8F illustrates a processing step for removing the peripheral portion (denoted by the reference numeral 10b in FIG. 1A) of the circuit pattern tape 10. At this processing step, the circuit pattern tape 10 is cut along the periphery of the wafer 2 laminated therewith, thereby removing its peripheral portion 10b therefrom.

Following the peripheral portion removal step, a well-known packaging process is carried out which involves a wire bonding step for electrically connecting the bond fingers to the die pads by wires, a resin encapsulate formation step for encapsulating the wire bonding areas of the wafer with a molded encapsulate resin to protect the wire bonding areas from external environments, an external terminal formation step for forming solder balls on the solder ball lands, and a singulation step for cutting the circuit pattern tape 10 and wafer 2 along the singulation lines 21 and 20, respectively, thereby separating the resultant wafer 2 into individual semiconductor chips, that is, individual independent semiconductor packages.

Figure 9:
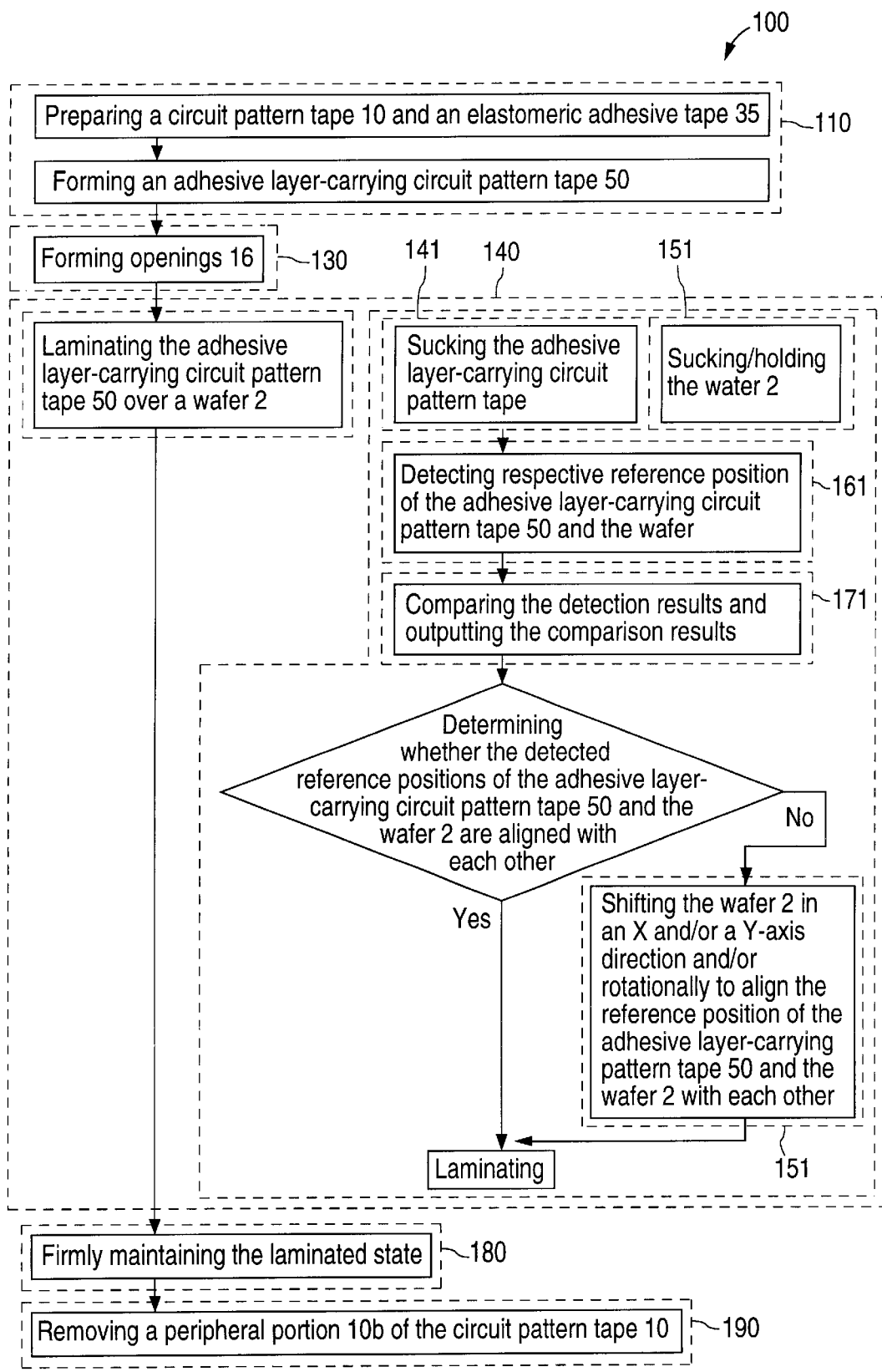
FIG. 9 is a flow chart illustrating the lamination method of the present invention.

FIG. 9 is a flow chart illustrating the lamination method of the present invention conducted using the above mentioned circuit pattern tape 10 in a laminating apparatus 100 which will be described hereinafter. FIG. 9 illustrates respective processing steps of the lamination method according to the present invention, along with respective assemblies of the laminating apparatus 100 by which the processing steps are executed.

The laminating apparatus 100 includes an adhesive layer forming assembly 110, a punching press assembly 130, a laminating assembly 140, a high-temperature press assembly 180, and a cutting assembly 190. In particular, the laminating assembly 140 includes a circuit pattern tape sucking/feeding assembly 141, a wafer sucking/holding assembly 151, and a visual detecting assembly 161, and a monitoring assembly 171.

In accordance with the lamination method of the present invention, a processing step for preparing a circuit pattern tape 10 and an elastomeric adhesive tape 35 is first executed, as shown in FIG. 9. Thereafter, a processing step for forming an adhesive layer-carrying circuit pattern tape 50 is executed by the adhesive layer forming assembly 110. At this processing step, the prepared circuit pattern tape 10 and elastomeric adhesive tape 35 are bonded to each other, thereby forming an adhesive layer-carrying circuit pattern tape 50. An opening forming step is then carried out by the punching press assembly 130 to form openings 16 through the circuit pattern tape 50. Following the opening forming step, a laminating step is carried out by the laminating assembly 140. At the laminating step, the circuit pattern tape 50 is laminated over a wafer 2. At the high-temperature press assembly 180, the resultant wafer 2 is pressed at a high temperature in order to firmly maintain the laminated state thereof. After the completion of the lamination maintaining step, a processing step for removing the peripheral portion 10b of the circuit pattern tape 10 is conducted by the cutting assembly 190.

In order to carry out the laminating step, the adhesive layer-carrying circuit pattern tape 50 is sucked to a sucking tool provided at the circuit pattern tape sucking/feeding assembly 141 whereas the wafer 2 is held on a die in a sucked state by the wafer sucking/holding assembly 151. In this state, respective reference positions of the circuit pattern tape 50 and wafer 2 are detected by the visual detecting assembly 161. The monitoring assembly 171 conducts a comparison for the detection results obtained from the visual detecting assembly 161, thereby determining whether or not the detected reference positions are aligned with each other. Where the detected reference positions are aligned with each other, the sucking tool is downwardly moved to conduct the lamination step. On the other hand, when the detected reference positions are misaligned from each other, the die is shifted in an X and/or a Y-axis direction and/or by an angle of $\Theta_z$ to align the reference positions with each other. After such an adjustment, the lamination step is conducted.

Although the lamination method of the present invention has been described in brief in conjunction with the flow chart of FIG. 9, it will be described in more detail in conjunction with the detailed configurations of the laminating apparatus.

Figure 10:
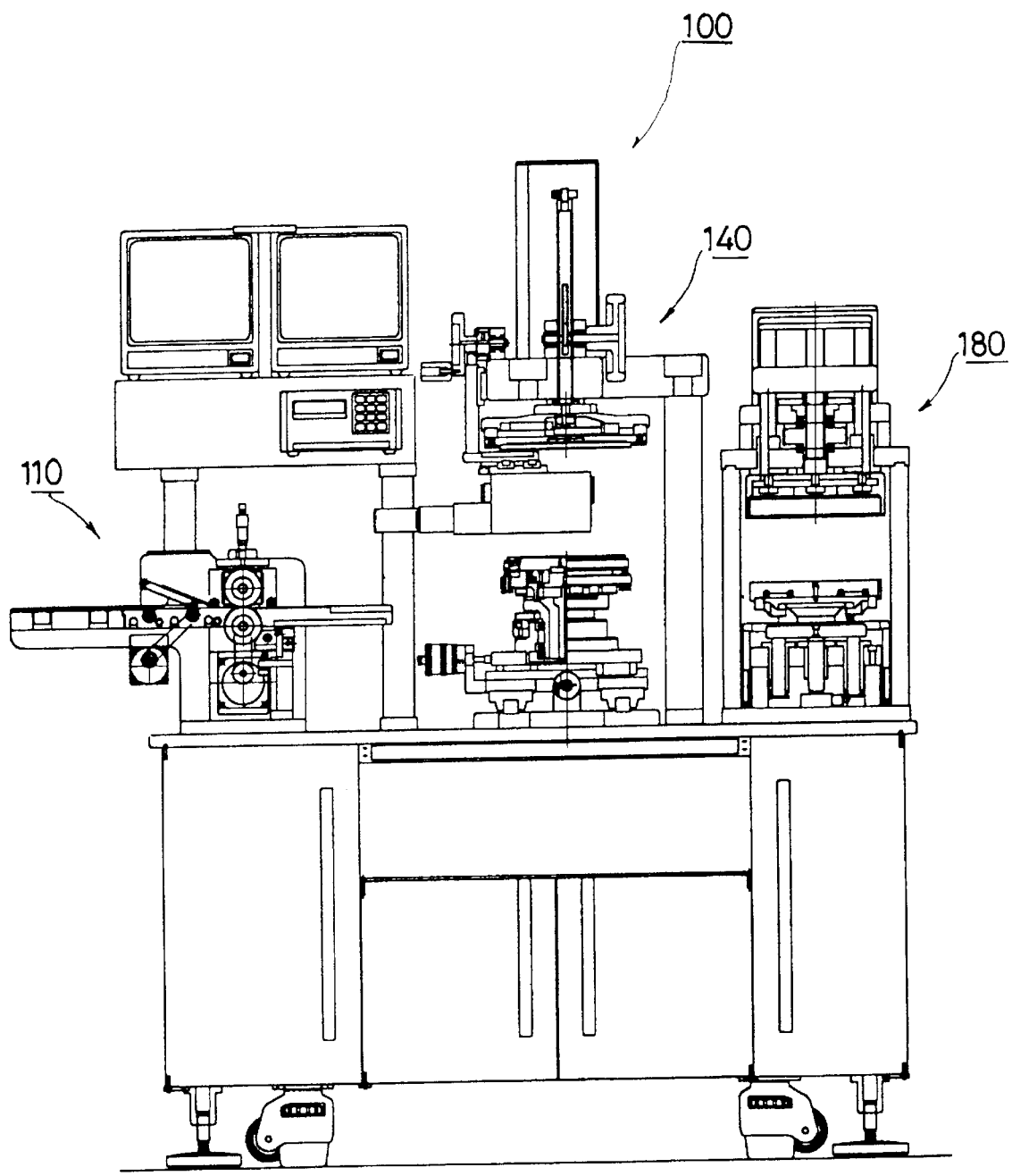
FIG. 10 is a front view illustrating a laminating apparatus adapted to carry out the lamination method of the present invention.

FIG. 10 is a front view illustrating the laminating apparatus 100 adapted to carry out the lamination method of the present invention. Although the laminating apparatus 100 has been illustrated as including only the adhesive layer forming assembly 110, laminating assembly 140, and high-temperature press assembly 180, for the simplicity of illustration, it may also include the above mentioned punching press assembly 130 and cutting assembly 190. These configurations may be apparent by referring to the above description made in conjunction with FIG. 9.

Figure 11A:
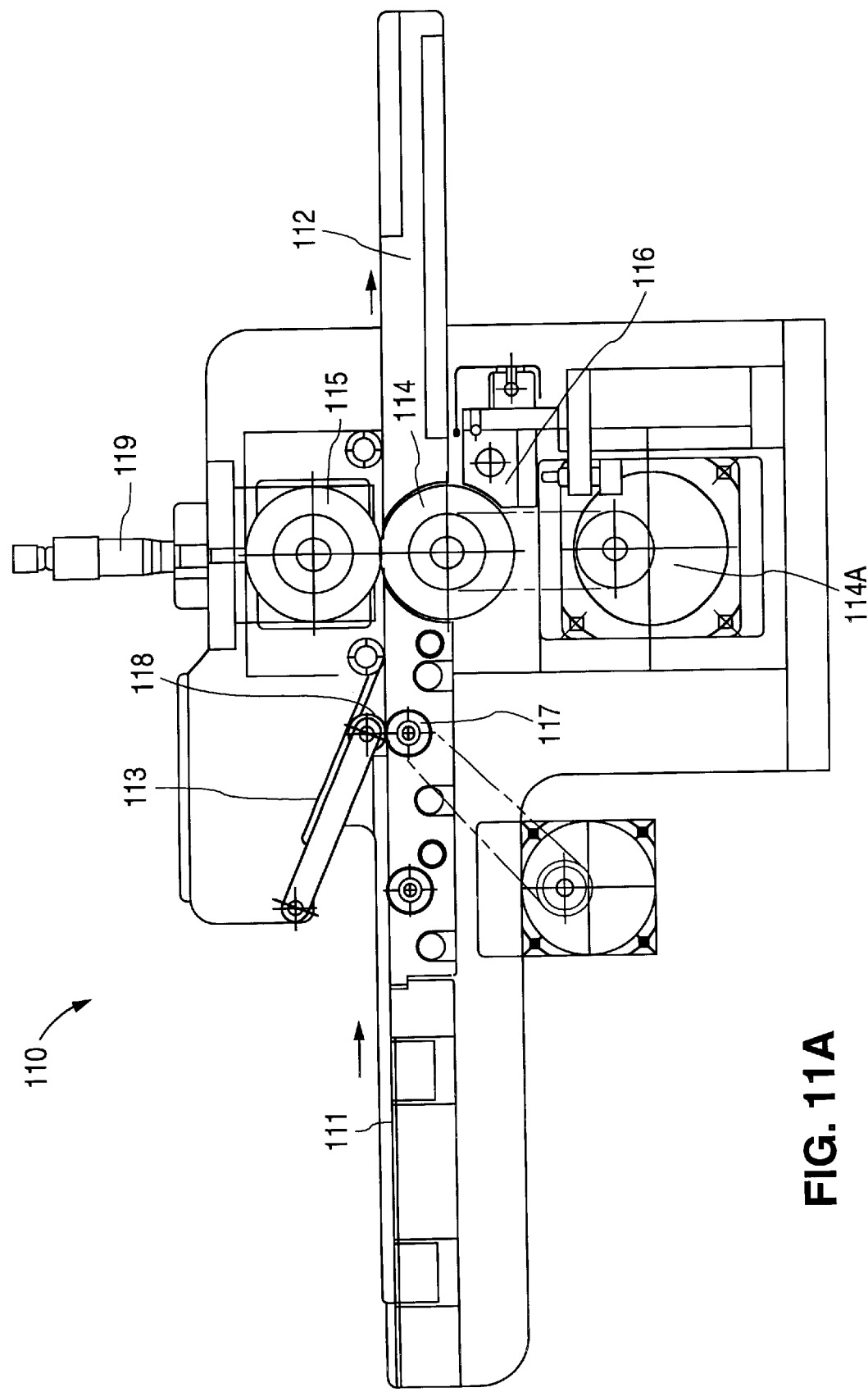
FIGS. 11A and 11B are a front view and a side view respectively illustrating an adhesive layer forming assembly adapted to carry out a processing step for bonding the circuit pattern tape and the elastomeric adhesive tape with each other, in the lamination method of the present invention.
Figure 11B:
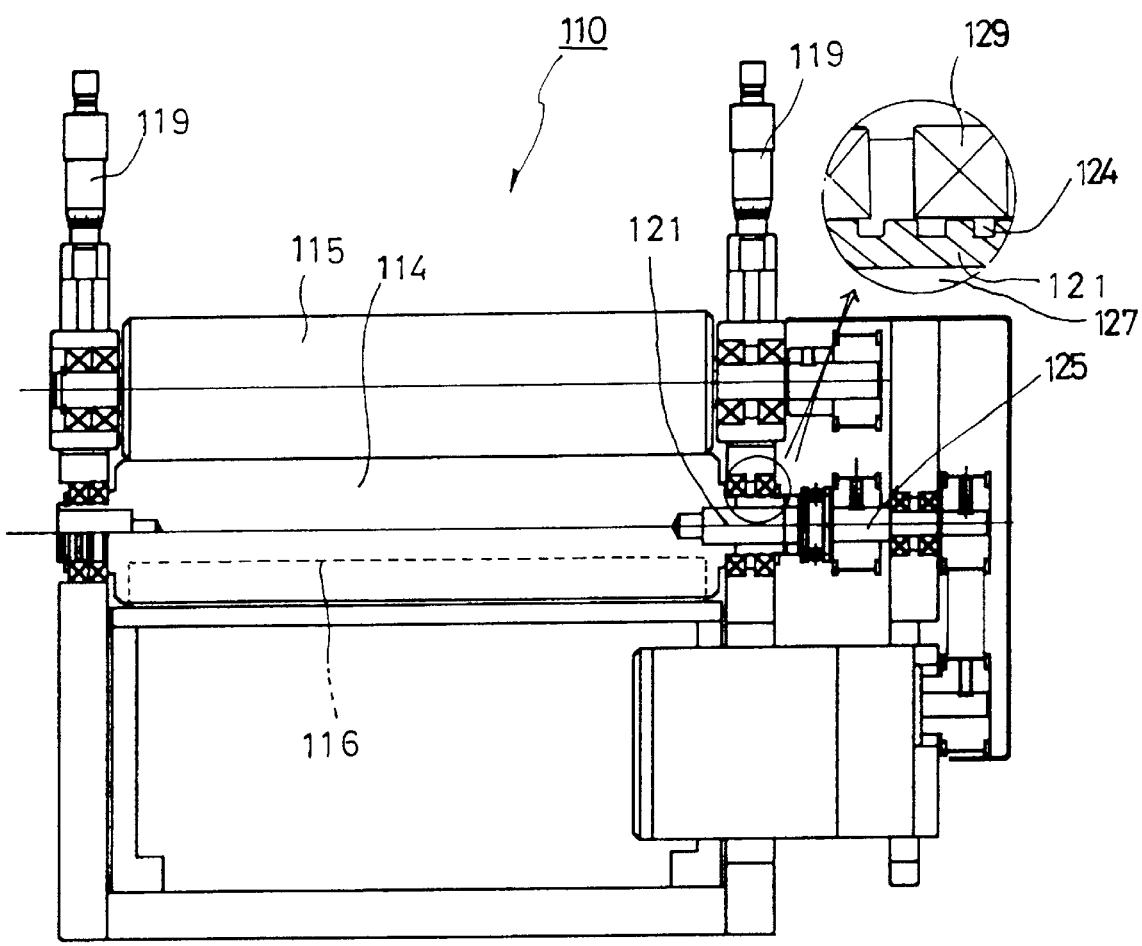

FIGS. 11A and 11B are a front view and a side view respectively illustrating the adhesive layer forming assembly 110 adapted to carry out the processing step for preparing a circuit pattern tape 10 and an elastomeric adhesive tape 35 (FIG. 8A) and the processing step for bonding the prepared circuit pattern tape 10 and elastomeric adhesive tape 35 to each other, thereby forming an adhesive layer-carrying circuit pattern tape 50 (FIG. 8B). For the simplicity of description, the following description will be made in conjunction with both FIGS. 11A and 12B.

The adhesive layer forming assembly 110 includes an inlet guide plate 111 arranged at one side of the adhesive layer forming assembly 110, and an outlet guide plate 112 arranged at the other side of the adhesive layer forming assembly 110. A pair of vertically spaced rollers, that is, a drive roller 114 and a pressing roller 115, are arranged between the inlet and outlet guide plates 111 and 112. The drive roller 114 is driven by a motor 114a. The drive roller 112 is in contact with a heater 116 at its surface so that it is heated by heat transferred from the heater 116 thereto. A feeding roller 117 and an assistant roller 118 are arranged at the inlet guide plate 111 adjacent to the drive roller 113 and pressing roller 115 so that they guide and feed the circuit pattern tape 10 and elastomeric adhesive tape 35 to a nip defined between the drive roller 114 and press roller 115. A nip press plate 113 is disposed at an intermediate position between the assistant roller 117 and press roller 115 in order to allow the circuit pattern tape 10 and elastomeric adhesive tape 35 to move along their accurate travel paths, respectively.

The bonding of the circuit pattern tape 10 and elastomeric adhesive tape 35 is carried out as follows. That is, the upper release film 37 is first removed from the elastomeric adhesive tape 35, which consists of the adhesive layer 8 and the upper and lower release films 37 and 38 respectively attached to the upper and lower surfaces of the adhesive layer 8, so that the adhesive layer 8 of the elastomeric adhesive tape 35 is exposed at its upper surface. The circuit pattern tape 10 is laid on the exposed surface of the adhesive layer 8 and then forced to pass between the drive roller 114 and press roller 115. As a result, the circuit pattern tape 10 is bonded to the elastomeric adhesive tape 35 by virtue of heat and pressure generated between the drive roller 114 and press roller 115, thereby forming an adhesive layer-carrying circuit pattern tape 50. The nip, that is, a gap defined between the drive roller 114 and press roller 115, can be finely adjusted using a micro adjustment member 119 installed above the press roller 115.

The drive roller 114 is maintained at a temperature of about 90 C. or slightly more than 90 C. at its surface by the heater 116. By virtue of this heat, the adhesive layer 8 of the elastomeric adhesive tape 35 is activated. However, it is important to maintain the above mentioned temperature of the drive roller 114 for a short period of time. Where the driver roller 114 is maintained at the above mentioned temperature for a lengthened period of time, a degeneration of the adhesive layer 8 or a variation in the dimensions of the tapes 10 and 35 may occur. In the latter case, a reduction in durability may also occur in the constituting members of the adhesive layer forming assembly 110. To this end, peripheral grooves 124 are formed at the surface of a support shaft 121 for the drive roller 114 in order to minimize the phenomenon that the heat transmitted to the drive roller is transferred to other members of the adhesive layer forming assembly 110. For the same purpose, the support shaft 121 has a hollow structure defined with a space 127 therein.

Figure 12:
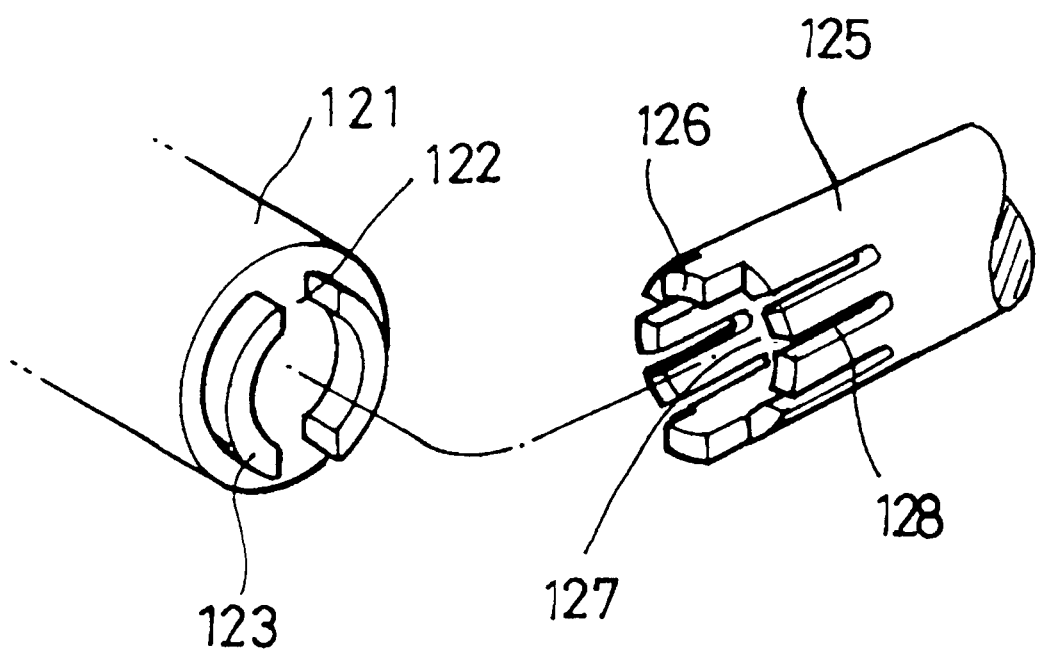
FIG. 12 is a partial perspective view illustrating a coupling shaft structure adapted to reduce heat transfer conducted via a drive roller shown in FIGS. 11A and 11B.

FIG. 12 is a perspective view partially illustrating a coupling shaft structure adapted to reduce the heat transfer conducted via the drive roller 114 shown in FIGS. 11A and 11B. A pair of circumferentially spaced semicircular protrusions 123 are protruded from a connecting end of the support shaft 121 for the drive roller 114. A pair of grooves 122 are defined between the semicircular protrusions 123. A connecting shaft 125, which is coupled to the support shaft 121, has a pair of protrusions 126 respectively adapted to be engaged with the grooves 122 of the support shaft 121. The connecting shaft 124 has a hollow structure at its connecting end to be coupled to the support shaft 121, thereby defining a recess 127 therein. The connecting shaft 124 is also provided at its connecting end with a plurality of spaced longitudinal slits 128. By virtue of such a structure, the contact area defined between the support shaft 121 and connecting shaft 125 after the connection of those shafts is minimized whereas the surface area of those shafts is increased. Accordingly, it is possible to prevent the heat from the heater 116 from being easily transferred to the connecting shaft 125 via the support shaft 121 of the drive roller 114 and to easily discharge heat transferred to the connecting shaft 125.

Figure 13:
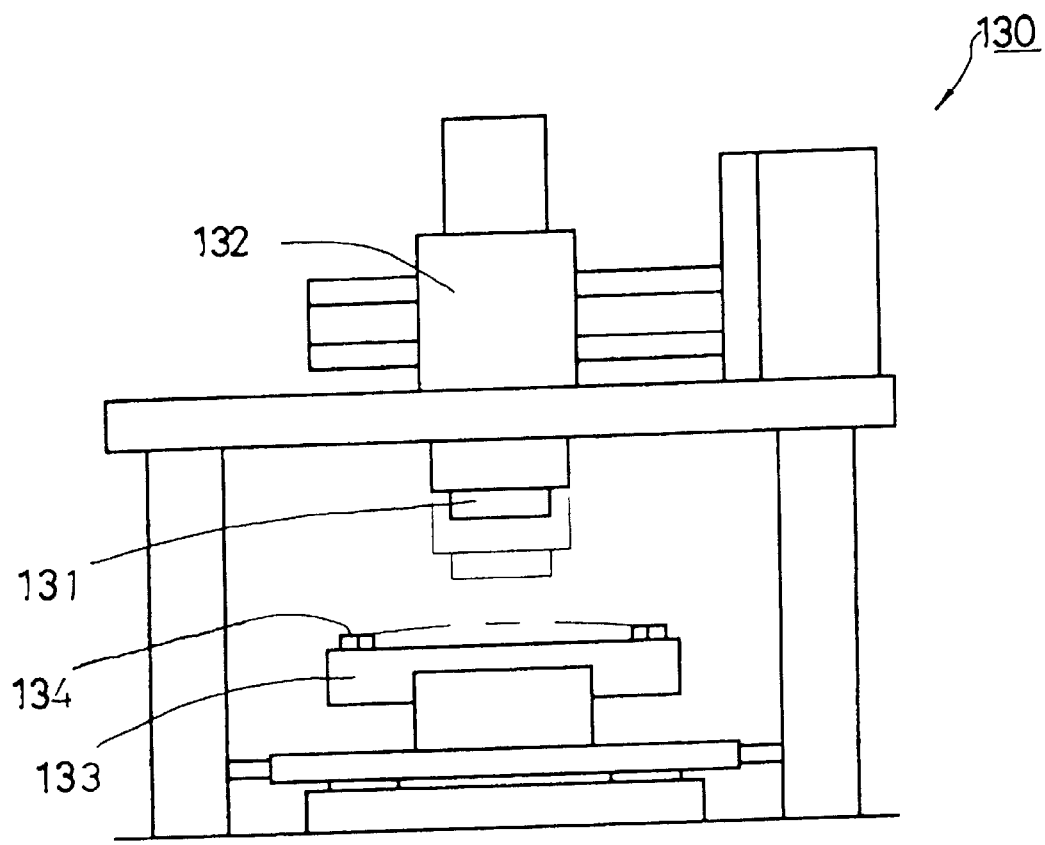
FIG. 13 is a schematic front view illustrating a punching press assembly adapted to carry out an opening forming step for forming wire bonding openings through the circuit pattern tape attached with the elastomeric adhesive tape, in the lamination method of the present invention.

FIG. 13 is a schematic front view illustrating the punching press assembly 130 adapted to carry out the opening forming step (FIG. 8C) for forming openings 16 through the circuit pattern tape 10 attached with the elastomeric adhesive tape 35. As shown in FIG. 13, the punching press assembly 130 includes a punch 131 driven by a drive unit 132, and a die 133 having fixing members 134.

Figure 14:
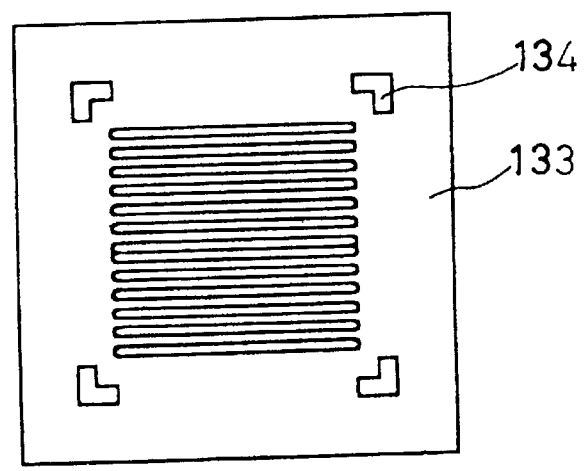
FIG. 14 is a schematic plan view illustrating a die of the punching press assembly shown in FIG. 13.
Figure 15B:
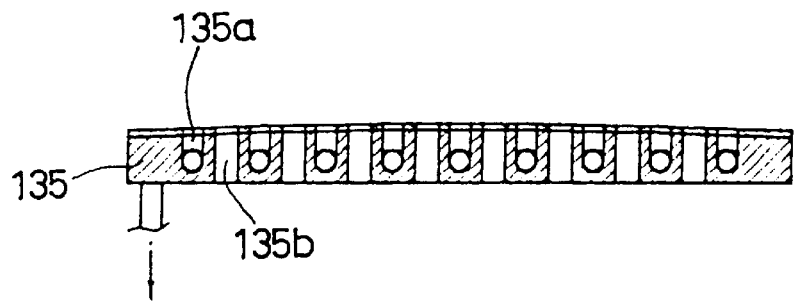
FIGS. 15A and 15B are a perspective view and a cross-sectional view respectively illustrating a sucking plate mounted to the die of the punching press assembly.
Figure 15A:
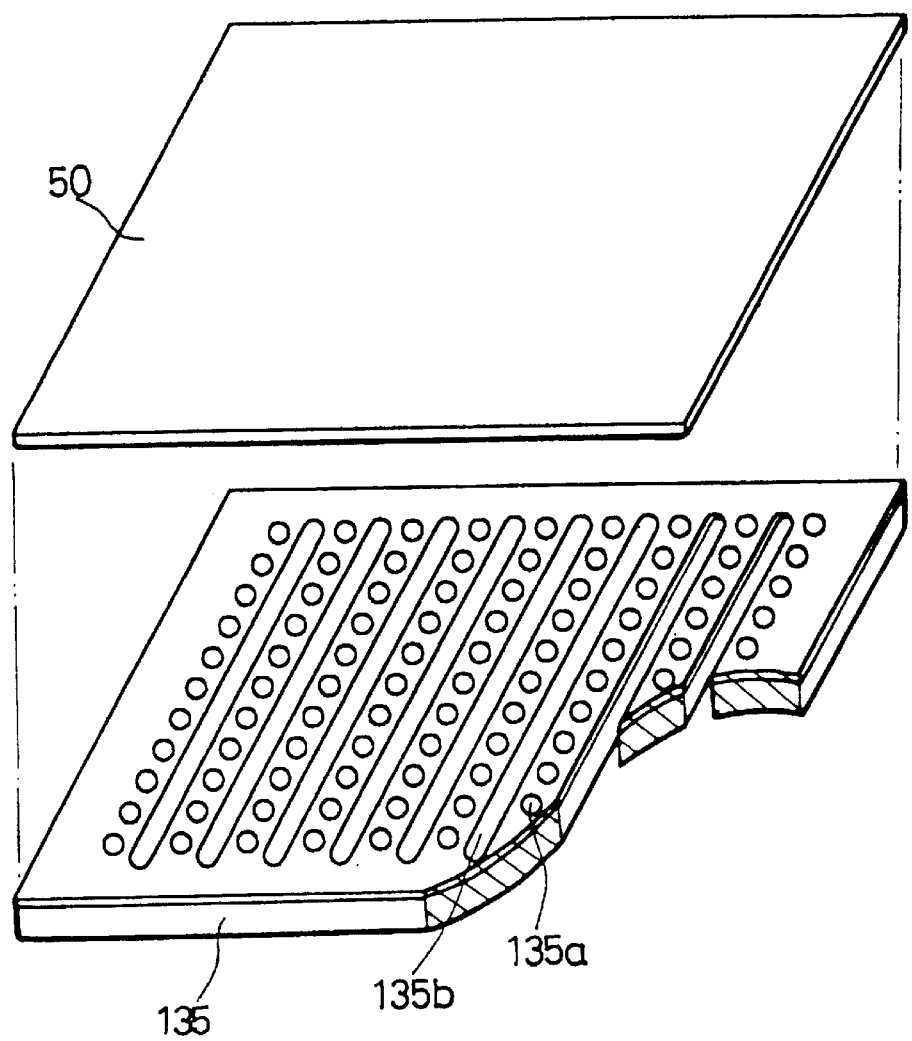

FIG. 14 is a schematic plan view illustrating the die 133 of the punching press assembly 130 shown in FIG. 13. On the other hand, FIGS. 15A and 15B are a perspective view and a cross-sectional view respectively illustrating a sucking plate 135 mounted to the die 133 of the punching press assembly 130. The sucking plate 135 is firmly mounted to the die 133 by means of the fixing members 134. A plurality of parallel slots 135b is formed through the sucking plate 135 in order to selectively receive the punching edge of the punch 131 being downwardly moved by the drive unit 132 to punch an opening 16. A vacuum hole row including a plurality of vacuum holes 135a is arranged between adjacent slots 135b. By virtue of a pressure reduction sucking effect exhibited at the vacuum holes 135a, the adhesive layer-carrying circuit pattern tape 50 is firmly held on the sucking plate 135 in a sucked state without sliding or being shifted. The sucking plate 135 has a smooth surface at its lower surface so that it can be in close contact with the die 133. However, the sucking plate 135 is centrally curved at its upper surface to have a slight convex shape, so that it maintains a uniform sucking force throughout its upper surface while enhancing the punching efficiency of the punch 131.

Figure 16:
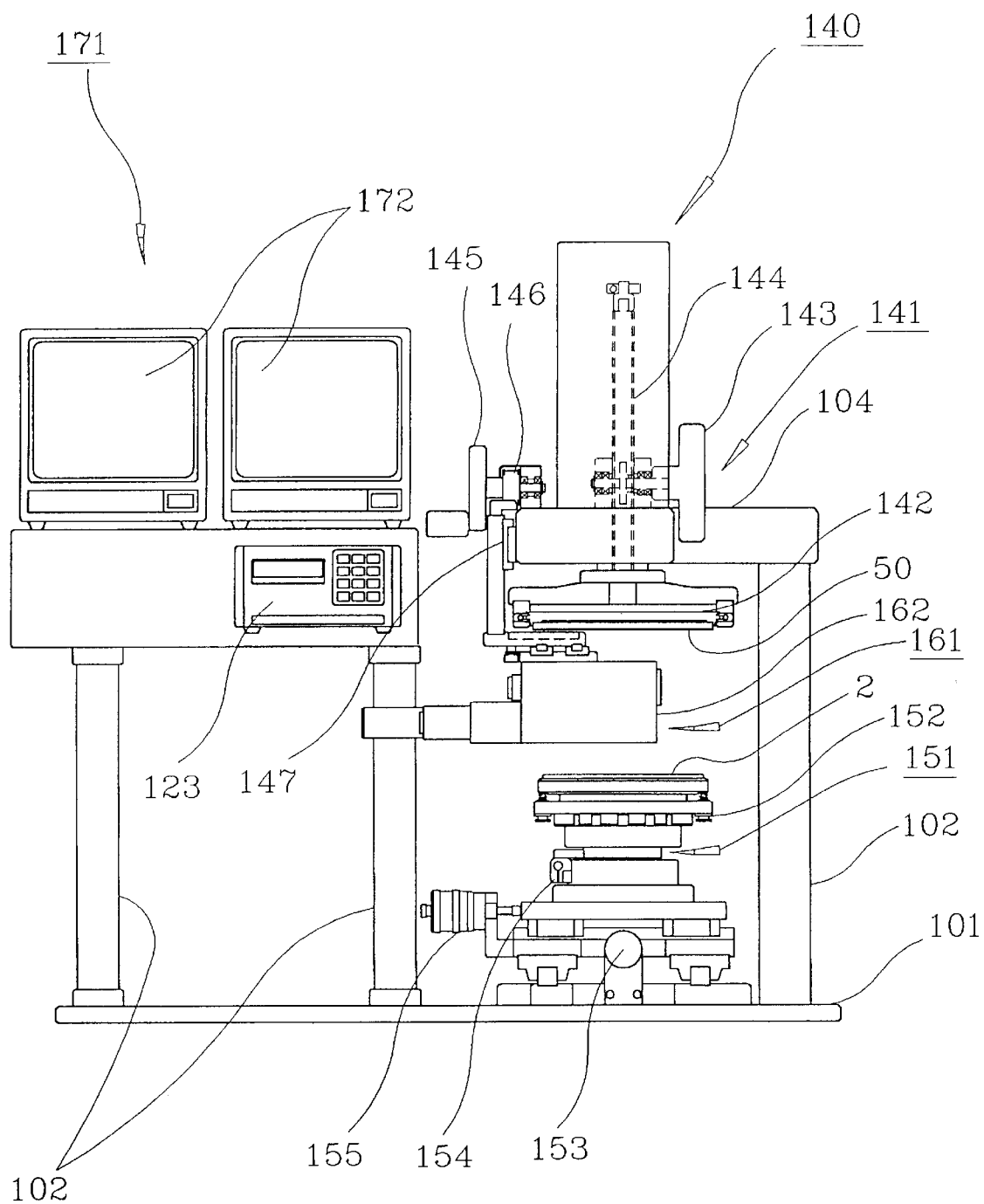
FIG. 16 is a front view illustrating a laminating assembly adapted to carry out the laminating step for bonding the circuit pattern tape attached with the elastomeric adhesive tape, to an accurate position on the wafer.
Figure 17:
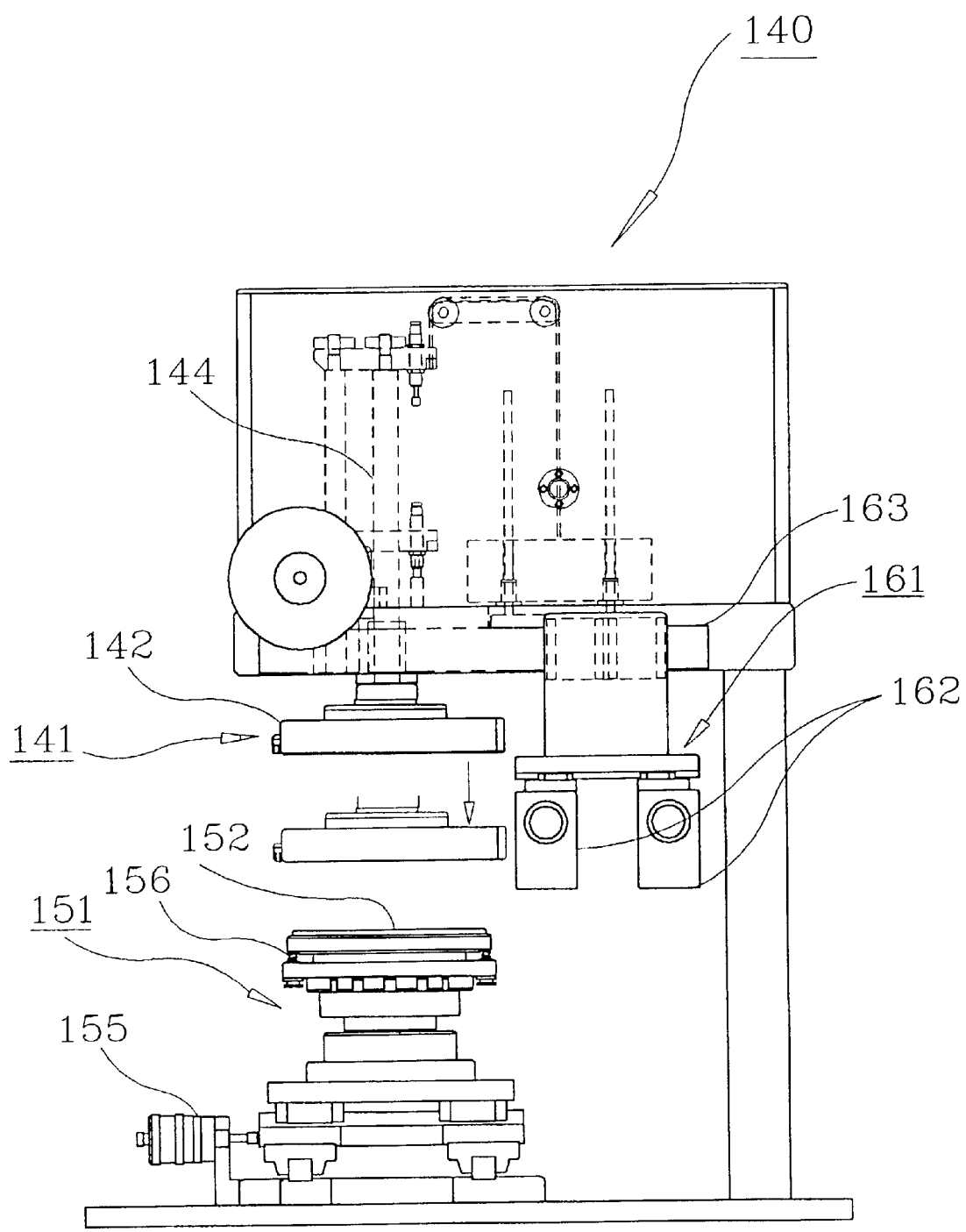
FIG. 17 is a side view illustrating an operation of the laminating assembly of FIG. 16.

FIG. 16 is a front view illustrating the laminating assembly 140 adapted to carry out the laminating step (FIG. 8E) for bonding the circuit pattern tape 10, attached with the elastomeric adhesive tape 35, to the wafer 2 while maintaining an accuracy in position and orientation. FIG. 17 is a side view illustrating the operation of the laminating assembly 140 shown in FIG. 16. For the simplicity of description, the following description will be made in conjunction with both FIGS. 16 and 17.

The laminating assembly 140, which is adapted to carry out the lamination method of the present invention, includes the circuit pattern tape sucking/feeding assembly 141 mounted to a support plate 104, supported by a vertical support frame 102 on a base 101 in parallel to the base 101, in such a fashion that it can move in a lateral direction (an X-axis direction) and a vertical direction (a Z-axis direction) , the wafer sucking/holding assembly 151 fixedly mounted on the base 101, the visual detecting assembly 161 supported by the vertical support frame 102 in parallel to the base 101, and the monitoring assembly 171 supported by the vertical support frame 102. Now, the entire configuration and operational relationship of the laminating assembly 140 will be described in brief.

The circuit pattern tape sucking/feeding assembly 141 includes a sucking tool 142 for sucking an adhesive layer-carrying circuit pattern tape 50, and a sucking tool moving unit (denoted by no reference numeral). The sucking tool moving unit has an X-axis moving handle 145 for moving the sucking tool 142 along an X-axis rail 147 by means of a belt 146, and a Z-axis moving handle 143 for moving the sucking tool 142 in a Z-axis direction along a rack 144.

The wafer sucking/holding assembly 151 is arranged beneath the circuit pattern tape sucking/feeding assembly 141. This wafer sucking/holding assembly 151 includes a wafer sucking/holding die 152, on which a wafer 2 to be laminated with the adhesive layer-carrying circuit pattern tape 50 is laid and held, and a position correcting means for correcting the position and orientation of the wafer/sucking/holding die 152 to achieve a lamination process while maintaining an accuracy in position and orientation. The position correcting means comprises a micrometer 153 for X-axis movement, a micrometer 155 for Y-axis movement, and a micrometer 154 for adjustment of $\Theta_z$. Here, "adjustment of $\Theta_z$" means a variation in the azimuth angle $\Theta_z$, that is, an angular rotation in a horizontal, XY plane. A damper 156 is installed beneath the die 152 to absorb impact applied to the die 152 when the sucking tool 142 is downwardly moved and pressed against the die 152.

The visual detecting assembly 161 includes at least one visual detector 162 such as a camera, and a moving unit 163 for moving the visual detector 612 in a longitudinal direction (a Y-axis direction). The visual detecting assembly 161 simultaneously scans the reference position of the adhesive layer-carrying circuit pattern tape 50 sucked onto the sucking tool 142 and the reference position of the wafer 2 laid on the die 152, thereby detecting those reference positions.

The monitoring assembly 171 includes a monitor 172 for displaying data (for example, image data) outputted from the visual detecting assembly 161, as a result of its detection operation, on a screen, and a manipulating panel 173 for setting various commands or conditions in accordance with a manipulation of the operator. The monitor 172 may have functions for conducting a comparison of the detection data outputted from the visual and detecting assembly 161 and outputting the result of the comparison.

Figure 18A:
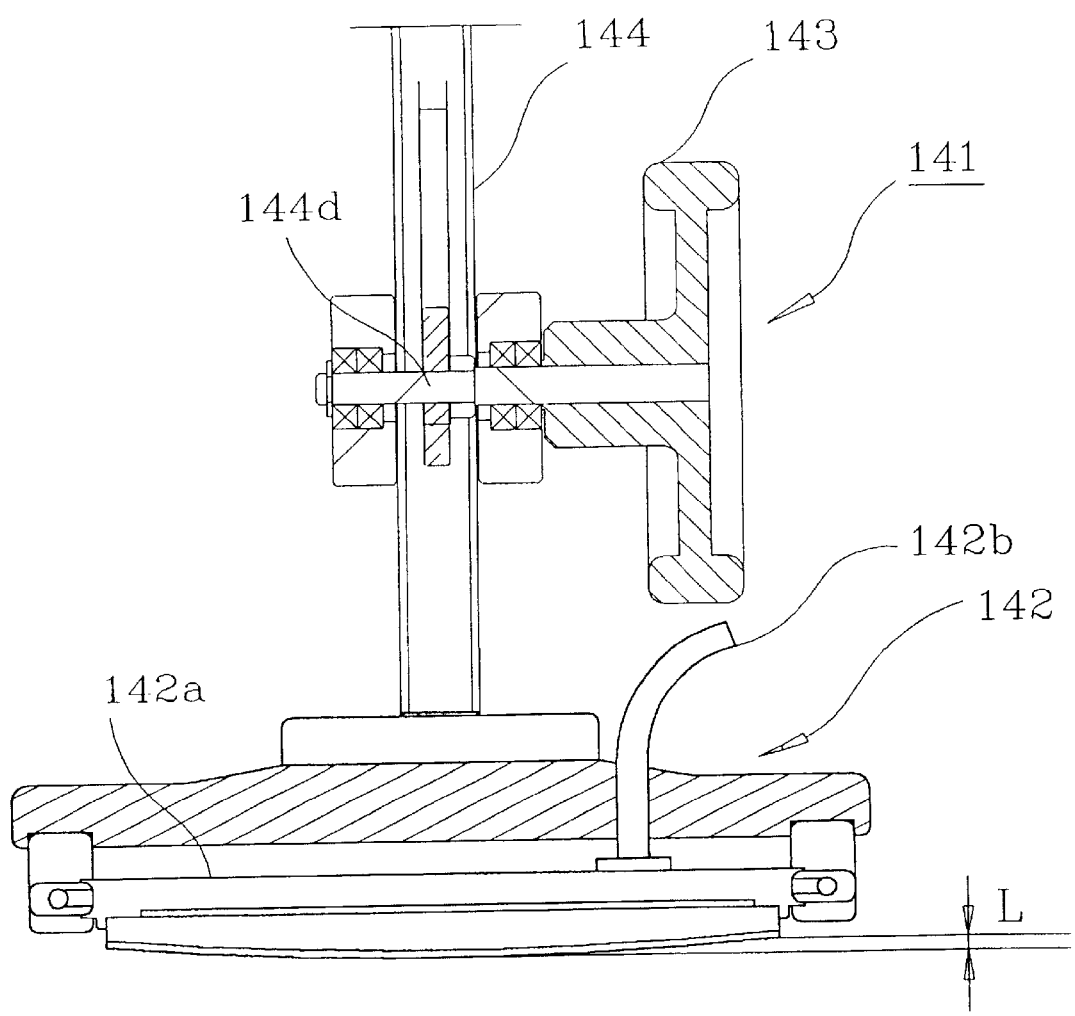
FIG. 18A is a cross-sectional view illustrating a sucking tool of the laminating assembly.
Figure 18B:
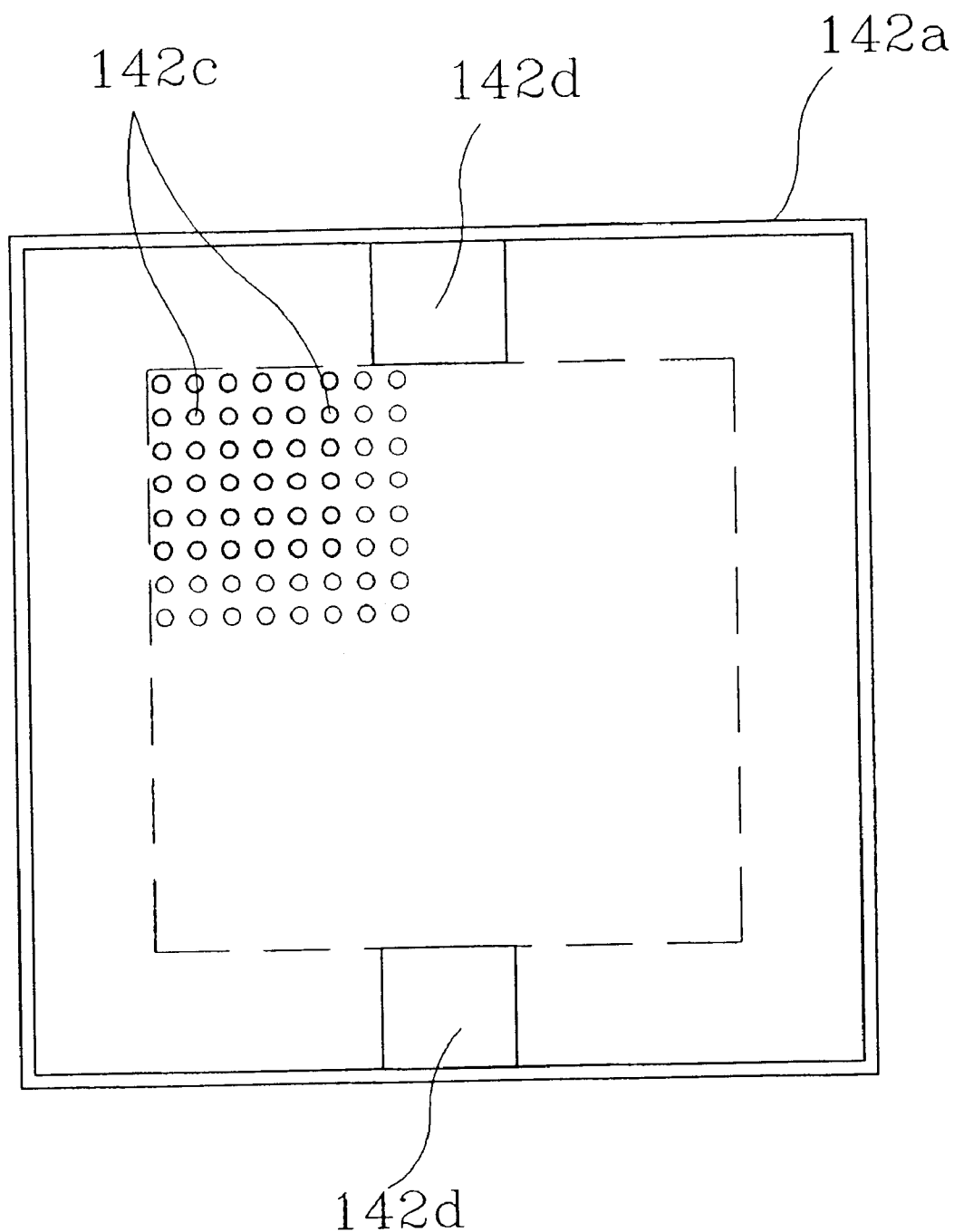
FIG. 18B is a plan view illustrating a sucking disc mounted to the sucking tool of FIG. 18A.
Figure 19:
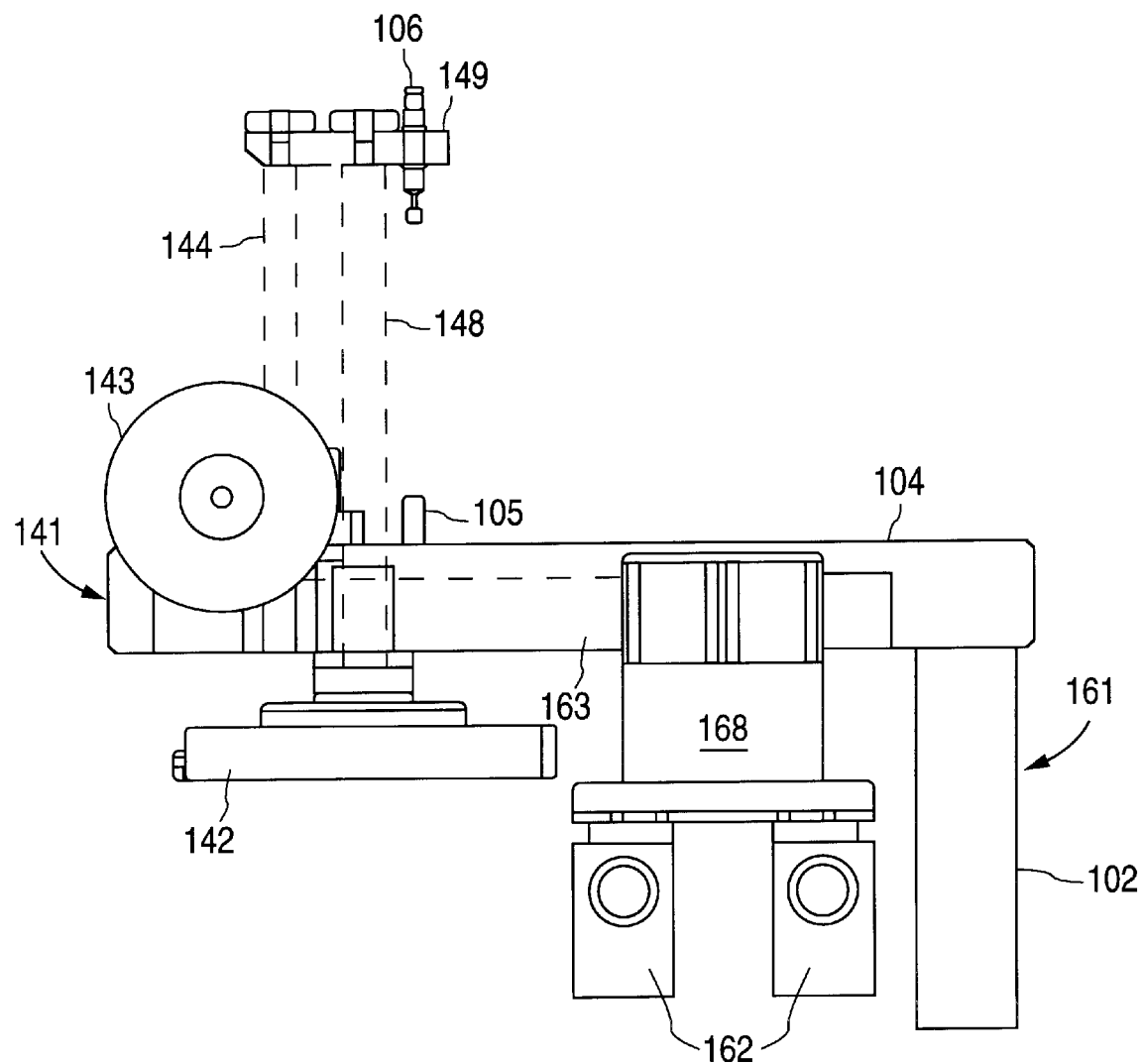
FIG. 19 is a side view illustrating a feeding assembly of the sucking tool of FIG. 18A.

FIG. 18A is a cross-sectional view illustrating the sucking tool 142 of the laminating assembly 140. FIG. 18B is a plan view illustrating a sucking disc 142a mounted to the sucking tool 142 of FIG. 18A. FIG. 19 is a side view of the circuit pattern tape sucking/feeding assembly 141 shown in FIG. 18A. For the simplicity of description, the following description will be made simultaneously in conjunction with FIGS. 18A, 18B, and 19.

The sucking disc 142a, which is mounted to the lower surface of the sucking tool 142, serves to suck the adhesive layer-carrying circuit pattern tape 50 in accordance with a pressure reducing effect applied thereto. This sucking disc 142a has a lower surface slightly downwardly protruded at its central portion in such a fashion that there is a level difference L between the central and peripheral portions thereof. Accordingly, the circuit pattern tape 50 sucked onto the sucking disc 142a comes into contact with the wafer 2, firmly held on the wafer sucking/holding die 152 of the wafer sucking/holding assembly 151, starting from its central portion, when it is laminated over the wafer. Therefore, it is possible to effectively prevent the formation of voids, that is, a phenomenon that air existing between the wafer 2 and circuit pattern tape 50 cannot be outwardly vented, so that it is trapped between the wafer 2 and circuit pattern tape 50. A plurality of vacuum holes 142c are provided at the sucking disc 142a in order to apply a reduced pressure or vacuum to the sucking disc 142a, thereby allowing the sucking disc 142 to suck the circuit pattern tape 50. All vacuum holes 142c communicate with a vacuum hose 142b. The sucking disc 142a also has at least one, preferably at least two, reference position identifying portion 142d in order to allow the visual detector 162 to accurately detect the position and orientation of the sucking disc 142a.

The sucking tool 142 is coupled to a connecting bracket 149 by means of a connecting bar 148. The rack 144 is also coupled to the connecting bracket 149. Accordingly, the connecting bar 148 and sucking tool 142 are operatively connected to the rack 144. The rack 144 is movable in a vertical direction (namely, a Z-axis direction) in accordance with the rotation of a pinion 144a mounted to a handle shaft of the Z-axis moving handle 143.

A switch pusher 106 is also coupled to the connecting bracket 149. A limit switch 105 is installed on the support plate 104 over the sucking tool 142. The limit switch 105 serves to output an electrical signal when it comes into contact with the switch pusher 106 or it is depressed by the switch pusher 106 (that is, when the adhesive layer-carrying circuit pattern tape 50 comes into contact with the wafer in accordance with a sufficient downward movement of the sucking tool 142 so that it is laminated over the wafer. This operation will be subsequently described in detail.

The visual detecting assembly 161 shown in FIG. 19 will be described in the following description made in conjunction with FIG. 21.

Figure 20A:
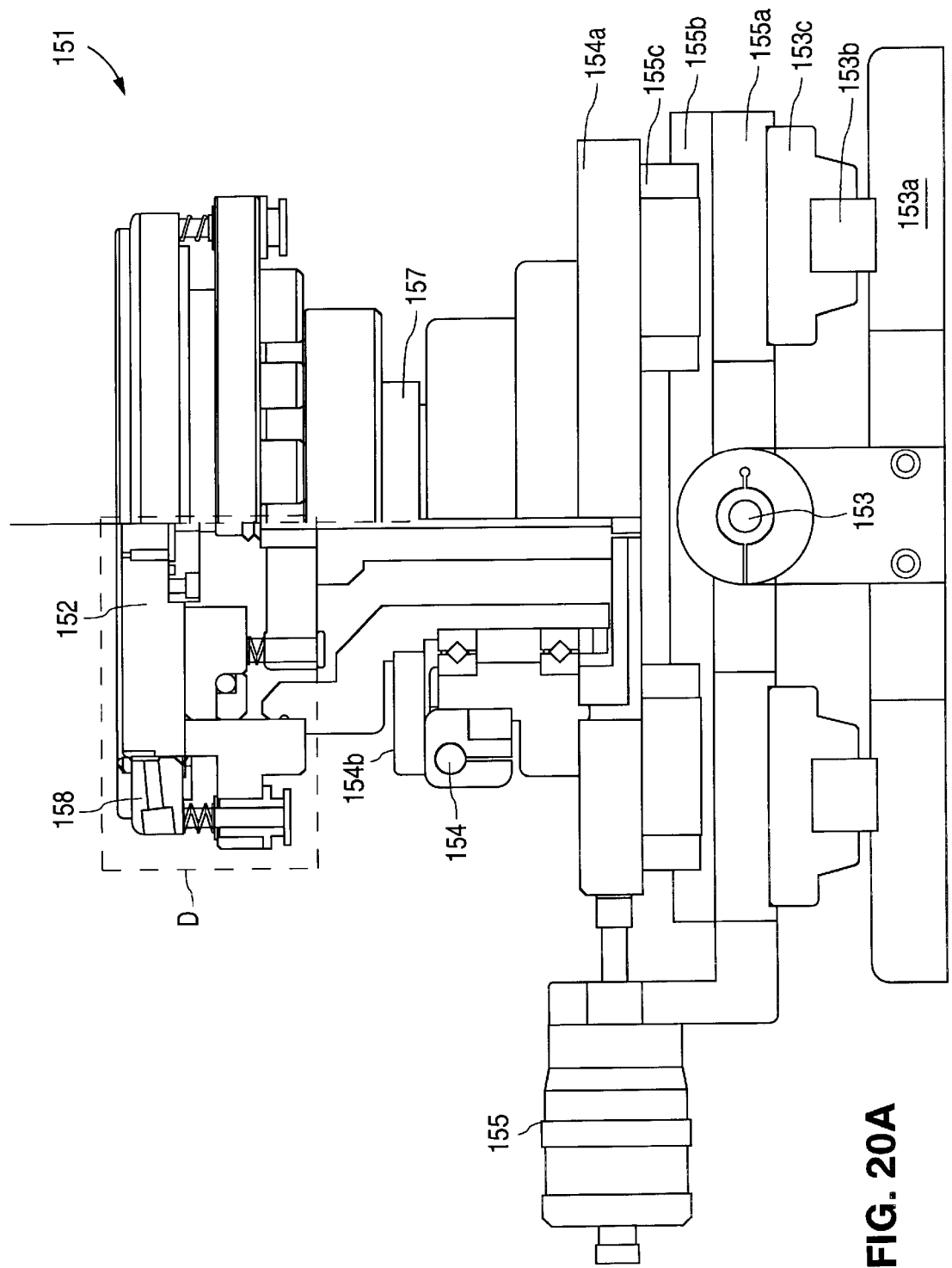
FIG. 20A is a front view illustrating a wafer holding die assembly included in the laminating assembly of FIG. 16.
Figure 20B:
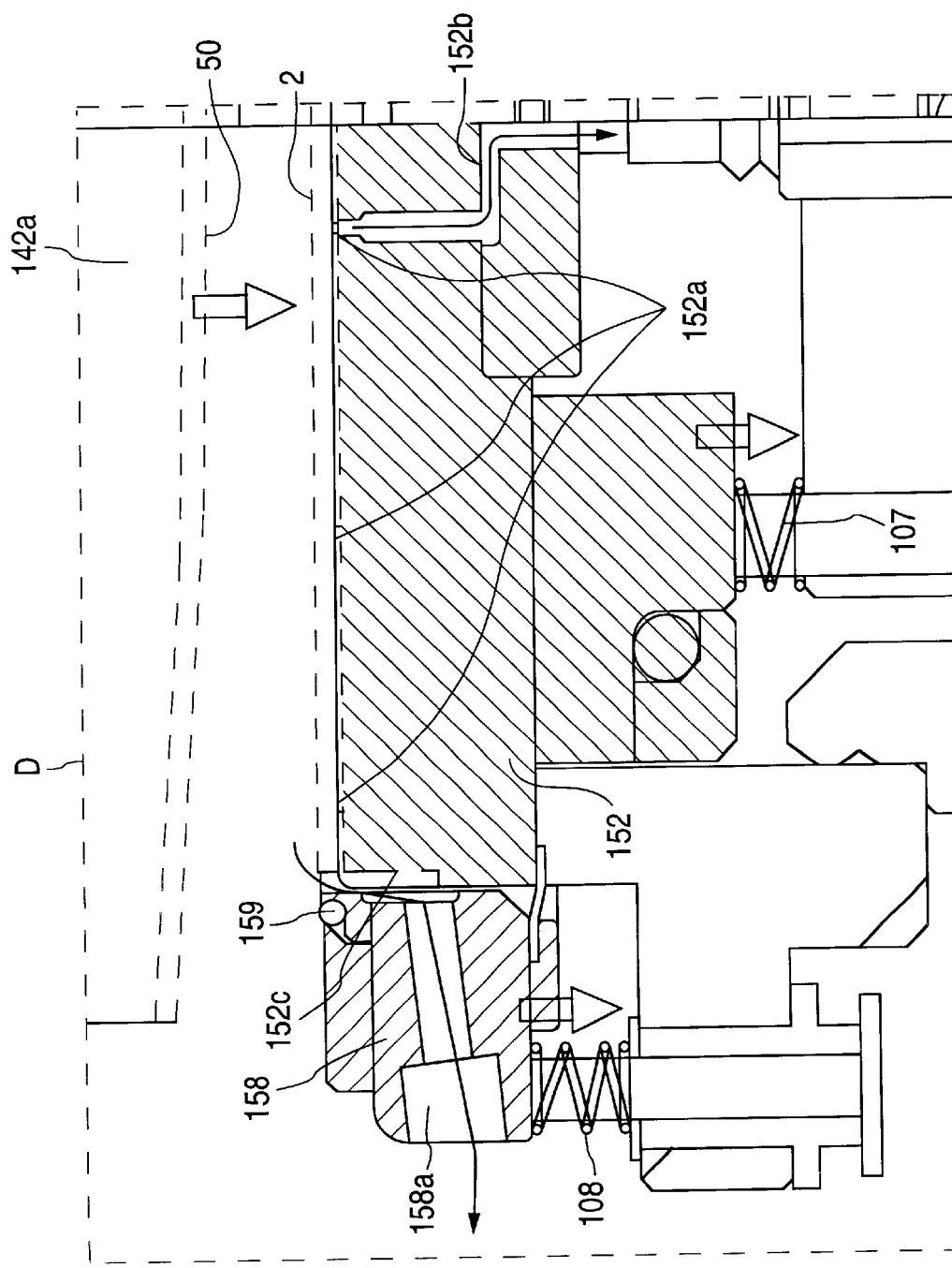
FIG. 20B is an enlarged view of a portion D in FIG. 20A.

FIG. 20A is a front view illustrating the wafer sucking/holding assembly 151 included in the laminating assembly 140 of FIG. 16. FIG. 20B is an enlarged view corresponding to a portion D of FIG. 20A. For the simplicity of description, the following description will be made in conjunction with both FIGS. 20A and 20B.

The wafer sucking/holding die 152 is provided with a plurality of sucking holes 152a in order to suck the wafer 2 by virtue of a pressure-reduction or vacuum sucking effect exhibited at the vacuum holes 152a. Each vacuum hole 152a communicates with a sucked air venting passage 152b for venting sucked air. A plurality of uniformly spaced vertical venting grooves 152c are formed along the peripheral edge of the die 152. An annular venting member 158 is arranged at one side of the die 152 in such a fashion that its internal venting passage 158a communicates with the venting grooves 152c of the die 152. By virtue of such a configuration, when the adhesive layer-carry circuit pattern tape 50 comes into contact with the wafer 2, starting from its central portion, air existing between the adhesive layer-carrying circuit pattern tape 50 and the wafer 2 can be easily outwardly vented. As a result, no void is formed. A rubber ring 159 is fitted around the venting member 158 in order to prevent air from being introduced between the circuit pattern tape 50 and wafer 2 at the peripheral edge of the wafer 2 during the lamination process. In FIG. 20B, the reference numeral 107 denotes a spring for absorbing impact generated when the wafer 2 is laid on the die 152. The reference numeral 108 denotes a spring for absorbing impact generated when the circuit pattern tape 50 is laminated over the wafer 2.

A die base 157 is arranged beneath the wafer sucking/holding die 152. Arranged beneath the die base 157 are the X-axis moving micrometer 153 for moving the die 152 in an X-axis direction, the Y-axis moving micrometer 155 for moving the die 152 in a Y-axis direction, and the $\Theta_z$-angle adjusting micrometer 154 for rotating the die 152 in the XY plane by an azimuth angle of $\Theta_z$.

This configuration will be described in more detail. An X-axis base 153a is installed on the base 101. An X-axis rail 153b is installed on the X-axis base 153a. An X-axis moving member 153c is engaged with the X-axis rail 153b in such a fashion that it slides along the X-axis rail 153b. When the X-axis moving micrometer 153 rotates, the X-axis moving member 153c moves along the X-axis rail 153b in an X-axis direction (namely, a lateral direction in FIG. 20A). As a result, the die 152 moves finely in the X-axis direction.

A Y-axis rail 155b is installed on a Y-axis base 155a mounted to the X-axis moving member 153c. A Y-axis moving member 155c is engaged with the Y-axis rail 155b in such a fashion that it slides along the Y-axis rail 155b. When the Y-axis moving micrometer 155 rotates, the Y-axis moving member 155c moves along the Y-axis rail 155b in an Y-axis direction (namely, a longitudinal direction in FIG. 20A). As a result, the die 152 moves finely in the Y-axis direction. Since the Y-axis base 155a is mounted to the X-axis moving member 153c, it is also moved in an X-axis direction in accordance with an adjustment of the X-axis moving micrometer 153. On the other hand, a $\Theta_z$-angle rotating base 154a is mounted to the Y-axis moving member 155c. Accordingly, the $\Theta_z$-angle rotating base 154a is moved in a Y-axis direction in accordance with an adjustment of the Y-axis moving micrometer 155.

A Z-axis rotating rod 154b is coupled to the $\Theta_z$-angle rotating base 154a at one side thereof. Accordingly, when the $\Theta_z$-angle adjusting micrometer 154 rotates, the Z-axis rotating rod 154b rotates by an angle of $\Theta_z$. As a result, the $\Theta_z$-angle rotating base 154a also rotates by the angle of $\Theta_z$. This results in a rotation of the die 152 by the angle of $\Theta_z$.

In the laminating process for laminating the adhesive layer-carrying circuit pattern tape 50 over the wafer, as mentioned above, the circuit pattern tape sucking step is first carried out by the circuit pattern tape sucking/feeding assembly 141 in which the adhesive layer-carrying circuit pattern tape 50, from which its lower release film 38 has been removed, is sucked onto the sucking tool 142. Separately from this circuit pattern tape sucking step, the wafer sucking/holding step is also conducted by the wafer sucking/holding assembly 151 in which the wafer 2 is sucked and held on the die 152. Thereafter, the reference position detecting step is carried out by the visual detecting assembly 161 in which the reference positions of the circuit pattern tape 50 and wafer 2 are detected. The detection results outputted from the visual detecting assembly 161 are compared with each other by the monitoring assembly 171 which, in turn, determines whether or not the reference positions of the circuit pattern tape 50 and wafer 2 correspond to each other. When those reference positions correspond to each other, the sucking tool 142 is controlled to move downwardly so as to perform the laminating step. When the reference positions do not correspond to each other, the correcting step is conducted to shift the die 152 in an X and/or a Y-axis direction or by an angle of $\Theta_z$ until the reference positions correspond to each other. Thus, the lamination step is carried out only when the reference positions correspond to each other accurately.

When the sucking tool 142 of the circuit pattern tape sucking/feeding assembly 141 moves downwardly until the adhesive layer-carrying circuit pattern tape 50 comes into contact with the wafer 2, the switch pusher 106 comes into contact with the limit switch 105 and is depressed against the limit switch 105. As a result, the limit switch 105 generates an electrical signal for activating a vacuum pump (not shown). By virtue of the operation of the vacuum pump, an air sucking effect is generated in the venting passage 158a of the venting member 158 included in the wafer sucking/holding assembly 151.

Figure 21:
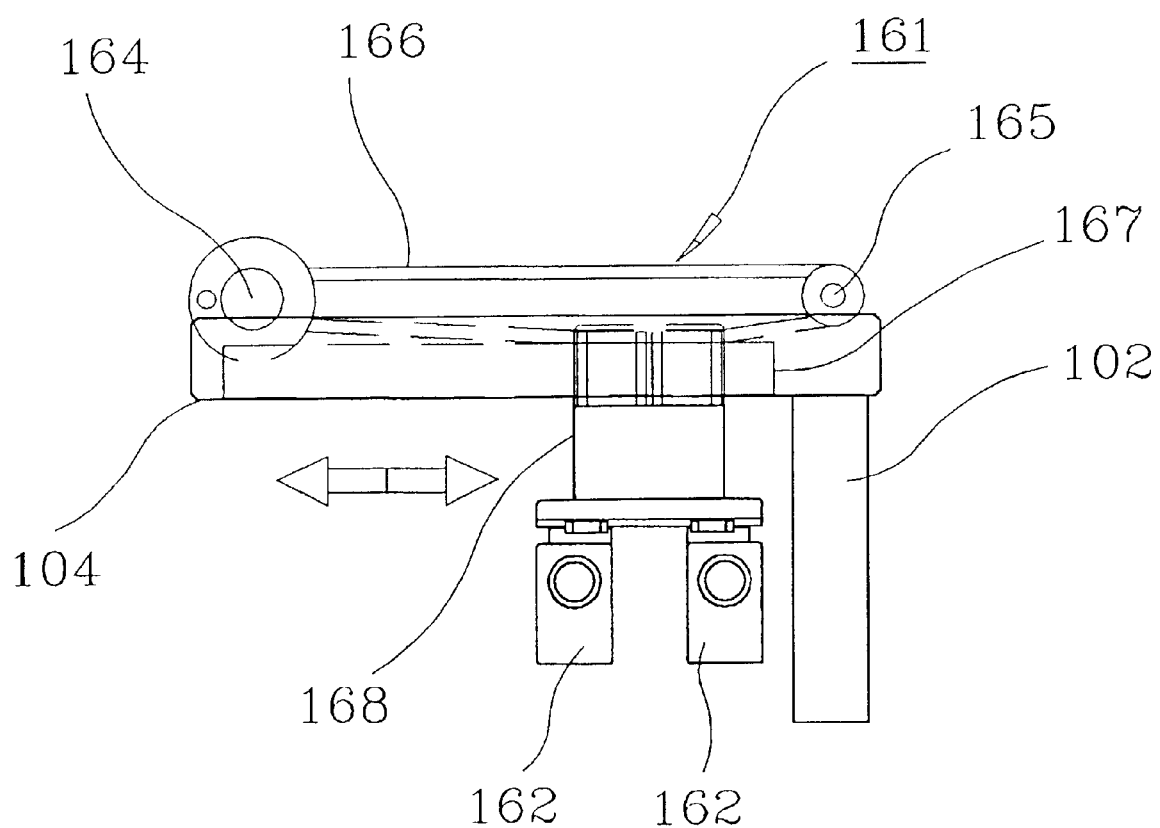
FIG. 21 is a side view illustrating an operation of a visual detector moving assembly included in the laminating assembly of FIG. 16.

FIG. 21 is a side view illustrating the operation of the visual detector moving assembly 161 included in the laminating assembly 140 of FIG. 16. As shown in FIG. 21, the visual detector moving assembly 161 includes at least two visual detectors 162 and a means for moving the visual detectors 162. In FIG. 21, the visual detector moving means is denoted by no reference numeral. Each of the visual detectors 162 may be a camera, an ultraviolet or infrared camera, or a sonicator. The visual detectors 162 can simultaneously scan both the reference position of the adhesive layer-carrying circuit pattern tape 50 disposed thereover and the reference position of the wafer 2 disposed therebeneath.

The visual detectors 162 may be cameras having low and high magnifications, respectively. In this case, it is possible to scan the reference positions of the circuit pattern tape 50 and wafer 2 in a double fashion, so that the scan results can be compared to each other. Accordingly, it is possible to obtain a more accurate determination in terms of the reference position and orientation. The scan results such as scanned images are outputted through the monitor 172 of the monitoring assembly 171, so that they can be visually identified by the operator. The scan results are also used as basic data for an accurate position and orientation correction. Using the scan results, it is also possible to identify whether or not the correction results are correct.

The visual detectors 162 are coupled to a belt 166 wound between a handle 164 and a belt pulley 165 by means of a support member 168 slidably engaged with the X-axis rail 167. In accordance with a rotation of the handle 164, the visual detector 162 are moved in an X-axis direction in FIG. 21 (corresponding to a Y-axis direction in FIG. 16).

Figure 22:
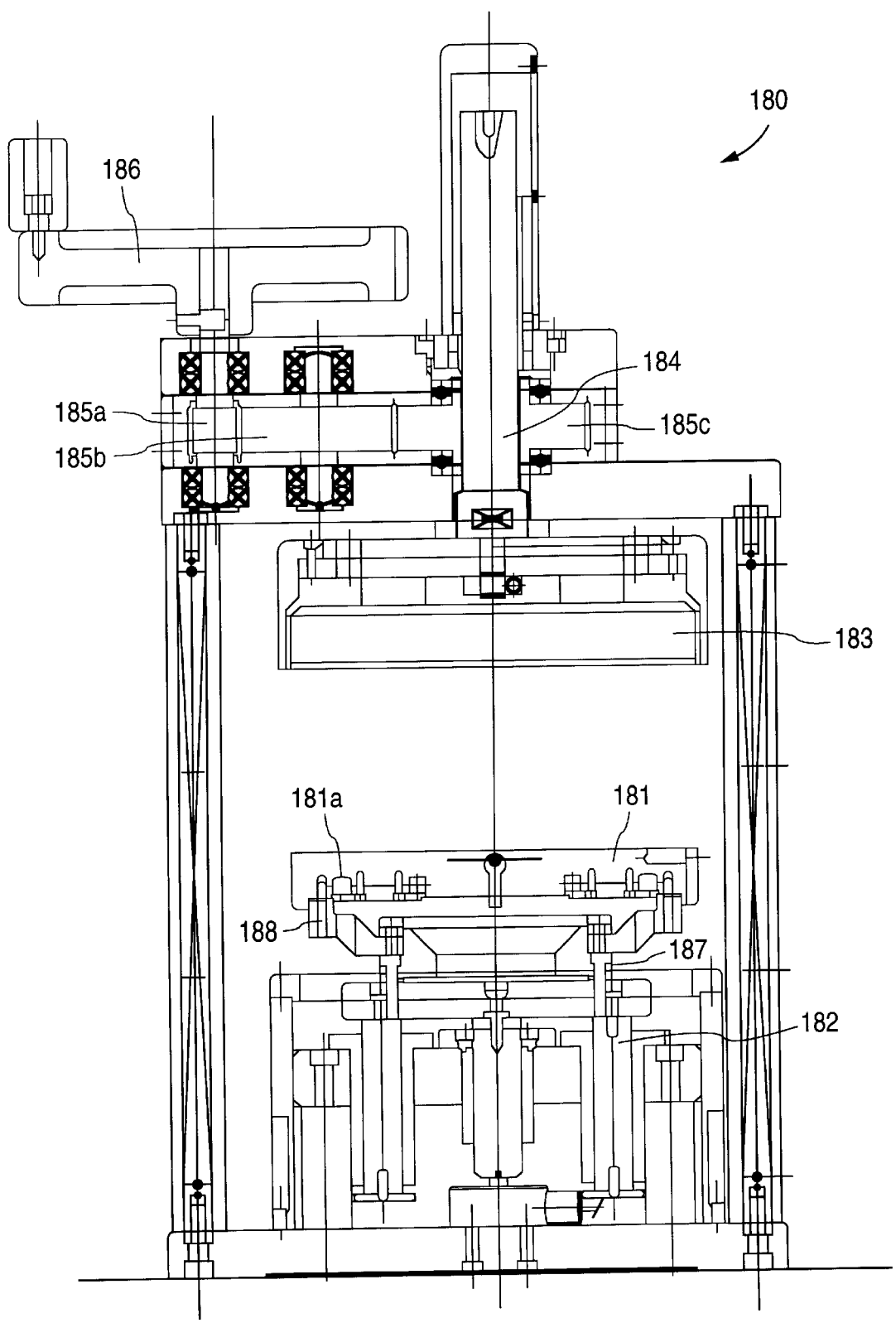
FIG. 22 is a front view illustrating a high-temperature press assembly adapted to be used in a curing step for curing the wafer laminated with the circuit pattern tape, in, the lamination method of the present invention.

FIG. 22 is a front view illustrating the high-temperature press assembly 180 adapted to be used in a curing step for curing the wafer 2 laminated with the circuit pattern tape 10 in accordance with the lamination method of the present invention. This high-temperature press assembly 180 includes a die 181, a heating means 181a for heating the die 181, a press plate 183, and a means for moving the press plate 183.

The die 181 of the high-temperature press assembly 180 is installed on a fixed frame 182 and adapted to lay the wafer 2, laminated with the circuit pattern tape 10, thereon. The heating means 181a, which may be a heater, is internally arranged in the die 181 in order to allow the wafer 2 to be pressed at a high temperature. The means for moving the press plate 183 comprises three gears 185a, 185b, 185c driven by a rotation of the handle 186, and a rack 184 moving vertically by virtue of rotations of the gears 185a, 185b, and 185c. The press plate 183 is operatively connected to the rack 184. In FIG. 22, the reference numeral 188 denotes a die support member. The reference numeral 187 denotes a spring-loaded damping member for generating a damping effect adapted to absorb impact generated when the die 181 is depressed by the press plate 183 moving downwardly.

Figure 23:
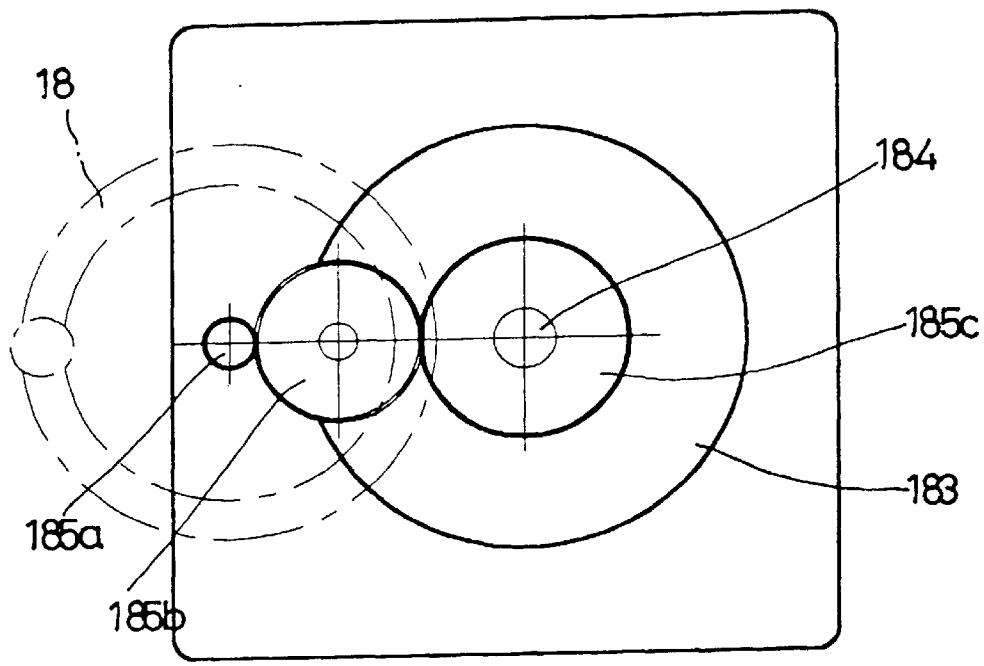
FIG. 23 is a schematic plan view illustrating an engagement state among first through third gear for moving a press plate of the high-temperature press assembly.

FIG. 23 is a plan view illustrating an engagement state among the gears 185a, 185b, and 185c rotating to move the press plate 183 of the high-temperature press assembly 180. The gears 185a, 185b, and 185c have diameters gradually increasing in this order, respectively, so that they provide a multi-stage gear assembly. By virtue of such a multi-stage gear assembly, the press plate 183 exhibits a relatively small movement in spite of a large amount of rotations of the handle 186. Accordingly, it is possible to achieve a precise manipulation.

Figure 24A:
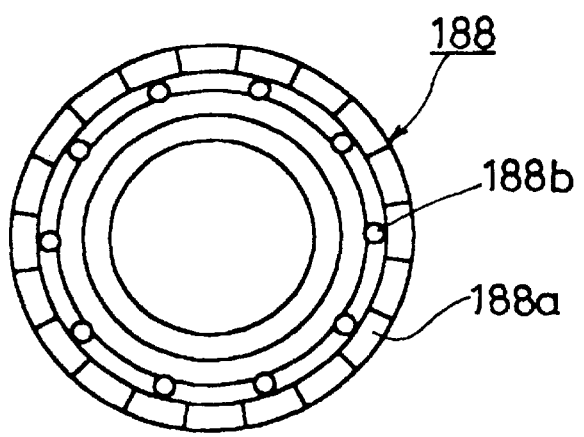
FIGS. 24A and 24B are a plan view and a cross-sectional view respectively illustrating a die support member having a heat transfer suppressing effect for the high-temperature press assembly.
Figure 24B:
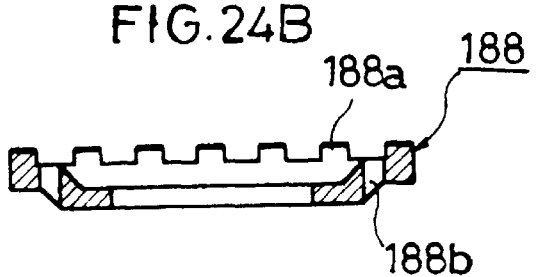

FIGS. 24A and 24B are a plan view and a cross-sectional view respectively illustrating the die support member 188 having a heat transfer suppressing effect. For the simplicity of description, the following description will be made in conjunction with both FIGS. 24A and 24B.

The die 181, which is heated to a temperature desired to cure the laminated wafer 2 by the heating means 181a received therein, is supported by the fixed frame 182 via the die support member 188 having a particular configuration for minimizing the transfer of the heat to other constituting elements.

The die support member 188 is provided at its upper peripheral portion with a plurality of protrusions 188a in order to minimize its area where it is in contact with the die 181. A plurality of holes 188b are also provided adjacent to the protrusions 188a.

Figure 25:
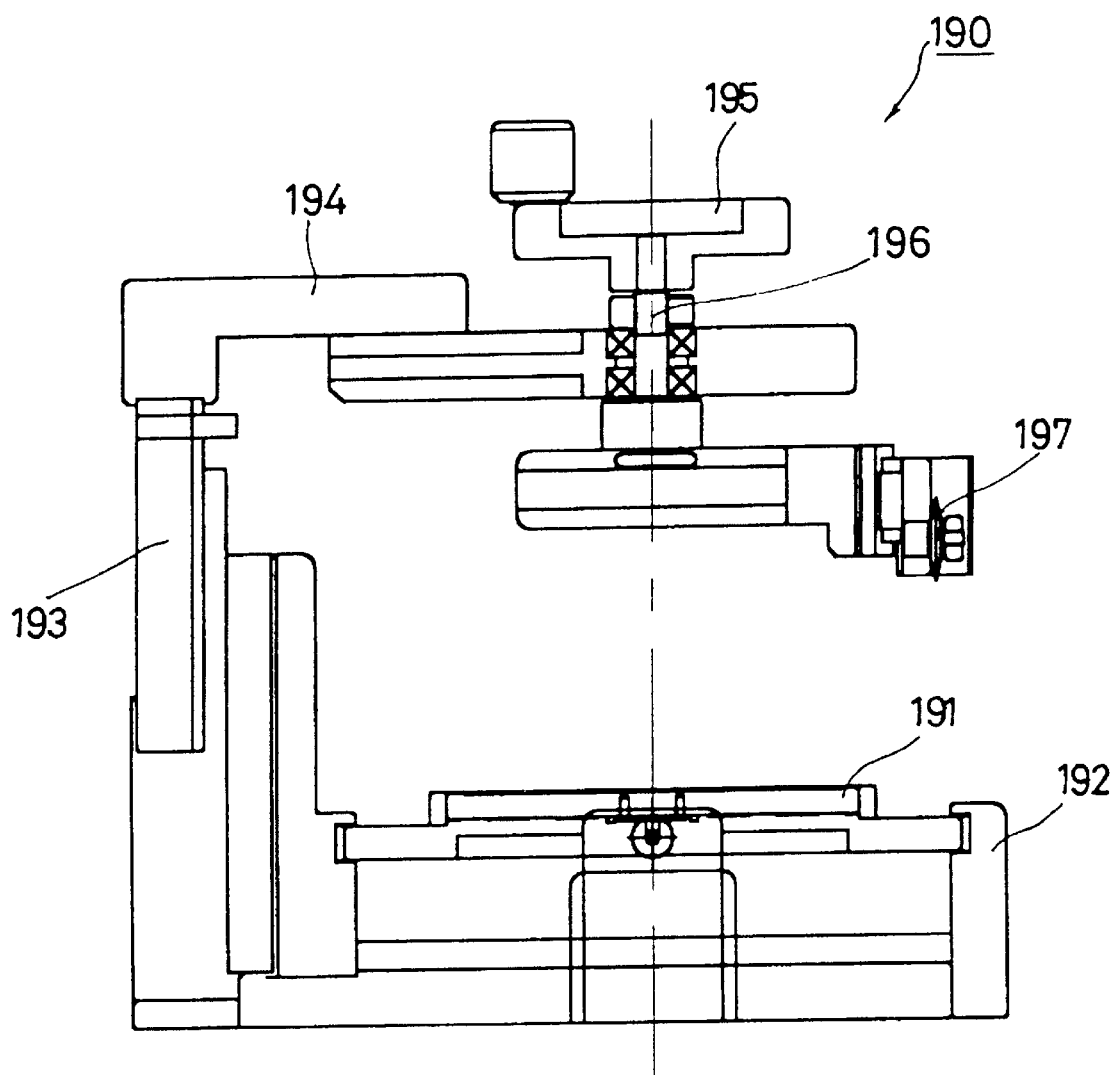
FIG. 25 is a front view illustrating a cutting assembly adapted to carry out a processing step for removing a peripheral portion of the circuit pattern tape arranged around the laminated wafer, in the lamination method of the present invention.

FIG. 25 is a front view illustrating the cutting assembly 190 adapted to carry out the processing step for removing the peripheral portion 10b of the circuit pattern tape 10 arranged around the laminated wafer 2. As shown in FIG. 25, the cutting assembly 190 includes a die 191, on which the wafer 2 laminated with the circuit pattern tape 10 is held by a holding member 192. The cutting assembly 190 also includes a cutting tool 197 mounted to a support member 194 fixedly mounted to one end of a vertically movable cylinder 193. The cutting tool 197 is rotated by a rotation of a handle 195 so that it carries out a cutting operation while rotating. In FIG. 25, the reference numeral 196 denotes a rotating shaft.

Figure 26:
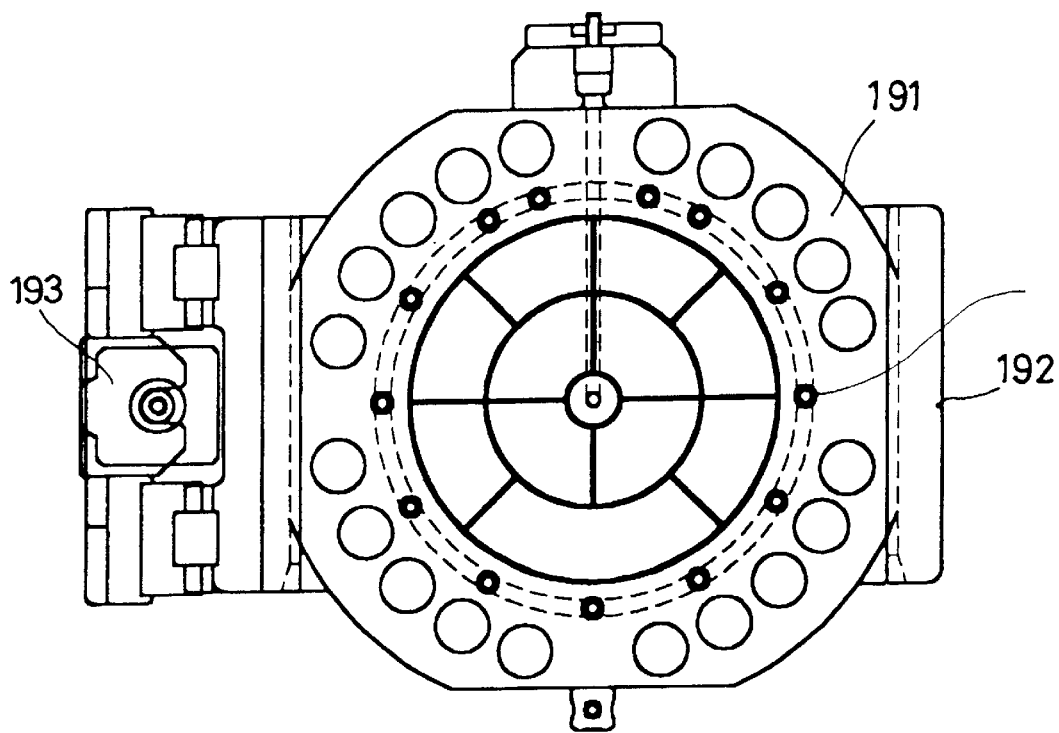
FIG. 26 is a plan view illustrating a die included in the cutting assembly of FIG. 25 to hold the wafer laminated with the circuit pattern tape.

FIG. 26 is a plan view illustrating the die 191 included in the cutting assembly 190 to hold the wafer laminated with the circuit pattern tape. As shown in FIG. 26, the die 191 is provided with a plurality of sucking holes 198 at its portion where the wafer 2 is laid. By virtue of the provision of the sucking holes 198, the wafer 2 is held on the die 191 in a sucked state.

Figure 27:
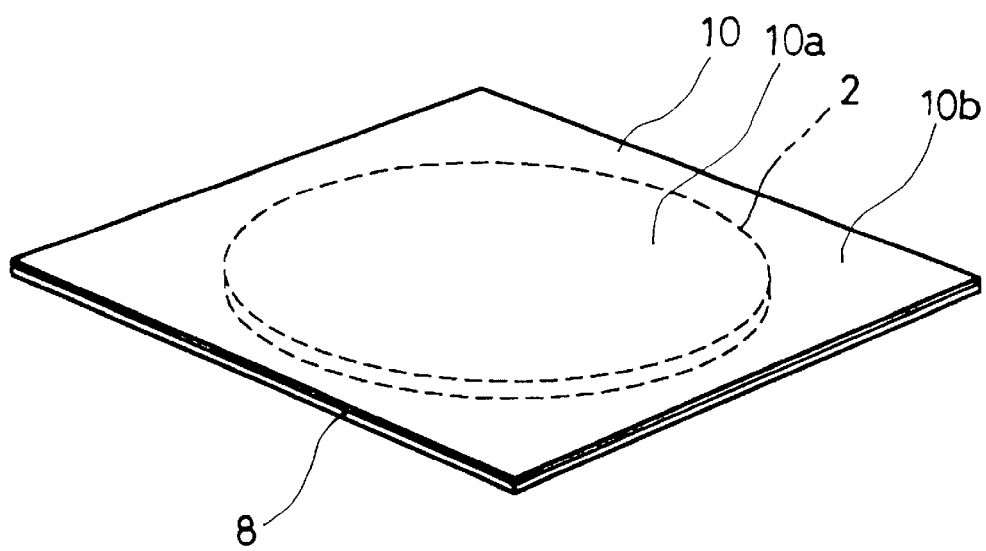
FIG. 27 is a schematic perspective view illustrating the circuit pattern-laminated wafer, from which the peripheral portion of the circuit pattern tape has not been removed yet.
Figure 28A:
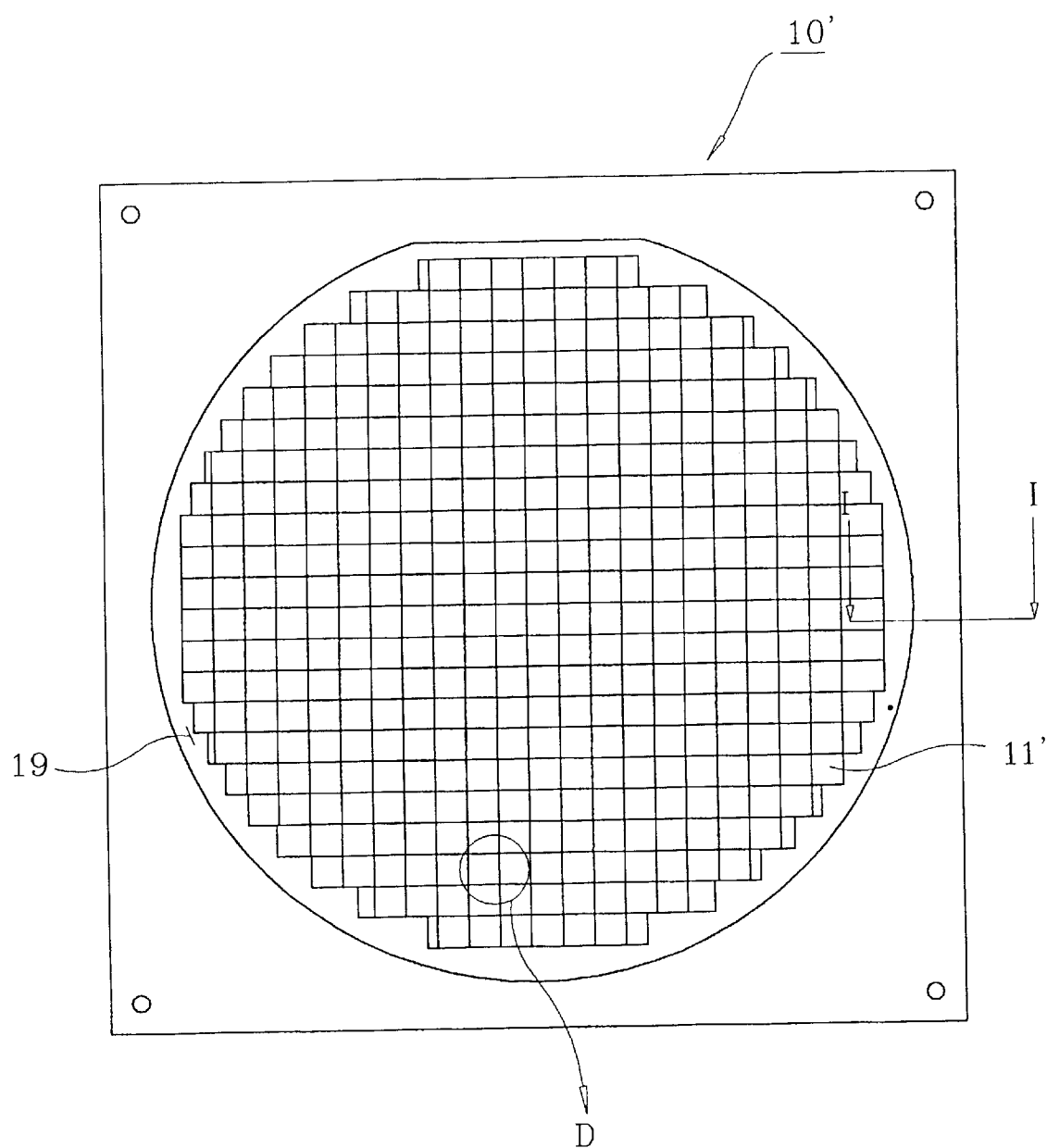
FIG. 28A is a plan view of the circuit pattern tape used in the conventional lamination method.
Figure 28B:
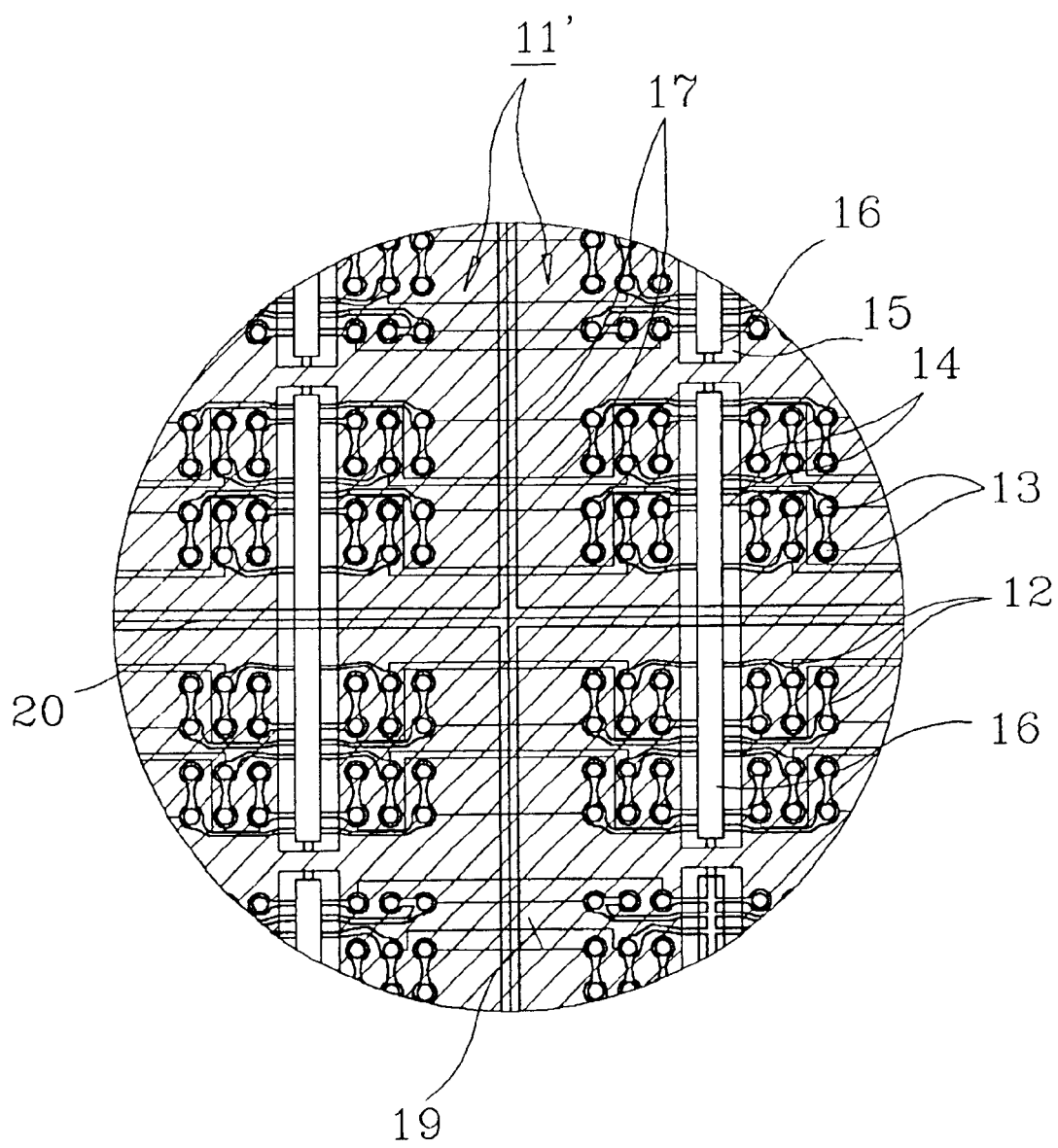
FIG. 28B is an enlarged view of a portion D in FIG. 28A.
Figure 28C:
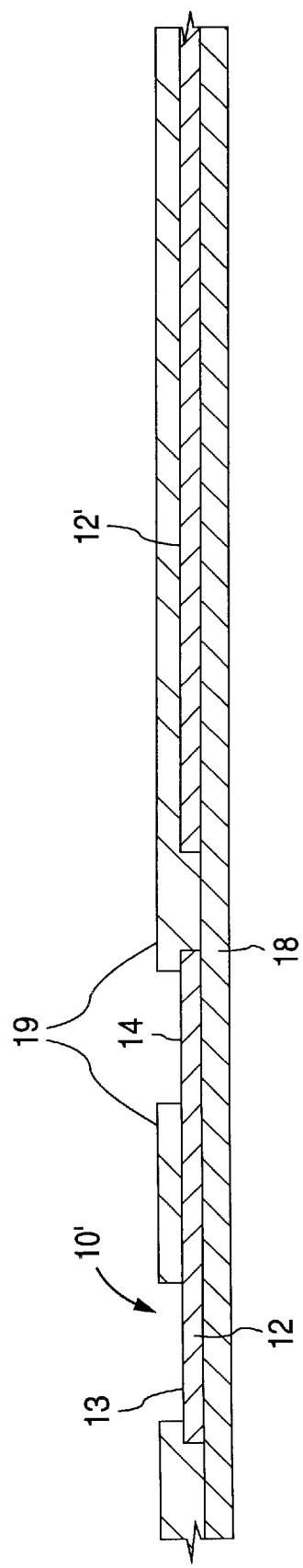
FIG. 28C is a cross-sectional view taken along the line I—I of FIG. 28A.

FIG. 27 is a perspective view illustrating the circuit pattern-laminated wafer 2, from which the peripheral portion 10b of the circuit pattern tape 10 has not been removed yet. Where the circuit pattern tape 10 laminated over the wafer 2 having a circular shape has a square or rectangular shape, its peripheral portion 10b arranged around its circular portion 10a is removed using the cutting assembly 191.

As apparent from the above description, the present invention provides a lamination method which uses a particular circuit pattern tape and a particular laminating apparatus, thereby being capable of efficiently laminating the circuit pattern tape, formed with a plurality of circuit pattern units and attached with an elastomeric adhesive tape, over a wafer formed with a plurality of semiconductor chip units while maintaining an accuracy in position and orientation without a formation of voids. In accordance with the present invention, it is also possible to effectively avoid a bowing phenomenon from occurring in the process of laminating the circuit pattern tape laminated over the wafer at a high temperature or after the laminating process. Accordingly, a degradation in quality occurring in subsequent processes, in particular, a wire bonding process, is suppressed to a maximum. After the completion of packaging the wafer, it is also possible to accurately cut the packaged wafer into individual chip-size semiconductor packages, thereby achieving an improvement in yield while reducing a degradation in quality. As a result, an improvement in productivity is achieved degradation in the yield of semiconductor packages occurs.

What is claimed is:

1. A method for laminating a circuit pattern tape over a wafer, comprising the steps of:
   preparing a circuit pattern tape with an adhesive layer thereon, the circuit pattern tape comprising a square or rectangular structure having:
   a central circular portion having the same size and shape as the wafer over which the circuit pattern tape is to be laminated and a plurality of circuit pattern units therein,
   a frame portion arranged around the circular portion and formed with a planar metal thin layer,
   a peripheral portion interposed between the circular portion and the frame portion and formed with a planar metal thin layer, the peripheral portion having no circuit pattern units therein, and
   at least one bowing prevention portion provided at the peripheral portion between the circular portion and the frame portion in such a fashion that the planar metal thin layer formed at the peripheral portion does not exist therein, and wherein the planar metal thin layer formed at the peripheral portion is electrically connected to the planar metal thin layer formed at the frame portion by bus bars;
   detecting at least one reference position of the prepared circuit pattern tape and at least one reference position of the wafer using visual detecting means;
   outputting results obtained at the detecting step in the form of visual images capable of allowing a comparison of the detection results;
   carrying out a reference position correction involving movements of the wafer in an X-axis and/or a Y-axis direction and/or by a desired angular rotation in an XY plane, thereby allowing the reference position of the circuit pattern tape and the reference position of the wafer to correspond to each other; and
   laminating the circuit pattern tape over the wafer when the reference positions correspond to each other.

2. The method in accordance with claim 1, wherein the plurality of circuit pattern units are each defined by singulation lines in the tape, and wherein each of the circuit pattern units comprises:
   a flexible insulating layer having an opening formation region and bond finger formation regions arranged adjacent to the opening formation region;
   a circuit pattern formed over the flexible insulating layer, the circuit pattern including a plurality of bond fingers arranged in each of the bond finger formation regions and electrically connected to associated die pads of a semiconductor chip included in the wafer, respectively, a plurality of solder ball lands arranged outside each of the bond finger formation regions and attached with solder balls serving as external input/output terminals, and a plurality of conductive traces each adapted to electrically connect one of the bond fingers to an associated one of the solder ball lands; and
   an insulating cover coat coated over the entire region of the circuit pattern tape except for the solder ball lands, the bond finger formation and opening formation regions, and the at least one bowing prevention portion provided at the peripheral portion between the circular portion and the frame portion.

3. The method in accordance with claim 2, wherein each of the circuit pattern units further comprises a dummy pattern adapted to provide a uniform distribution of a conductive metal for the formation of the solder ball lands, the conductive traces, and the bond fingers, thereby minimizing a difference in regard to the degree of thermal expansion between optional unit areas in the circuit pattern.

4. The method in accordance with claim 3, wherein the dummy pattern has a plurality of pattern portions each having a disc shape, a linear trace shape, or a combination thereof.

5. The method in accordance with claim 2, further comprising:
   a core layer formed beneath the flexible insulating layer, the core layer being comprised of a glass epoxy thin layer.

6. The method in accordance with claim 2, further comprising:
a glass epoxy thin layer formed in place of the flexible insulating layer, the glass epoxy thin layer serving as a core layer.

7. The method in accordance with claim 1, wherein the structure further comprises a dummy pattern arranged around the periphery of the circular portion and adapted to minimize a difference in regard to the degree of thermal expansion exhibited in the structure in a radial direction.

8. The method in accordance with claim 7, wherein the dummy pattern has a structure consisting of a plurality of uniformly arranged metal layers each having a disc shape.

9. The method in accordance with claim 2, wherein the at least one bowing prevention portion comprises a plurality of through-holes formed through the cover coat on the peripheral portion and adapted to reduce a bowing phenomenon caused by a difference in regard to the coefficient of thermal expansion between the cover coat and the planar metal thin layer.

10. The method in accordance with claim 2, wherein the at least one bowing prevention portion comprises a plurality of bowing prevention radial grooves formed in the cover coat on the peripheral portion and adapted to reduce a bowing phenomenon caused by a difference in regard to the coefficient of thermal expansion between the cover coat and the planar metal thin layer.

11. The method in accordance with claim 2, wherein the step of preparing the adhesive layer-carrying circuit pattern tape comprises a step of preparing a circuit pattern tape and an elastomeric adhesive tape, and an adhesive layer forming step.

12. The method in accordance with claim 11, wherein an opening forming step for perforating the opening formation regions respectively defined on the circuit pattern units is carried out after the adhesive forming step.

13. The method in accordance with claim 11, wherein the elastomeric adhesive tape comprises an adhesive layer, and a pair of release films attached to upper and lower surfaces of the adhesive layer, respectively, one of the release films attached to the upper surface of the adhesive layer being removed prior to the adhesive layer forming step.

14. The method in accordance with claim 12, wherein the remaining release film attached to the lower surface of the adhesive layer is removed after the opening forming step.

15. The method in accordance with claim 1, further comprising:
a curing step for pressing the wafer laminated with the circuit pattern tape at a high temperature after the completion of the laminating step.

16. The method in accordance with claim 1, further comprising the step of:
cutting the peripheral portion of the circuit pattern tape after the completion of the laminating step, thereby removing the peripheral portion from the wafer.

17. The method in accordance with claim 1, wherein the visual detecting means simultaneously scans the at least one reference positions of the circuit pattern tape and wafer.

18. A method for laminating a circuit pattern tape over a wafer, comprising:
preparing an adhesive layer-carrying circuit pattern tape, the circuit pattern tape comprising
a central circular portion having a plurality of circuit pattern units, therein, each including a flexible insulating layer defined with opening formation regions adapted to wire-bond circuit patterns to die pads of semiconductor chips included in the wafer, respectively, the circuit patterns formed over the flexible insulating layer, first dummy patterns each arranged between adjacent ones of the circuit patterns, and a cover coat formed over the circuit patterns and over the dummy patterns;
a second dummy pattern formed around the circular portion;
a peripheral portion formed around the circular portion outside the second dummy pattern; and
at least one bowing prevention portion formed between the circular portion and the peripheral portion and between the second dummy pattern and the peripheral portion;
feeding the adhesive layer-carrying circuit pattern tape while held in a sucked state by a vacuum sucking tool included in a circuit pattern tape sucking/feeding assembly;
sucking and thereby holding a wafer on a die arranged beneath the sucking tool by a wafer sucking/holding assembly;
detecting at least one reference position of the adhesive layer-carrying circuit pattern tape and at least one reference position of the wafer by visual detecting means included in a visual detecting assembly;
comparing the detection results outputted from the visual detecting assembly with each other;
determining whether the compared reference positions correspond to each other, based on the comparison results; and,
if the compared reference positions do not correspond to each other, then shifting the die holding the wafer in an X and/or a Y-axis direction or by a desired angular rotation in an XY plane until the reference positions correspond to each other; and
if the compared reference positions correspond to each other, then downwardly feeding the adhesive layer-carrying circuit pattern tape sucked onto the sucking tool to the wafer held on the die, thereby laminating the adhesive layer-carrying circuit pattern tape over the wafer.

19. The method in accordance with claim 18, wherein the adhesive layer-carrying circuit pattern tape preparing step comprises the steps of:
positioning an elastomeric adhesive tape, consisting of an adhesive layer and a pair of release films laminated on upper and lower surfaces of the adhesive layer, on an inlet guide plate included in an adhesive layer forming assembly in a state in which one of the release films laminated on the upper surface of the adhesive layer is removed;
laminating the circuit pattern tape over the elastomeric adhesive tape; and
passing the laminated circuit pattern tape between a drive roller and a press roller to an outlet guide plate.

20. The method in accordance with claim 19, further comprising:
an opening forming step for holding the circuit pattern tape on a die included in a punching press assembly after the completion of the adhesive layer-carrying circuit pattern tape preparing step, and perforating the opening formation regions of the circuit pattern units by a punch driven by a driving unit.

21. The method in accordance with claim 20, wherein the circuit pattern tape is laminated over the wafer in a state in which the remaining release film attached to the lower surface of the adhesive layer is removed after the opening forming step.

22. The method in accordance with claim 18, further comprising:
  a curing step for pressing the adhesive layer at a high temperature by a high-temperature press assembly after the completion of the laminating step for laminating the adhesive layer-carrying circuit pattern tape over the wafer.

23. The method in accordance with claim 18, further comprising the step of:
  removing the peripheral portion of the circuit pattern tape by a cutting tool included in a cutting assembly after the completion of the lamination step for laminating the adhesive layer-carrying circuit pattern tape over the wafer.

24. The method in accordance with claim 18, wherein the visual detecting means included in the visual detecting assembly comprises two cameras having low and high magnifications, respectively, so that at least two reference positions of the circuit pattern tape and at least two reference positions of the wafer are simultaneously scanned.

25. The method in accordance with claim 18, wherein shifting the die holding the wafer comprises an X-axis movement of an X-axis moving member conducted by an adjustment of an X-axis moving micrometer, and/or a Y-axis movement of a Y-axis moving member conducted by an adjustment of a Y-axis moving micrometer, and/or a rotation of a rotation base in an XY plane conducted by an adjustment of an angle adjusting micrometer.

26. The method in accordance with claim 18, wherein the sucking tool of the circuit pattern tape sucking/feeding assembly is provided at a lower surface thereof with a sucking disc having a lower surface slightly downwardly protruded at its central portion, the sucking disc also having a plurality of vacuum holes, so that the circuit pattern tape being sucked by the sucking disc is downwardly curved at its central portion.

27. A method for laminating a circuit pattern tape over a wafer, the method comprising:
  preparing an adhesive layer-carrying circuit pattern tape;
  feeding the adhesive layer-carrying circuit pattern tape while held in a sucked state by a vacuum sucking tool included in a circuit pattern tape sucking/feeding assembly;
  sucking and thereby holding a wafer on a die arranged beneath the sucking tool by a wafer sucking/holding assembly;
  detecting at least one reference position of the adhesive layer-carrying circuit pattern tape and at least one reference position of the wafer by visual detecting means included in a visual detecting assembly;
  comparing the detection results outputted from the visual detecting assembly with each other;
  determining whether the compared reference positions correspond to each other based on the comparison results;
  if the compared reference positions do not correspond to each other, then shifting the die holding the wafer in an X and/or a Y-axis direction or by a desired angular rotation in an XY plane until the reference positions correspond to each other; and
  if the compared reference positions correspond to each other, then downwardly feeding the adhesive layer-carrying circuit pattern tape sucked onto the sucking tool to the wafer held on the die, thereby laminating the adhesive layer-carrying circuit pattern tape over the wafer;
  wherein the sucking tool of the circuit pattern tape sucking/feeding assembly is provided at a lower surface thereof with a sucking disc having a lower surface slightly downwardly protruded at its central portion, the sucking disc also having a plurality of vacuum holes, so that the circuit pattern tape being sucked by the sucking disc is downwardly curved at its central portion;
  wherein the wafer sucking/holding assembly includes a wafer sucking/holding die provided with a plurality of sucking holes adapted to suck the wafer, a plurality of uniformly spaced vertical venting grooves formed along a peripheral edge of the die, an annular venting member arranged at one side of the die in such a fashion that an internal venting passage defined therein communicates with the venting grooves, and a rubber ring fitted around the venting member; and
  wherein the circuit pattern tape sucked onto the sucking tool comes into contact with the wafer, firmly held on the wafer sucking/holding die, starting from its central portion, when it is laminated over the wafer, so that air existing between the wafer and the circuit pattern tape is vented via the venting grooves and the internal venting passage, while the rubber ring prevents ambient air from entering between the wafer and the circuit pattern tape.

28. The method in accordance with claim 27, wherein the circuit pattern tape comprises:
  a central circular portion having a plurality of circuit pattern units each including a flexible insulating layer defined with opening formation regions adapted to wire-bond circuit patterns to die pads of semiconductor chips included in the wafer, respectively, the circuit patterns formed over the flexible insulating layer, first dummy patterns each arranged between adjacent ones of the circuit patterns, and a cover coat formed over the circuit patterns and over the dummy patterns;
  a second dummy pattern formed around the circular portion;
  a peripheral portion formed around the circular portion outside the second dummy pattern; and
  at least one bowing prevention portion formed between the circular portion and the peripheral portion and between the second dummy pattern and the peripheral portion.

29. The method in accordance with claim 27, wherein the adhesive layer-carrying circuit pattern tape preparing step comprises the steps of:
  positioning an elastomeric adhesive tape, consisting of an adhesive layer and a pair of release films laminated on upper and lower surfaces of the adhesive layer, on an inlet guide plate included in an adhesive layer forming assembly in a state in which one of the release films laminated on the upper surface of the adhesive layer is removed;
  laminating the circuit pattern tape over the elastomeric adhesive tape; and
  passing the laminated circuit pattern tape between a drive roller and a press roller to an outlet guide plate.

30. The method in accordance with claim 29, further comprising:
  an opening forming step for holding the circuit pattern tape on a die included in a punching press assembly after the completion of the adhesive layer-carrying circuit pattern tape preparing step, and perforating the opening formation regions of the circuit pattern units by a punch driven by a driving unit.

31. The method in accordance with claim 30, wherein the circuit pattern tape is laminated over the wafer in a state in which the remaining release film attached to the lower surface of the adhesive layer is removed after the opening forming step.

32. The method in accordance with claim 27, further comprising:

a curing step for pressing the adhesive layer at a high temperature by a high-temperature press assembly after the completion of the laminating step for laminating the adhesive layer-carrying circuit pattern tape over the wafer.

33. The method in accordance with claim 28, further comprising the step of:

removing the peripheral portion of the circuit pattern tape by a cutting tool included in a cutting assembly after the completion of the lamination step for laminating the adhesive layer-carrying circuit pattern tape over the wafer.

34. The method in accordance with claim 27, wherein the visual detecting means included in the visual detecting assembly comprises two cameras having low and high magnifications, respectively, so that at least two reference positions of the circuit pattern tape and at least two reference positions of the wafer are simultaneously scanned.

35. The method in accordance with claim 27, wherein shifting the die holding the wafer in an X and/or a Y-axis direction or by a desired angle comprises an X-axis movement of an X-axis moving member conducted by an adjustment of an X-axis moving micrometer, and/or a Y-axis movement of a Y-axis moving member conducted by an adjustment of a Y-axis moving micrometer, and/or a rotation of a rotation base conducted by an adjustment of an angle adjusting micrometer.

36. A method for laminating a circuit pattern tape over a wafer, comprising the steps of:

providing a square or rectangular circuit pattern tape comprising
a central portion having the same size and shape as the wafer over which the circuit pattern tape is to be attached and a plurality of circuit pattern units therein,
a frame portion arranged around the central portion and formed with a planar metal thin layer,
a peripheral portion interposed between the central portion and the frame portion and formed with a planar metal thin layer, the peripheral portion having no circuit pattern units therein, and
a means for preventing bowing provided at the peripheral portion between the circular portion and the frame portion;

imaging a first reference position on the circuit pattern tape and a second reference position on the wafer;

aligning the first and second reference positions; and attaching the circuit pattern tape to the wafer when the first and second reference positions correspond to each other.

37. A method for laminating a circuit pattern tape over a wafer, comprising the steps of:

providing a square or rectangular circuit pattern tape comprising
a central portion having the same size and shape as the wafer over which the circuit pattern tape is to be laminated and a plurality of circuit pattern units therein,
a peripheral portion interposed between the central portion and peripheral edges of the circuit pattern tape and formed with a planar metal thin layer, and
a means for preventing bowing provided at the peripheral portion between the circular portion and the peripheral edges;

imaging a first reference position on the circuit pattern tape and a second reference position on the wafer;

aligning the first and second reference positions; and laminating the circuit pattern tape over the wafer when the first and second reference positions correspond to each other.

38. A method for laminating a circuit pattern tape over a wafer, comprising the steps of:

providing a square or rectangular circuit pattern tape comprising
a central portion having the same size and shape as the wafer over which the circuit pattern tape is to be laminated and a plurality of circuit pattern units therein,
a peripheral portion interposed between the central portion and peripheral edges of the circuit pattern tape and formed with a planar metal thin layer, and
an arc shape region devoid of the planar metal thin layer and interposed between the circular portion and the peripheral edges;

imaging a first reference position on the circuit pattern tape and a second reference position on the wafer;

aligning the first and second reference positions; and laminating the circuit pattern tape over the wafer when the first and second reference positions correspond to each other.

39. The method of claim 38, further comprising a plurality of grooves in the planar metal thin layer of the peripheral portion, said grooves located outward of the arc shaped regions and extending toward the peripheral edges of the circuit pattern tape.

40. The method of claim 39, further comprising a layer of a cover coat having a multiplicity of micro through holes over the planar metal thin layer of the peripheral portion.

* * * * *